(12) United States Patent
Murooka

(10) Patent No.: US 8,295,077 B2
(45) Date of Patent: Oct. 23, 2012

(54) SEMICONDUCTOR MEMORY DEVICE

(75) Inventor: Kenichi Murooka, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 13/001,147

(22) PCT Filed: Jun. 11, 2009

(86) PCT No.: PCT/JP2009/061064
§ 371 (c)(1),
(2), (4) Date: Dec. 23, 2010

(87) PCT Pub. No.: WO2009/157359
PCT Pub. Date: Dec. 30, 2009

(65) Prior Publication Data
US 2011/0205783 A1    Aug. 25, 2011

(30) Foreign Application Priority Data
Jun. 26, 2008    (JP) .................................. 2008-167516

(51) Int. Cl.
*G11C 11/00* (2006.01)
(52) U.S. Cl. .......................... 365/148; 365/163; 365/207
(58) Field of Classification Search .................. 365/148, 365/163, 207, 189.15
See application file for complete search history.

(56) References Cited

U.S. PATENT DOCUMENTS

| 4,215,357 | A | 7/1980 | Kohyama et al. | |
|---|---|---|---|---|
| 7,379,324 | B2 | 5/2008 | Murooka | |
| 7,638,382 | B2 | 12/2009 | Murooka et al. | |
| 7,660,152 | B2 * | 2/2010 | Lamorey et al. | 365/163 |
| 7,706,171 | B2 | 4/2010 | Murooka | |
| 2002/0001251 | A1 * | 1/2002 | Fujino et al. | 365/230.08 |
| 2008/0232161 | A1 * | 9/2008 | Choi et al. | 365/163 |
| 2008/0239797 | A1 | 10/2008 | Tsukamoto et al. | |
| 2009/0135641 | A1 | 5/2009 | Tajiri et al. | |

FOREIGN PATENT DOCUMENTS

| JP | 53-23281 | 3/1978 |
|---|---|---|
| JP | 2005-71500 | 3/2005 |
| JP | 2007-5609 | 1/2007 |
| JP | 2007-26627 | 2/2007 |

(Continued)

OTHER PUBLICATIONS

U.S. Appl. No. 13/071,943, filed Mar. 25, 2011, Murooka.

(Continued)

*Primary Examiner* — Anh Phung
(74) *Attorney, Agent, or Firm* — Oblon, Spivak, McClelland, Maier & Neustadt, L.L.P.

(57) ABSTRACT

A semiconductor memory device comprises a plurality of first row lines arranged in parallel; a plurality of column lines intersecting the first row lines; a plurality of storage elements arranged at intersections of the first row lines and the column lines; a plurality of second row lines arranged in parallel with the first row lines, from positions opposite to the first row lines via the column lines to a certain portion of the column line, and capacitively coupled with the column lines; and a sense amplifier including a field effect transistor having a lower layer control electrode composed of the certain portion of the column line, and an upper layer control electrode composed of the second row line capacitively coupled in the upper layer with the certain portion of the column line.

14 Claims, 47 Drawing Sheets

FOREIGN PATENT DOCUMENTS

| | | |
|---|---|---|
| JP | 2007-164925 | 6/2007 |
| JP | 2008-84512 | 4/2008 |
| WO | WO 2010/026654 A1 | 3/2010 |
| WO | WO 2010/041302 A1 | 4/2010 |
| WO | WO 2010/041325 A1 | 4/2010 |

OTHER PUBLICATIONS

U.S. Appl. No. 13/072,029, filed Mar. 25, 2011, Murooka.
U.S. Appl. No. 13/327,065, filed Dec. 15, 2011, Murooka.
U.S. Appl. No. 13/313,186, filed Dec. 7, 2011, Murooka.
U.S. Appl. No. 12/887,043, filed Sep. 21, 2010, Murooka, et al.
U.S. Appl. No. 13/040,764, filed Mar. 4, 2011, Murooka et al.
International Search Report and Written Opinion of the International Searching Authority issued Sep. 15, 2009, in Patent Application No. PCT/JP2009/061064.
Shin'ichiro Kimura, "Semiconductor memory; DRAM", ULSI Research Department, Central Research Laboratory, Applied Physics, vol. 69, No. 10, Oct. 2000, pp. 1233-1240.
Natsuo Ajika, "Flash memory, recent topics", Mitsubishi Electric Corporation, Semiconductor Group, Memory IC Division, Memory Process Design Department, Flash Memory Process Design Group, Applied Physics, vol. 69, No. 12, Dec. 2000, pp. 1462-1466.

* cited by examiner

SEMICONDUCTOR MEMORY DEVICE

TECHNICAL FIELD

The present invention relates to a semiconductor memory device.

BACKGROUND ART

In recent years, as semiconductor devices have been highly integrated, circuit patterns of LSI devices contained therein have been increasingly made finer. Fine processing of the patterns requires not only thinner line widths simply but also improvements in dimensional accuracy and positional accuracy of patterns. Semiconductor memory devices called memories are not an exception. In memory cells formed with the free use of high-accuracy processing technologies, it has been continuously desired that a certain amount of charge required for storage is held within a narrower region.

Various memories such as DRAMs, SRAMs and flash memories have been produced up to now. These memories all use a MOSFET in a memory cell and accordingly fine processing of patterns causes a need for an improvement in dimensional accuracy at a higher rate than the rate of fine processing. Therefore, the lithography technology of forming these patterns is imposed with larger loads, which become a factor in increasing the lithography process cost that occupies the major part of the current mass production cost, that is, a factor in increasing the product cost (see Non-Patent Documents 1 and 2, for example).

On the other hand, a technology of basically resolving the problem on such fine processing may comprise artificially synthesizing a desired molecular structure and using the uniformity of the resultant molecules to form uniformly characterized elements in a trial. There are large problems on the technology of arranging the synthesized molecules at a desired position and on the establishment of electric contact with the arranged electrode. In addition, such the element serves as the memory using an extremely small amount of charge and accordingly has a problem because of an extremely large probability of malfunctions that may be caused by disturbances such as natural radiations.

Further, from the viewpoint of effective utilization of energy resources, it has been desired to suppress power consumption in semiconductor devices as low as possible. Memories are not an exception. Particularly, in the case of the memory, a memory cell portion occupies a large proportion. Therefore, it is important to suppress power consumption in each memory cell. Power consumption is represented by the product of voltage and current. Accordingly, if a voltage is fixed at around 1 V due to anti-noise measures and so forth, an extremely small current is required to achieve lower power consumption.

[Non-Patent Document 1]
Applied Physics, Vol. 69, No. 10, pp. 1233-1240, 2000, "Semiconductor Memory; DRAM"

[Non-Patent Document 2]
Applied Physics, Vol. 69, No. 12, pp. 1462-1466, 2000, "Flash Memory, Recent Topics"

DISCLOSURE OF INVENTION

Technical Problem

The present invention has an object to provide a semiconductor memory device insusceptible to disturbances and capable of efficiently detecting an extremely small cell current and realizing a lower cost.

Technical Solution

In an aspect the present invention provides a semiconductor memory device, comprising: a plurality of first row lines arranged in parallel; a plurality of column lines intersecting the first row lines; a plurality of storage elements arranged at intersections of the first row lines and the column lines; a plurality of second row lines arranged in parallel with the first row lines, from positions opposite to the first row lines via the column lines to a certain portion of the column line, and capacitively coupled with the column lines; and a sense amplifier including a field effect transistor having a lower layer control electrode composed of the certain portion of the column line, and an upper layer control electrode composed of the second row line capacitively coupled in the upper layer with the certain portion of the column line.

In another aspect the present invention provides a semiconductor memory device, comprising: a plurality of first row lines arranged in parallel; a plurality of column lines intersecting the first row lines; a plurality of storage elements arranged at intersections of the first row lines and the column lines; a read circuit provided at one end of the column line; a plurality of second row lines arranged in parallel with the first row lines, from positions opposite to the first row lines via the column lines to the read circuit, and capacitively coupled with the column lines; and a read control circuit operative to form charge storage portions on the column line corresponding to the capacitive coupling positions with the second row lines, and applies a transfer voltage to the second row lines to transfer the charge stored in the charge storage portions via the column line to the read circuit.

In yet another aspect the present invention provides a semiconductor memory device, comprising: a plurality of first row lines arranged in parallel; a plurality of column lines intersecting the first row lines; a plurality of storage elements arranged at intersections of the first row lines and the column lines; a row selection means operative to select from among the first row lines; a column selection means operative to select from among the column lines; and a write control means operative, at the time of data write, to apply a first write voltage to a first row line selected by the row selection means and a second write voltage to a column line selected by the column selection means, and connect first row lines not selected by the row selection means and column lines not selected by the column selection means via certain current limiting elements to a certain potential.

In yet another aspect the present invention provides a semiconductor memory device, comprising: a plurality of first row lines arranged in parallel; a plurality of column lines intersecting the first row lines; a plurality of storage elements arranged at intersections of the first row lines and the column lines; a row selection means operative to select from among the first row lines; a column selection means operative to select from among the column lines; and an erase control means operative, at the time of data erase, to apply a first erase voltage to a first row line selected by the row selection means and a second erase voltage to a column line selected by the column selection means, and connect first row lines not selected by the row selection means and column lines not selected by the column selection means via certain current limiting elements to a certain potential.

Effect of the Invention

The present invention is possible to provide a semiconductor memory device insusceptible to disturbances and capable of efficiently detecting an extremely small cell current and realizing a lower cost.

BEST MODE FOR CARRYING OUT THE INVENTION

The embodiments associated with the semiconductor memory device according to the present invention will now be described in detail with reference to the drawings.

First Embodiment

Configuration of Present Embodiment

Figure 1:
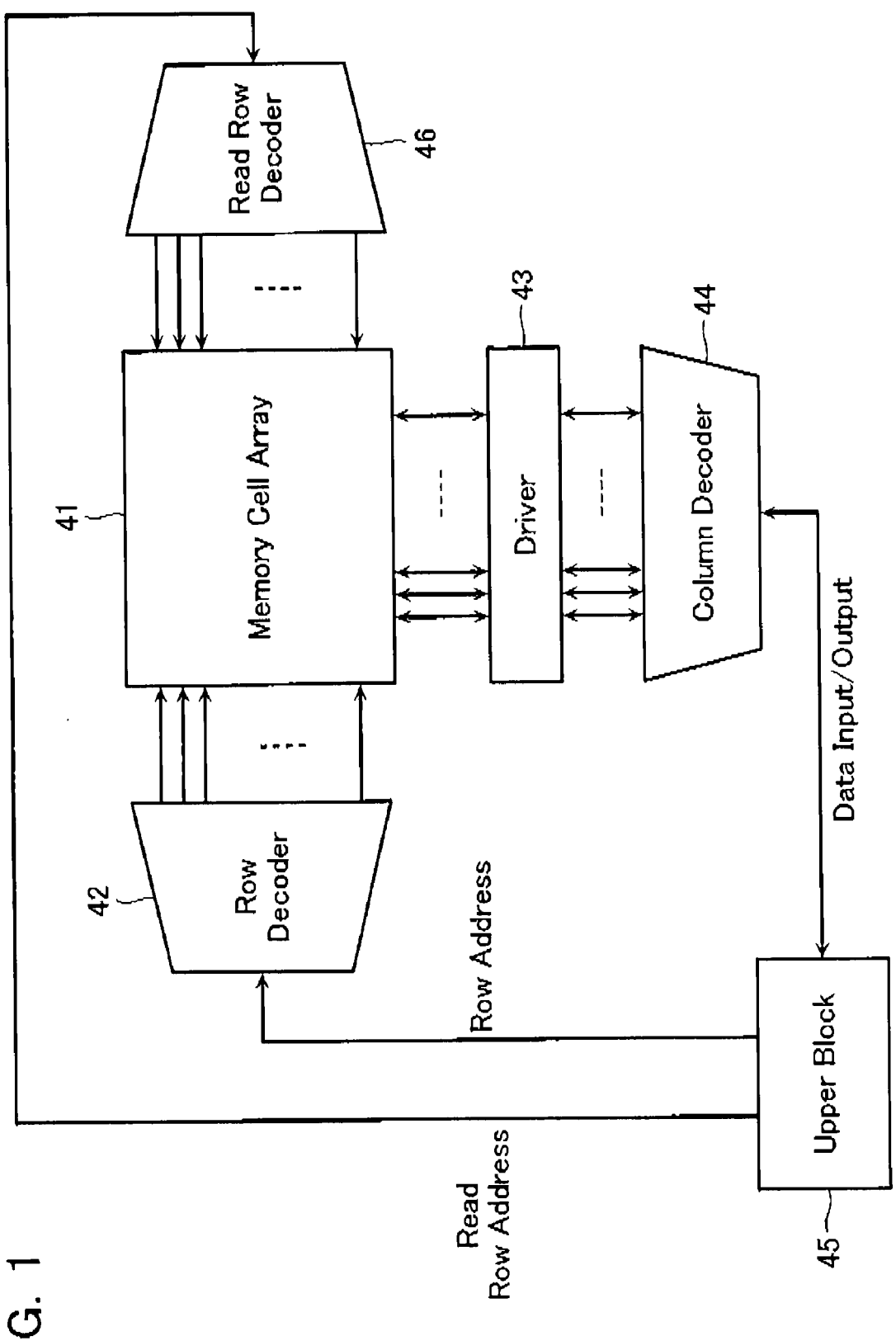
FIG. 1 is a block diagram of a semiconductor memory device according to a first embodiment of the present invention.

FIG. 1 is a block diagram of a semiconductor memory device according to a first embodiment of the present invention.

The semiconductor memory device comprises a memory cell array 41, which includes a plurality of first and second row lines, a plurality of column lines intersecting these first and second row lines, and a plurality of memory cells arranged at the intersections thereof. The semiconductor memory device also comprises a row decoder 42 operative to select from among the first row lines, a read row decoder 46 operative to select from among the second row lines, and a column decoder 44 operative to select from among the column lines. Between the column decoder 44 and the memory cell array 41, a read circuit-containing driver 43 is interposed. The semiconductor memory device further comprises an upper block 45, that is, a read control means operative to feed a row address and a read row address to the row decoder 42 and the read row decoder 46, respectively. The upper block 45 is also operative to communicate data with the column decoder 44. The second row line is used in later-described data read and has a role in sequentially transferring data read out of a memory cell to the driver 43.

This configuration makes it possible to execute batch data write and read to all memory cells contained in the same column.

In the following description, the first row lines are referred to as word lines, the second row lines as read word lines, and the column lines as bit lines in accordance with general semiconductor memory devices.

Figure 2A:
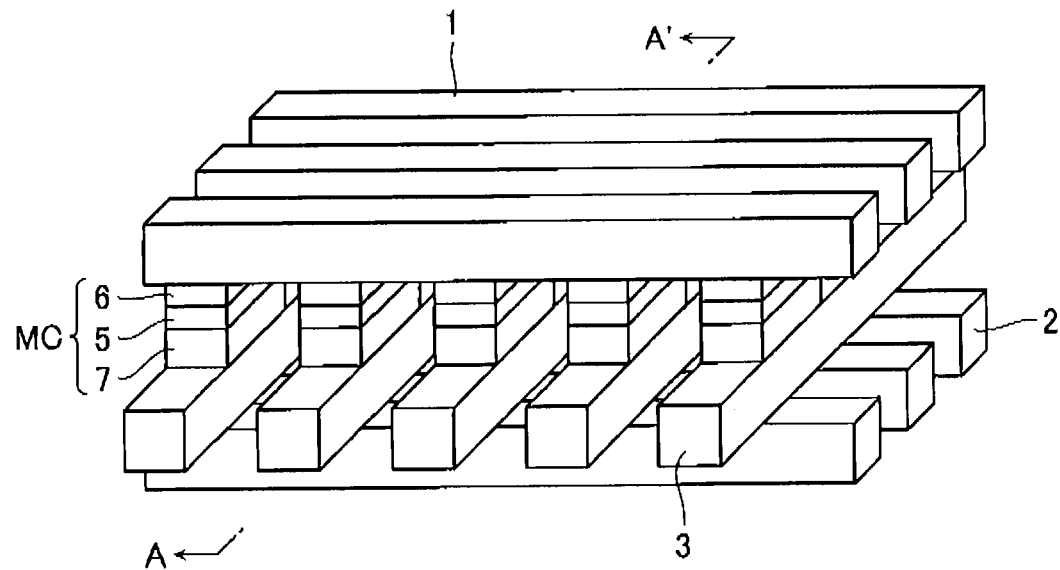
FIG. 2A is a perspective view showing part of the semiconductor memory device according to the first embodiment of the present invention.
Figure 2B:
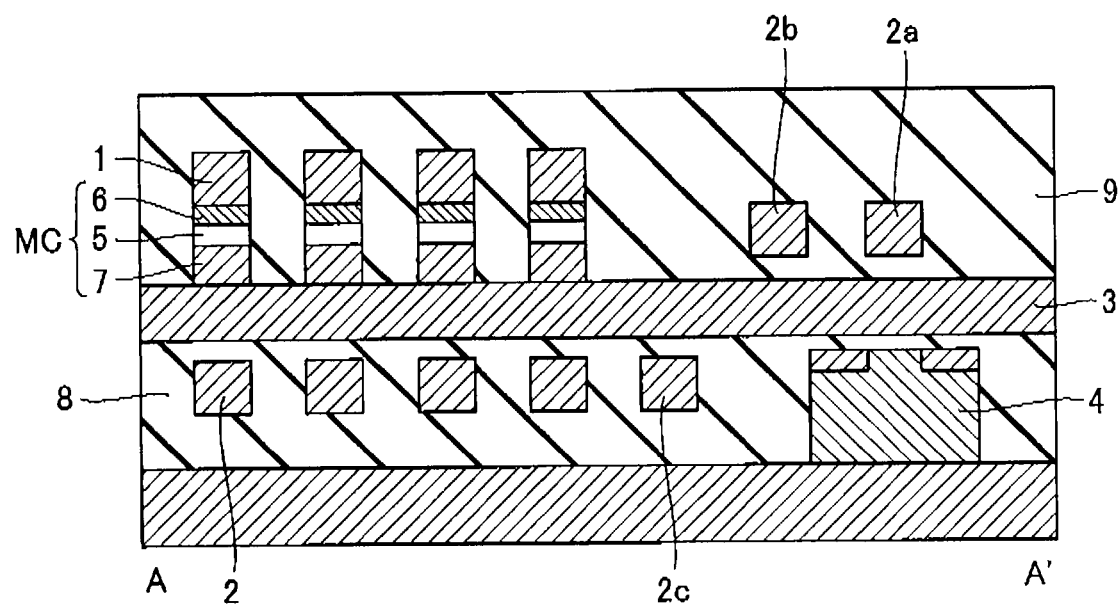
FIG. 2B is a cross-sectional view showing part of the same semiconductor memory device.

FIGS. 2A and 2B are a perspective view and a cross-sectional view showing a portion of the memory cell array 41 shown in FIG. 1 (hereinafter referred to as a "memory cell portion").

The memory cell portion includes a plurality of word lines 1, and a plurality of bit lines 3 intersecting the word lines 1. Arranged at each of the intersections of the word lines 1 and the bit lines 3 is a memory cell MC, which contains an electrode 6, a storage element 5 or a variable resistive element, and an electrode 7 connected in series.

Available examples of the storage element 5 or the variable resistive element include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

At lower positions opposite to the upper word lines 1 with the bit lines 3 sandwiched therebetween, there are provided a plurality of read word lines 2 extending in parallel with the word lines 1. These read word lines 2 are capacitively coupled with the bit lines 3 via an insulator 8. At a position adjacent to the read word line 2 in the direction along the bit line 3, a sense amplifier or a read FET (field effect transistor) 4 is provided. The read FET 4 has gates (control electrodes) in two upper and lower layers, including a lower layer gate composed of an end of the bit line 3, and an upper layer gate composed of a read word line 2a formed in the upper layer above the bit line 3. The read FET 4 is coupled with the read word line 2 through a read word line 2b in the upper layer and a read word line 2c in the lower layer. The read word line 2b is capacitively coupled with the bit line 3 via an insulator 9. The read word line 2c in the lower layer is capacitively coupled with the bit line 3 via the insulator 8.

In the case of this structure, the word lines 1 and the bit lines 3 have simple line-and-space patterns. Thus, the word lines 1 and the bit lines 3 are sufficient if they have orthogonal positional relations therebetween. Accordingly, it is not required to consider misalignments along the word line 1 and along the bit line 3. Therefore, the later-described production steps can be executed with extremely loose alignment accuracy within the memory cell array, which makes productions easier.

Operational Principle of Present Embodiment

First, the operating principle of reading in the present embodiment is described.

Initially, a data read target memory cell (hereinafter referred to as a "selected memory cell") is connected to a bit line (hereinafter referred to as a "selected bit line") 3, which is connected to the ground line (0 V) to bring the potential on the selected bit line 3 to 0 V. As a result, the charge stored on the selected bit line 3 becomes almost 0. Next, the selected bit line 3 is floated, and then a certain voltage $V_{T1}$ is applied to a read word line (hereinafter referred to as a "selected read word line") 2 corresponding to the selected memory cell. As a result, the portion on the selected bit line 3 in the vicinity of the intersection including the location of the selected memory cell brings about the state capable of storing charge. Next, a certain voltage $-V_R$ is applied for a certain time $T_R$ to a word line (hereinafter referred to as a "selected word line") 1 connected to the selected memory cell. At this time, a current inversely proportional to the resistance of the storage element 5 located at the intersection of the selected word line 1 and the selected bit line 3 flows in the selected word line 1, the selected bit line 3 and the selected read word line 2. As a result, the portion on the selected bit line 3 in the vicinity of the intersection with the selected word line 1 can store electrons of which number is in proportion to the current. In general, a variable resistive element used as the storage element 5 has an extremely large resistance in the high-resistance state (OFF state). Accordingly, almost no current flows in the variable resistive element if it is in the high-resistance state, which allows almost no electron to be stored. On the other hand, when the variable resistive element is in the low-resistance state (ON state), the number of stored electrons is represented by $I_L \times T_R/e$ where $I_L$ denotes the magnitude of current flowing; and e denotes the elementary charge. After completion of storage of a certain number of electrons, the potential on the selected word line 1 is restored to 0 V, and the potential on the selected read word line 2 is kept at $V_{T1}$.

Next, the stored electrons are carried to the read FET 4 and converted into an electric signal available in general CMOS circuits.

Figure 3A:
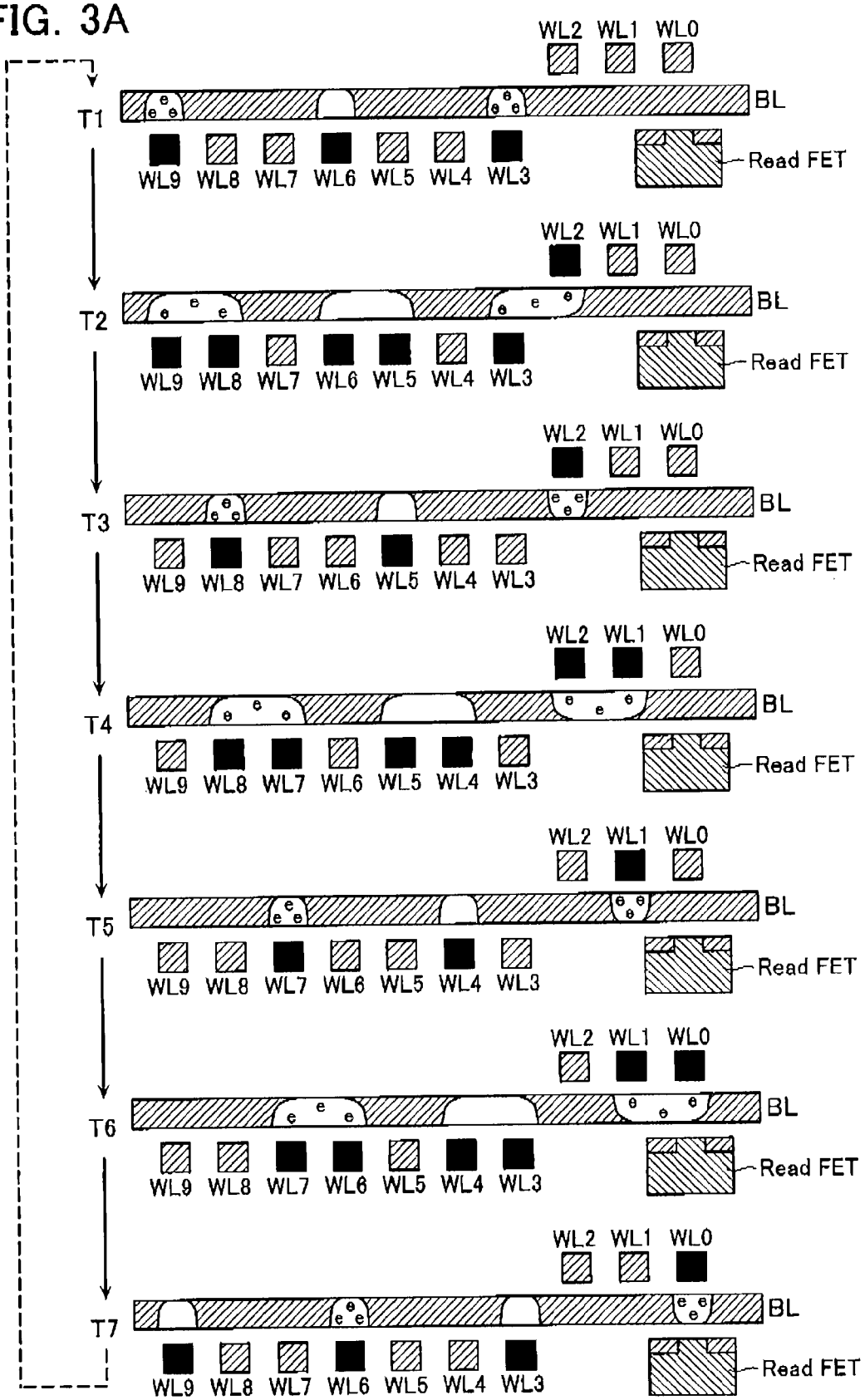
FIG. 3A is a schematic diagram showing the states of charge transfer in the same semiconductor memory device.

This state is shown in FIG. 3A. In FIG. 3A, e represents an electron, and a painted-out read word line WL represents a certain voltage-applied state.

At time T1, a certain read voltage $V_{T1}$ is applied, for example, to read word lines WL3, WL6, WL9, etc. selected at intervals of two. As a result, electrons, of which number is determined by the current flowing in the storage element 5 in the memory cell, are stored in the portions on the bit line BL in the vicinity of the read word lines WL3, WL6, WL9, etc. At this stage, the voltage applied to the read word lines is changed to a certain voltage $V_{T2}$.

Subsequently, at time T2, in addition to the read word lines WL3, WL6, WL9, etc., the certain voltage $V_{T2}$ is also applied to read word lines WL2, WL5, WL8, etc. adjacently located closer than the read word lines WL3, WL6, WL9, etc. to the read FET 4. As a result, the electrons stored on the read word lines WL3, WL6, WL9, etc. are diffused to the portions on the bit line BL in the vicinity of the read word lines WL2, WL5, WL8, etc.

Subsequently, at time T3, the potentials on the read word lines WL3, WL6, WL9, etc. are turned to 0 V. As a result, the electrons stored on the bit line BL in the vicinity of the read word lines WL3, WL6, WL9, etc. are allowed to migrate to the portions on the bit line BL in the vicinity of the read word lines WL2, WL5, WL8, etc. closer to the read FET.

Subsequently, at time T4, in addition to the read word lines WL2, WL5, WL8, etc., the certain voltage $V_{T2}$ is also applied to read word lines WL1, WL4, WL7, etc. adjacently located closer than the read word lines WL2, WL5, WL8, etc. to the read FET 4. As a result, the electrons stored on the bit line BL in the vicinity of the read word lines WL2, WL5, WL8, etc. are diffused to the portions in the vicinity of the read word lines WL1, WL4, WL7, etc.

Through sequential repetitions of the above operation, the voltage $V_{T2}$ is finally applied to the upper layer gate of the read FET 4, that is, the read word line WL0, and electrons are stored on the lower layer gate of the read FET, that is, the bit line BL in the vicinity of the read word line WL0 (time T7).

Figure 3B:
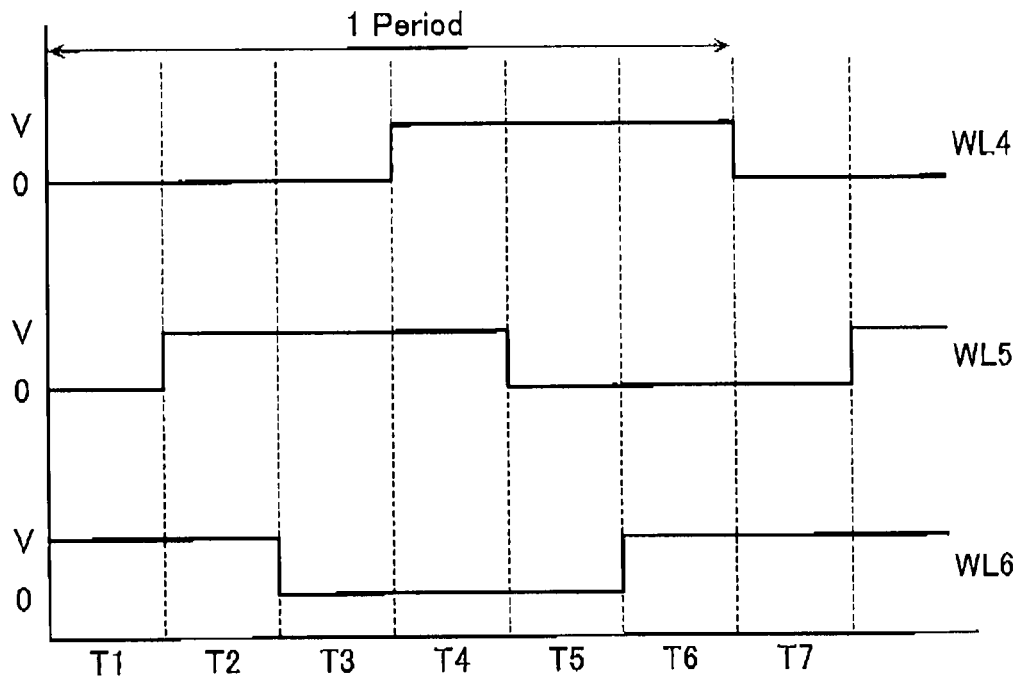
FIG. 3B is a diagram of operating waveforms at the time of charge transfer in the same semiconductor memory device.

Operating waveforms on the read word lines WL4, WL5, WL6 from time T1 to time T7 are shown in FIG. 3B.

As can be found obviously from FIG. 3B, when the certain voltage $V_{T2}$ is applied to the read word lines WL at intervals of two, operation periods are repeated at 6 steps. In a word, one piece of data can be read out at 6 steps.

With the above control of the read word lines WL, data transfer to the read FET can be realized though different control of read word lines WL is required for a certain number of steps immediately after the beginning of reading.

Figure 3D:
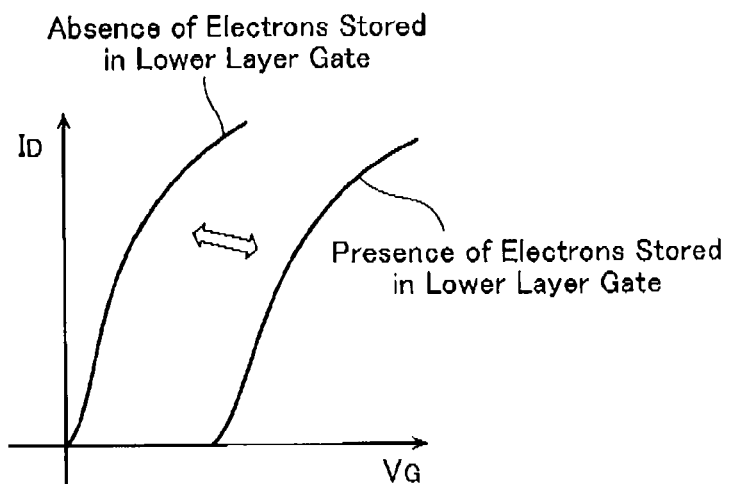
FIG. 3D is a graph showing a relation between the gate voltage and the drain current associated with a read FET in the same semiconductor memory device.
Figure 3C:
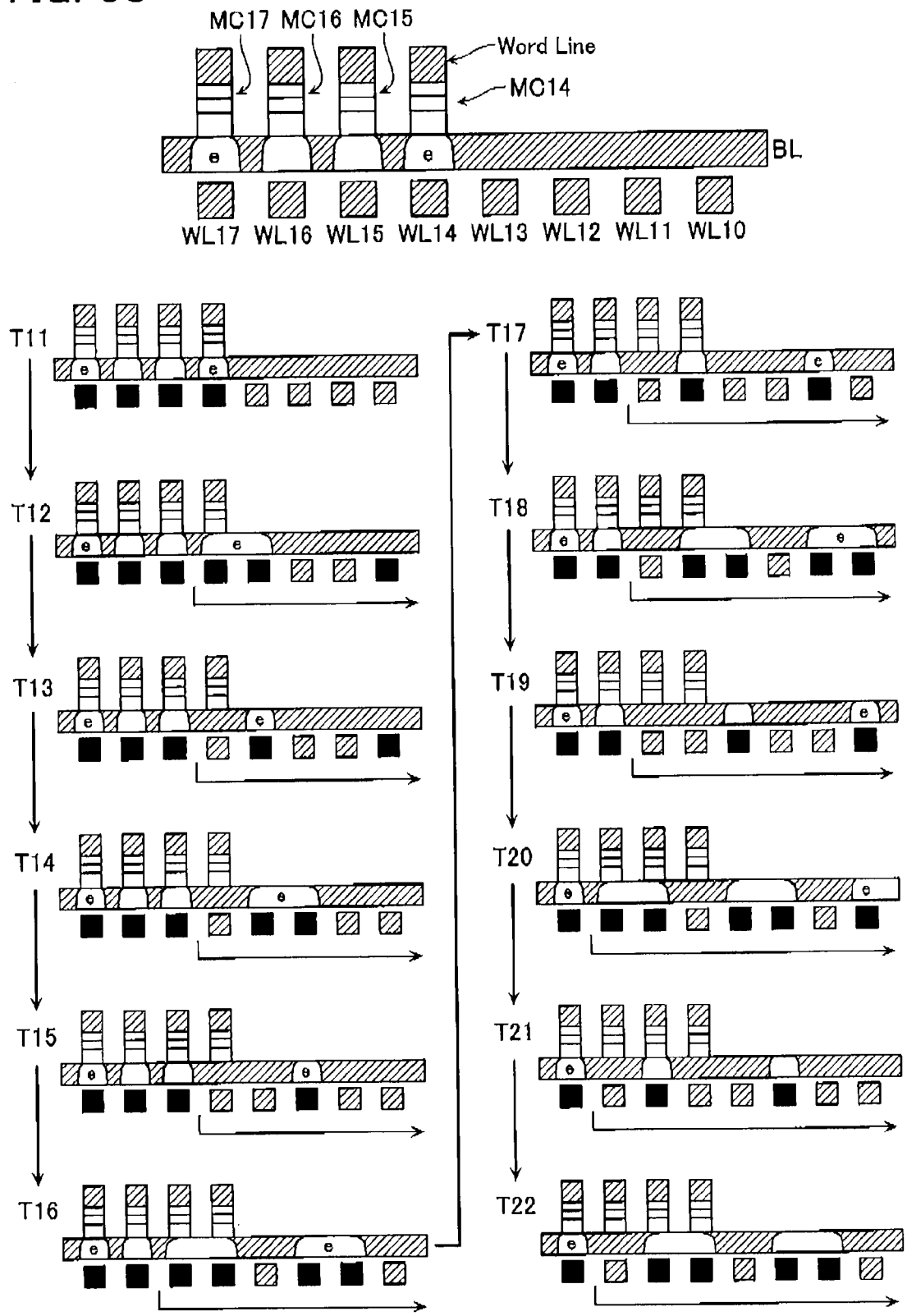
FIG. 3C is a schematic diagram showing the states of charge transfer in the same semiconductor memory device.

The state in this case is shown in FIG. 3C.

At time T11, read word lines WL14-WL17 are supplied with a certain read voltage $V_{T1}$ so that electrons are stored in the portions on the bit line BL in the vicinity of the read word lines WL14-WL17 in accordance with the current flowing in memory cells MC14-MC17. If the storage element 5 contained in the memory cell MC is in the high-resistance state, almost no current flows therein. Thus, no electron is stored in the portion in the vicinity of the read word line WL corresponding to the memory cell MC (the memory cells MC15 and MC16 are in the high-resistance state in the case of time T11 in FIG. 3C). At next time T12, from the upper layer gate of the read FET (not shown), that is, the read word line WL, the voltage applied to the read word line WL14 corresponding to the memory cell MC14 closest to the read FET is changed to a certain read voltage $V_{T2}$.

Subsequently, on and after time T12, charge is transferred from the read word line WL14 to the read word line WL17, one by one, toward the read FET. Namely, first, the read word line WL14 corresponding to the memory cell MC14 closest to the read FET and the read word line WL13 adjacent to the read word line WL14 are supplied with the certain read voltage $V_{T2}$. As a result, electrons stored in the portion on the bit line BL in the vicinity of the read word line WL14 are also diffused to the portion on the bit line BL in the vicinity of the read word line WL13. At this time, all the read word lines WL (including WL10 in the figure) located closer to the read FET at intervals of two may be supplied with the certain read voltage $V_{T2}$.

Subsequently, at time T13, the voltage applied to the read word line WL14 is changed to 0 V. As a result, electrons stored at time T12 on the bit line BL in the vicinity of the read word line WL14 migrate to the portion on the bit line in the vicinity of the read word line WL13.

Subsequently, at time T14, the read word line WL13 and the read word line WL12 adjacently located closer to the read FET than the read word line WL13 are supplied with the certain read voltage $V_{T2}$. As a result, electrons stored on the bit line BL in the vicinity of the read word line $V_{T2}$ are diffused to the read word line WL12.

Subsequently, at time T15, the voltage applied to the read word line WL13 is changed to 0 V. As a result, electrons stored at time T14 on the bit line BL in the vicinity of the read word line WL13 migrate to the portion on the bit line BL in the vicinity of the read word line WL12.

In this case, the read word line WL15 closest to the read FET among the read word lines WL not used in charge transfer is newly added as a read word line WL for use in charge transfer at time T16 of the next step, taking as an opportunity the fact that the spacing between the read word line WL15 and the read word line WL12 located farthest from the read FET and supplied with the certain read voltage $V_{T2}$ among the read word lines WL used in charge transfer is extended to the width of two read word lines WL.

Subsequently, at time T16, the read word lines WL12, WL15 and the read word lines WL11, WL14 adjacently located closer to the read FET than the read word lines WL12, WL15 are supplied with the certain voltage $V_{T2}$. As a result, electrons stored at time T16 on the bit line BL in the vicinity of the read word line WL12 are diffused to the portion on the bit line BL in the vicinity of the read word line WL11. On the other hand, no electron is stored originally in the portion on the bit line BL in the vicinity of the read word line WL15 and accordingly no electron is diffused to the portion on the bit line BL in the vicinity of the read word line WL14.

Subsequently, at time T17, the voltage applied to the read word lines WL12, WL15 is changed to 0 V. As a result, electrons stored on the bit line BL in the vicinity of the read word line WL12 migrate to the portion on the bit line BL in the vicinity of the read word line WL11.

Subsequently, at time T18, the read word lines WL11, WL14 and the read word lines WL10, WL13 adjacently located closer to the read FET than the read word lines WL11, WL14 are supplied with the certain voltage $V_{T2}$. As a result, electrons stored at time T17 on the bit line BL in the vicinity of the read word line WL11 are diffused to the portion on the bit line BL in the vicinity of the read word line WL10. On the other hand, no electron is stored originally in the portion on the bit line BL in the vicinity of the read word line WL14 and accordingly no electron is diffused to the portion on the bit line BL in the vicinity of the read word line WL13.

Subsequently, at time T19, the voltage applied to the read word lines WL11, WL14 is changed to 0 V. As a result, electrons stored on the bit line BL in the vicinity of the read word line WL11 are allowed to migrate to the portion on the bit line BL in the vicinity of the read word line WL10.

In this case, the read word line WL16 closest to the read FET among the read word lines WL not used in charge transfer is newly added as a read word line WL for use in charge transfer at time T20 of the next step, taking as an opportunity the fact that the spacing between the read word line WL16 and the read word line WL13 located farthest from the read FET and supplied with the certain read voltage $V_{T2}$ among the read word lines WL used in charge transfer is extended to the width of two read word lines WL.

Repetitions of the above can make a transition to the state at time T1 in FIG. 3A.

As a result, the read word lines WL for use in charge transfer are added one by one at every 4 steps as can be found. The read word lines WL not used in charge transfer are still supplied with the certain voltage $V_{T1}$ so that the electrons stored in the portions on the bit line BL in the vicinity of these read word lines WL are retained.

The following description is given to the read voltage applied to the read word line WL (WL0 in the case of FIG. 3A) serving as the upper layer gate of the read FET.

In this case, the read FET may have a voltage-current characteristic as shown in FIG. 3D where $V_G$ denotes the voltage applied to the upper layer gate of the read FET, and $I_D$ denotes the current flowing through source-drain of the read FET. As obvious from FIG. 3D, in accordance with the presence/absence of electrons stored in the lower layer gate, clearly different voltage-current characteristics can be obtained. Namely, the use of the voltage $V_G$ within a region having a sufficiently wide gap in the source-drain current $I_D$ direction between two curves in the cases of the presence and the absence of stored electrons makes it easy to decide the presence/absence of electrons stored in the lower layer gate. Therefore, by selecting a read voltage $V_S$ from the voltage $V_G$ in this region, and applying it to the upper layer gate of the read FET, that is, the read word line WL0, the presence/absence of electrons stored in the lower layer gate can be decided. Thus, the read FET can convert it into an electric signal required for signal processing in CMOS circuits at the rear stage.

The read FET 4 is described next.

Figure 4A:
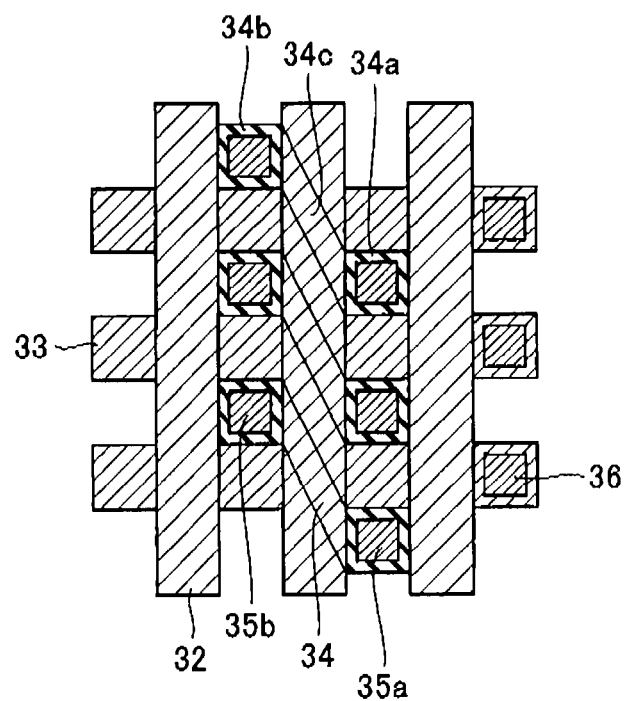
FIG. 4A is a diagram showing a layout of the read FET in the same semiconductor memory device.
Figure 4B:
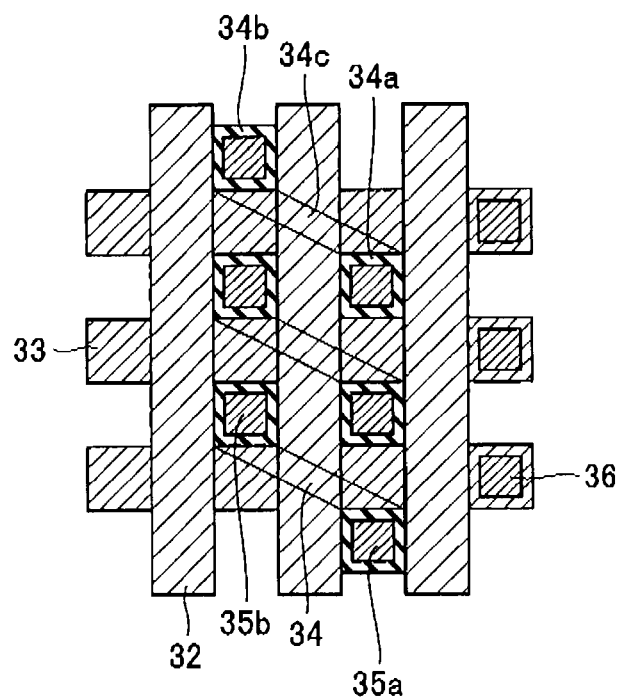
FIG. 4B is a diagram showing a layout of a read FET in another semiconductor memory device according to the same embodiment.

FIGS. 4A-4B show layout examples of the read FET 4.

A device region 34 for the read FET 4 shown in FIG. 4A is formed of a channel region 34c, a source region 34a and a drain region 34b. The source region 34a and the drain region 34b are respective square regions surrounded by two adjacent read word lines 32 and two adjacent read bit lines 33. The source region 34a and the drain region 34b are arranged so as to sandwich a certain read word line 32 and a certain bit line 33 therebetween. On the other hand, the channel region 34c is a parallelogram having a set of opposite sides, which include a side of a square formed by the source region 34a closer to the certain read word line 32, and a side of a square formed by the source region 34a and the drain region 34b shifted by one region in the direction along the word line 32. Above the channel region 34c, the lower layer gate or the bit line 33 and the upper layer gate or the read word line 32 are arranged to overlap. A source electrode contact 35a and a drain electrode contact 35b are formed through a self-align process utilizing regions surrounded by two adjacent read word lines 32 and two adjacent bit lines 33. A bit line contact 36 is formed at the terminal of the bit line 33 and connected to the ground line (0 V). This is used to discharge electrons after completely used in reading.

In the case of the read FET shown in FIG. 4B, the layout of the channel region 34c differs from that in the case of FIG. 4A. Specifically, it is a parallelogram having a set of opposite sides, which include a side of a square formed by the source region 34a closer to the bit line 33, and a side of a square formed by the source region 34a and the drain region 34b shifted by one region in the direction along the bit line 33. In this case, the area of the read word line 32 covering the channel region 34c is smaller than that in the layout of FIG. 4A and accordingly requires a larger read voltage $V_S$ while such the layout of the channel region makes it easy to form the layout of the later-described composite type as an advantage.

Figure 4C:
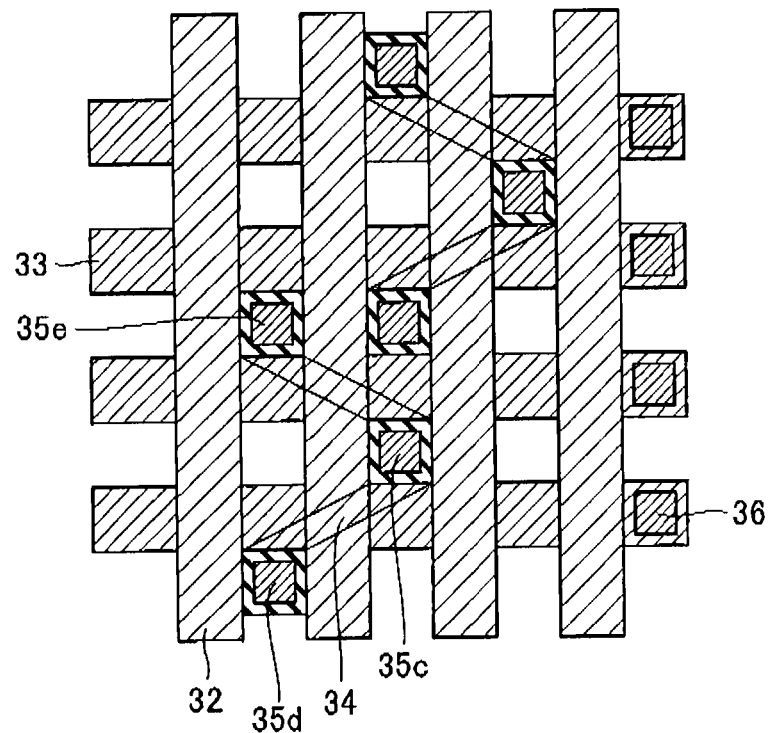
FIG. 4C is a diagram showing a layout of a read FET in another semiconductor memory device according to the same embodiment.
Figure 4D:
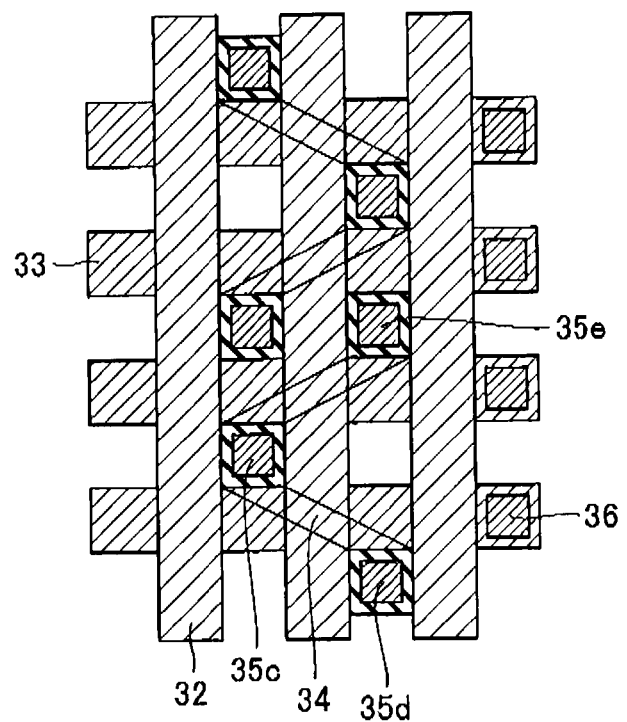
FIG. 4D is a diagram showing a layout of a read FET in another semiconductor memory device according to the same embodiment.

The read FETs 4 shown in FIGS. 4C and 4D have layouts including one source electrode and one drain electrode shared by two read FETs 4. These layouts are used in two types of methods. The first method is a method of utilizing two read FETs 4 as different data read FETs 4. In this case, adjacent memory cells may share a source electrode or a drain electrode to reduce the area of the contact region. For example, the contact electrode 35c may be used as the common source electrode, and the contact electrode 35d may be used as the drain electrode for one FET 4, and the contact electrode 35e as the drain electrode for another FET 4. The second method is a method of utilizing one of two FETs 4 as a read FET and another as a reference FET. A reference memory cell is used to decide the storage state of the storage element and associate it with the logic level of the CMOS circuit. In this case, the contact 35e is used as the source electrode of the read FET 4, the contact 35c as the drain electrode of the read FET 4 and as the source electrode of the reference FET, and the contact 35d as the drain electrode of the reference FET 4, for example, and the contacts 35e and 35d are connected to the supply line and the ground line (0 V), respectively. In this case, if the number of electrons stored in the lower layer gate above the read FET 4 is larger than the number of electrons stored in the lower layer gate above the reference FET, the read FET 4 nears the OFF state and the reference FET nears the ON state. Accordingly, the voltage on the output terminal or the contact 35c nears 0 V. On the other hand, if the number of electrons stored in the lower layer gate above the read FET 4 is smaller than the number of electrons stored in the lower layer gate above the reference FET, the read FET 4 nears the ON state and the reference FET nears the OFF state. Accordingly, the voltage on the output terminal or the contact 35c nears VDD. The number of electrons stored in the lower layer gate is in inverse proportion to the resistance of the corresponding intersection. Accordingly, the voltage on the output terminal directly reflects the resistances of two adjacent corresponding intersections. For example, the low-resistance state may be determined to correspond to the bit value "1". In this case, if the reference FET has a resistance between the high-resistance state and the low-resistance state, the voltage on the output terminal when it is "H" directly corresponds to the bit value "0".

In accordance with the present embodiment, it is possible to greatly improve the sensitivity at the time of read. Namely, in the methods of the prior art, electrons passed through the storage element 5 including the variable resistive element are spread over the entire bit line BL and stored thereon. Therefore, if there are N electrons and the bit line BL has a capacitance $C_B$, the variation in the potential on the bit line 3 can be given by $(N \times e)/C_B$. In accordance with the ITRS 2007 table, the capacitance on the line of the line width 20-22 nm generation is estimated at 1.5-1.8 pF per cm. Accordingly, when the bit line has a length of 10 μm, there is a $C_B$ of around $1.5\text{-}1.8 \times 10^{-15}$ F. Therefore, a variation of 0.02 V or more in the bit line potential requires about 200 or more electrons to be stored and additionally requires amplification and detection of such the slight variation in bit line potential. In contrast, it is sufficient in the present embodiment if there are almost the same electrons in number as the number of electrons required for charging the gate of the read FET. Therefore, in the 20-22 nm generation, it is sufficient if there are around 50 electrons. In addition, the output signal from the read FET can be used directly as the input signal to the CMOS circuit at the rear stage. In this case, if the memory cell current $I_L$ is 8 nA, an energizing time $T_R$ of 1 ns is sufficient to obtain 50 electrons in number as can be found. It does not depend on the bit line capacitance and accordingly an elongated bit line does not lower the read sensitivity. Thus, a larger scale memory cell array can be achieved easily as an advantage.

The present embodiment also makes it possible to select plural word lines at a time, form plural groups of electrons stored on the same bit line, and sequentially read out these groups. Therefore, the operation of detecting en extremely small current, which requires the energizing time $T_R$ at the minimum, can be executed concurrently in plural memory cells, thereby improving the efficiency in reading massive data sequentially as an advantage.

The present embodiment further makes it possible to execute crosstalk-free read without providing each memory cell with a non-ohmic element, typically a diode, which is required in a general memory of the cross-point type. It is also possible to execute crosstalk-free write and erase without providing each memory cell with a non-ohmic element as in a later-described method. Therefore, the structure of the memory cell can be simplified and the production steps can be reduced as an advantage.

The following description is given to the operational principles of write/erase operations in the memory cell portion.

Figure 5A:
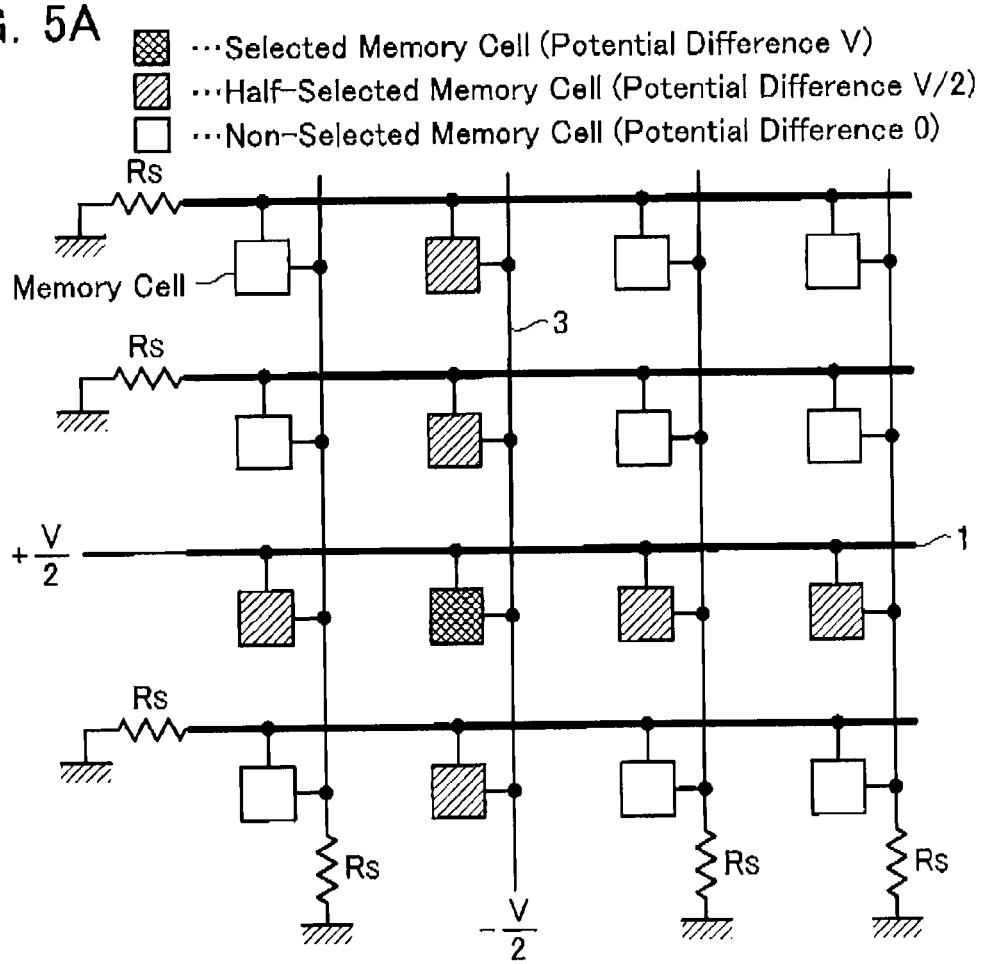
FIG. 5A is a circuit diagram showing part of the semiconductor memory device according to the same embodiment.
Figure 5B:
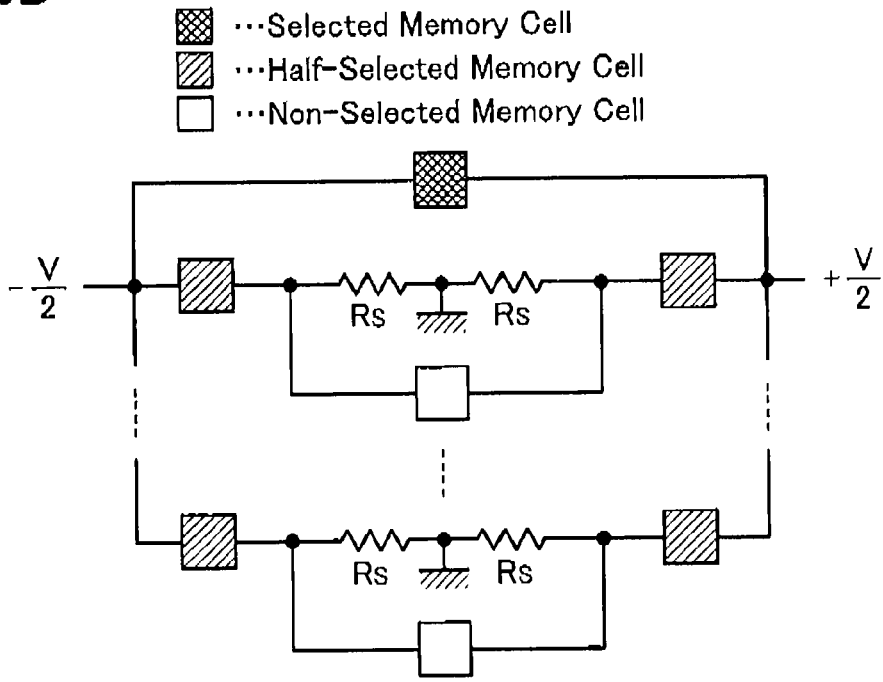
FIG. 5B is an equivalent circuit diagram of the same circuit.

FIG. 5A is a circuit diagram of the memory cell portion of the present embodiment, and FIG. 5B is an equivalent circuit diagram thereof.

The variable resistive element in the memory cell used in the present embodiment may include a ReRAM element. In this case, the ReRAM element has a characteristic to make a transition from the high-resistance state (resistance $R_H$) to the low-resistance state (resistance $R_L$) when a higher voltage than a certain threshold voltage V0set is applied thereto, and make a transition from the low-resistance state to the high-resistance state when a larger current than a certain current (Ireset) flows therein. The transition from the high-resistance state to the low-resistance state is herein defined as write and the transition from the low-resistance state to the high-resistance state as erase.

At the time of write, all the read word lines 2 related to the corresponding memory cell are supplied with a certain voltage $V_{T3}$ to allow the charge to migrate freely on the bit line 3. Subsequently, as shown in FIG. 5A, the word line 1 connected to the write target memory cell (selected memory cell) is supplied with a first write voltage or +½×Vset, the bit line 3 connected to the write target intersection is supplied with a second write voltage or −½×Vset, and other word lines 1 and bit lines 3 are connected to the ground line (0 V) via current limit elements or certain resistors $R_S$. The voltage Vset is set to have a value, which is larger than the value of the threshold voltage V0set plus the voltage drops in the word lines, bit lines, electrodes and so forth and smaller than double the threshold voltage V0set. The resistance $R_S$ is set to have a value such that $(½) \times \text{Vset}/(R_L + R_S + \text{Resistances of word lines, bit lines, electrodes and so forth})$ is smaller than Ireset and that $R_S/(R_S + R_L + \text{Resistances of word lines, bit lines, electrodes and so forth}) \times \text{Vset}$ is smaller than $\text{Ireset} \times R_L$. The current limit element or the resistor $R_S$ is not limited to a fixed resistor using a diffused layer in the Si substrate but may include a variable resistor utilizing the fact that the drain current in a MOSFET can be limited. To prevent re-erase, the power source that supplies ±½×Vset is provided with an output resistor $R_{EX}$ as a current limit circuit operative to prevent the output current from exceeding Ireset, and may be set such that $\text{Vset}/(R_L + R_{EX} + \text{Resistances of word lines, bit lines, electrodes and so forth})$ is smaller than Ireset. Similar to the resistor $R_S$, the resistor $R_{EX}$ is also not limited to a fixed resistor using a diffused layer in the Si substrate but may include a variable resistor utilizing the fact that the drain current in a MOSFET can be limited.

In accordance with the above setting, the variable resistive element in the selected memory cell is supplied with a higher voltage than the threshold voltage V0set. Accordingly, it is possible to execute write to this variable resistive element. The variable resistive element at the intersection of the word line and the bit line, only one of which is selected (hereinafter referred to as "half-selected"), is supplied only with a lower voltage than the threshold voltage V0set, which prevents failed write accordingly. In addition, only a smaller current than Ireset flows and accordingly prevents failed erase. The variable resistive element at the intersection of the word line and the bit line, both non-selected, is supplied with a voltage of $R_S/(R_S + R_{EX} + \text{Resistances of word lines, bit lines, electrodes and so forth}) \times \text{Vset}$ at the maximum if there are plural memory cells in the low-resistance state within the same memory cell array. In this case, though, under the above-described condition, this voltage never reaches the voltage required for erase (Ireset×$R_L$) and the threshold voltage V0set higher than this. Therefore, it is possible to prevent failed write and failed erase.

At the time of erase, like in the case of write, all the read word lines 2 related to the corresponding memory cell are supplied with a certain voltage $V_{T4}$ to allow the charge to migrate freely on the bit line 3. Subsequently, as shown in FIG. 5A, the word line 1 connected to the erase target memory cell is supplied with +½×Vreset, the bit line 3 connected to the erase target memory cell is supplied with −½×Vreset, and other word lines 1 and bit lines 3 are connected to the ground line (0 V) via current limit elements or certain resistors $R_R$, respectively. The voltage Vreset is set to have a value, which is larger than the value of Ireset×$R_L$ plus the voltage drops in the word lines, bit lines, electrodes and so forth and smaller than double Ireset×$R_L$. The resistance $R_R$ is set to have a value such that ½×Vreset/($R_L$+$R_R$+Resistances of word lines, bit lines, electrodes and so forth) is smaller than Ireset and that $R_R$/($R_R$+$R_L$+Resistances of word lines, bit lines, electrodes and so forth)×Vreset is smaller than Ireset×$R_L$. The current limit element or the resistor $R_R$ is not limited to a fixed resistor using a diffused layer in the Si substrate but may include a variable resistor utilizing the fact that the drain current in a MOSFET can be limited. To prevent rewrite, naturally, $R_H$/($R_H$+Resistances of word lines, bit lines, electrodes and so forth)×Vreset is set to have a smaller value than the threshold voltage V0set.

In accordance with the above setting, the variable resistive element at the selected intersection is supplied with a larger flow of current than reset. Accordingly, it is possible to execute erase to this variable resistive element. The variable resistive element in the half-selected memory cell is supplied only with a smaller flow of current than Ireset, which prevents failed erase accordingly. In addition, no higher voltage than the threshold voltage V0set is applied and thus failed write can be prevented. The variable resistive element at the intersection of the word line and the bit line, both non-selected, is supplied with a voltage of $R_R$/($R_R$+$R_L$+Resistances of word lines, bit lines, electrodes and so forth)×Vreset at the maximum if there are plural memory cells in the low-resistance state within the same memory cell array. In this case, though, under the above-described condition, this voltage never reaches the voltage required for erase (Ireset×$R_L$) and the threshold voltage V0set higher than this. Therefore, it is possible to prevent failed write and failed erase.

The values of applied voltages in FIGS. 5A, 5B are just examples. A voltage has a meaning only on a relative value between electrodes. Accordingly, in place of the combination of (+V/2, 0, −V/2), for example, a combination of (V, +V/2, 0) with an addition of V/2 to all may also be used. This case is advantageous because there is no need for a circuit operative to generate a negative voltage.

For the above operation, desirably, the bit lines 3, 23, 33 are composed of a p-type semiconductor formed of boron-doped silicon. Preferably, the read FET 4 is an nMOSFET having a boron-doped p-type semiconductor channel and a source and a drain composed of arsenic- or phosphorous-doped n-type semiconductor. If similar operation is executed using holes instead of electrons, it is sufficient to invert all the applied voltages from positive to negative and replace the p-type semiconductor regions with n-type semiconductor regions.

Figure 5C:
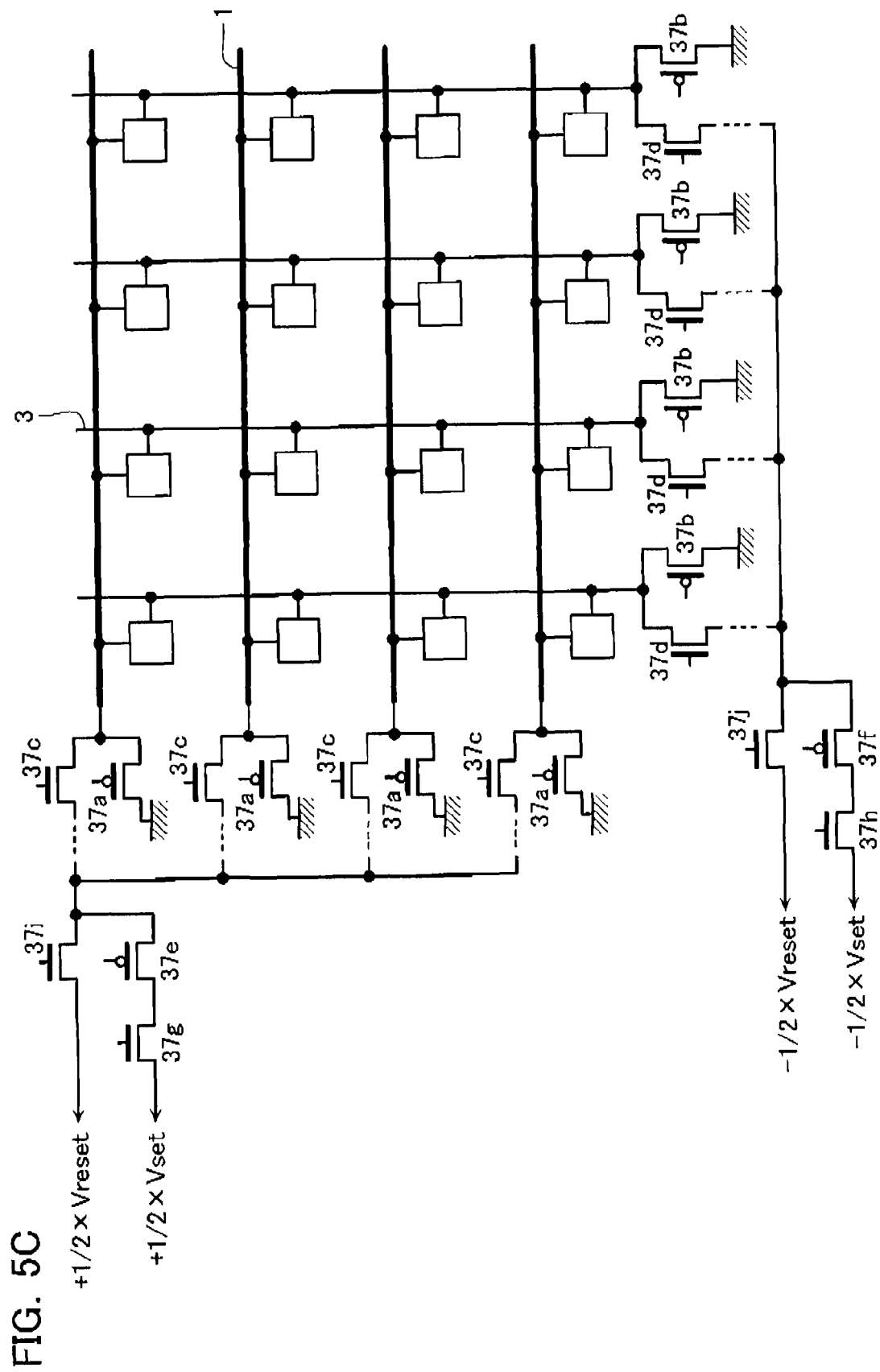
FIG. 5C is a circuit diagram showing part of another semiconductor memory device according to the same embodiment.

FIG. 5C shows a configuration in which the fixed resistors $R_S$ connected to the word lines 1 and the bit lines 3 in FIG. 5A are replaced with pMOSFETs 37a and 37b.

Each word line 1 is connected to the ground line (0 V) via the pMOSFET 37a that turns ON when the word line 1 is not selected. In parallel with each pMOSFET 37a, there is connected an nMOSFET 37c that turns ON when the word line 1 is selected. The nMOSFETs 37c have respective sources, which are connected commonly and connected to the drain of an nMOSFET 37i that is supplied with +½×Vreset on the source and turns ON at the time of erase. In parallel with the nMOSFET 37i, there is an nMOSFET 37g that is supplied with +½×Vset on the source and turns ON at the time of write, of which drain is connected via a pMOSFET 37e serving as the output resistor.

On the other hand, each bit line 3 is connected to the ground line (0 V) via the pMOSFET 37b that turns ON when the bit line 3 is not selected. In parallel with each pMOSFET 37b, there is connected an nMOSFET 37d that turns ON when the word line 2 is selected. The nMOSFETs 37d have respective sources, which are connected commonly and connected to the drain of an nMOSFET 37j that is supplied with −½×Vreset on the source and turns ON at the time of erase. In parallel with the nMOSFET 37j, there is an nMOSFET 37h that is supplied with −½×Vset on the source and turns ON at the time of write, of which drain is connected via a pMOSFET 37f serving as the output resistor.

This configuration uses the pMOSFETs 37a, 37b controllable by the gate voltage as the current limit elements and accordingly achieves more flexible designs than the case shown in FIG. 5A.

Figure 5D:
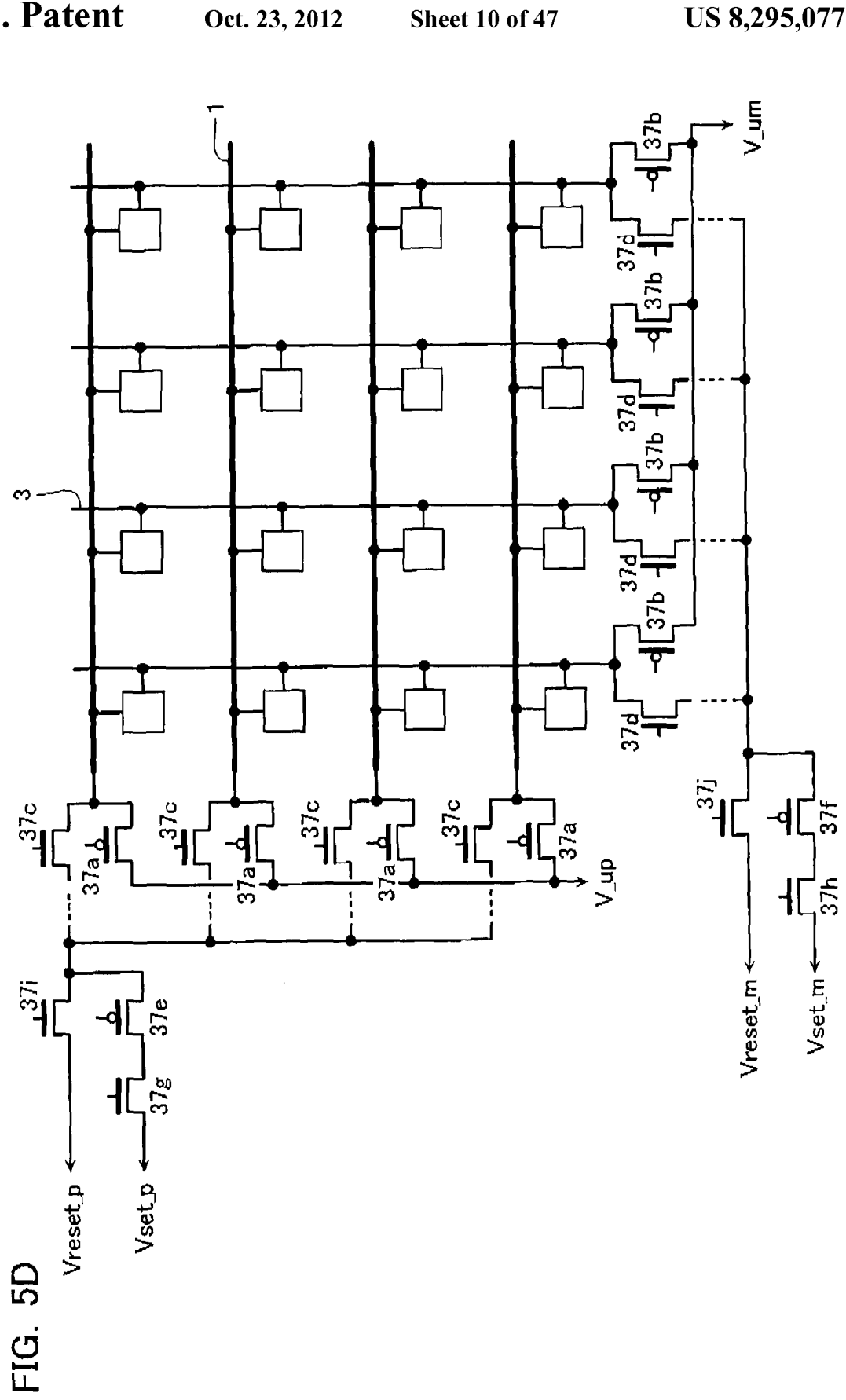
FIG. 5D is a circuit diagram showing part of another semiconductor memory device according to the same embodiment.

FIG. 5D shows a circuitry of the memory cell portion, which is same as that shown in FIG. 5C except that the applied voltages are changed. Specifically, the sources of the pMOSFETs 37a, 37b, 37g, 37h, 37i and 37j are supplied with certain voltages V_up, V_um, Vset_p, Vset_m, Vreset_p, Vreset_m, respectively.

Preferably, in consideration of writing, these voltages have the following relations: Vset_p−Vset_m=Vset; Vset_p>V_up; Vset_p>V_um; V_up>Vset_m; and V_um>Vset_m. Preferably, in consideration of erasing on the other hand, they have the following relations: Vreset_p−Vreset_m=Vreset; Vreset_p>V_up; Vreset_p>V_um; V_up>Vreset_m; and V_um>Vreset_m. An inequality relation between the voltages V_up and V_um can be determined arbitrarily so long as these conditions can be satisfied.

Method of Production in Present Embodiment

Figure 6:
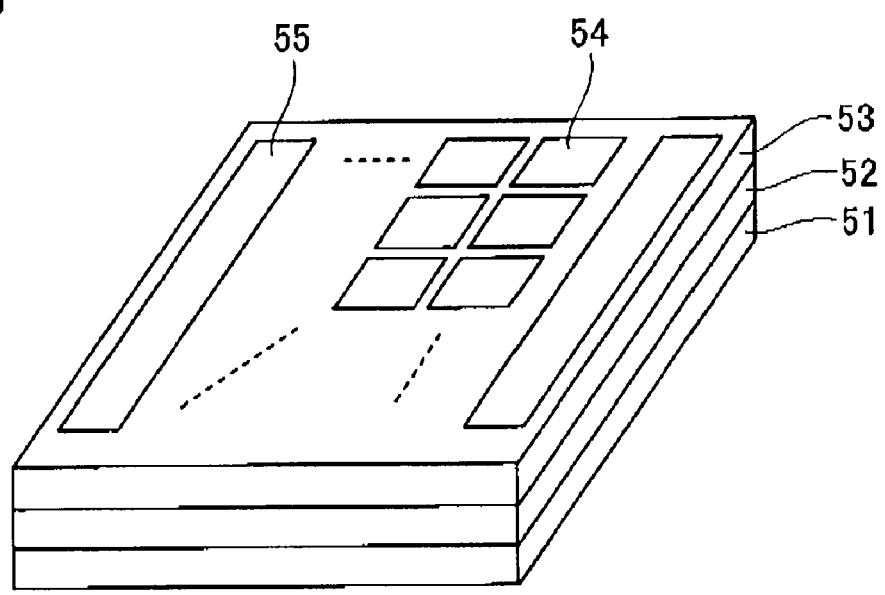
FIG. 6 is a perspective view showing the entire configuration of the same semiconductor memory device.

FIG. 6 is a perspective view showing the entire configuration of the semiconductor memory device according to the present embodiment. There is a general Si substrate 51, on which a CMOS circuit 52 is formed through normally used processes, and a layer 53 containing plural memory cell portions 59 is formed thereon. An individual memory cell portion 54 in FIG. 6 corresponds to the memory cell array 41 in FIG. 2. The CMOS circuit 52 in FIG. 6 includes the portions called peripheral circuits in general semiconductor memory devices, containing the driver, the decoder and the upper block in FIG. 2.

The CMOS circuit 52, except the connections with the memory cell portion 54, is designed and produced under a 90-nm design rule, which is looser than that for the lines in the memory cell portion 54. One memory cell portion 54 occupies an about 11-μm square region and includes 256×256 intersections. Blocks having electric connections with the CMOS circuit 52 around the memory cell portions 54 are arranged in matrix on the basis of the memory cell portion 54 and the peripheral connection. Further, through-holes are formed through the layer 53 containing the memory cell portions 54, and I/O portions 55 of the device including terminals having electrical coupling with the I/O portions of the CMOS circuit 52 are formed at the end of the layer 53 containing the memory cell portions 54 as shown in FIG. 6.

With the above-described configuration in the present embodiment, the insulator film formed in the memory cell portions 54 can also be used as the portion corresponding to the protection film in the CMOS circuit 52. On the other hand, the memory cell portions 54 and the CMOS circuit 52 are coupled in the stacked direction. Therefore, it is possible to achieve a reduction in operating time and a large increase in the number of simultaneously readable/writable memory cells without any increase in chip area. The I/O portions 55 of the device can be bonded to the lead frame in the packaging step, like in general semiconductor devices.

The following detailed description is given to a method of producing the semiconductor memory device according to the present embodiment.

FIGS. 7A-7M are cross-sectional views showing the steps of forming the semiconductor memory device according to the present embodiment in order of process.

A 720-μm thick Si substrate 101 is provided and, on one side thereof, a desired CMOS circuit 102 is formed as the groundwork using normal CMOS processes. The CMOS circuit 102 includes normal MOSFETs and multilayered lines as well as connection lines to the memory cell array. In the steps for the CMOS circuit 102, the processes for combining NOR-type flash memories are used to form the structure containing the read FET having gates in two layers and part of the read word line and part of the bit line.

Figure 7A:
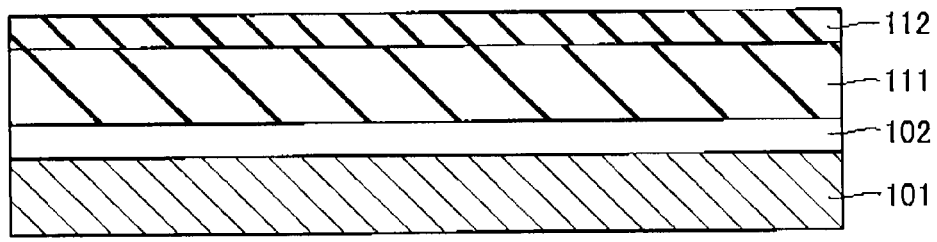
FIG. 7A is a cross-sectional view showing the step of forming the semiconductor memory device according to the first embodiment of the present invention in order of process.

First, as shown in FIG. 7A, a CVD method using TEOS as a main material is applied to form on the substrate an insulator film 111 composed of $SiO_2$ with a thickness of 300 nm. Subsequently, a LPCVD method using dichlorosilane and ammonia as main materials is applied to form a $Si_3N_4$ film 112 with a thickness of 15 nm. Although not shown in figure, the connecting portion between the CMOS circuit 102 and the read word line is processed at this stage.

Figure 7B:
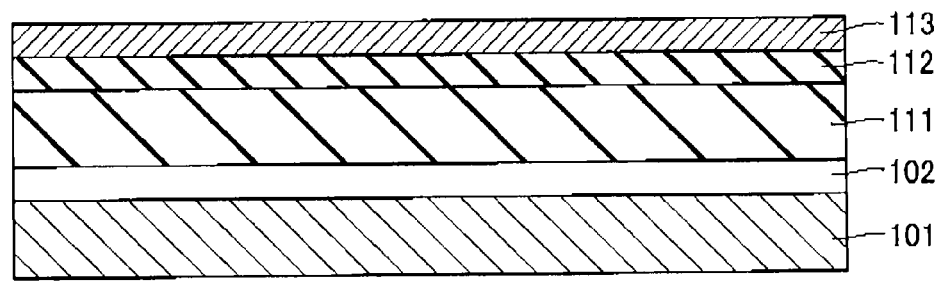
FIG. 7B is a cross-sectional view showing the step of forming the same semiconductor memory device in order of process.

Subsequently, as shown in FIG. 7B, a spattering method is applied to continuously form a composite film 113 including Ti with a film thickness of 5 nm and W with a film thickness of 15 nm.

Figure 7C:
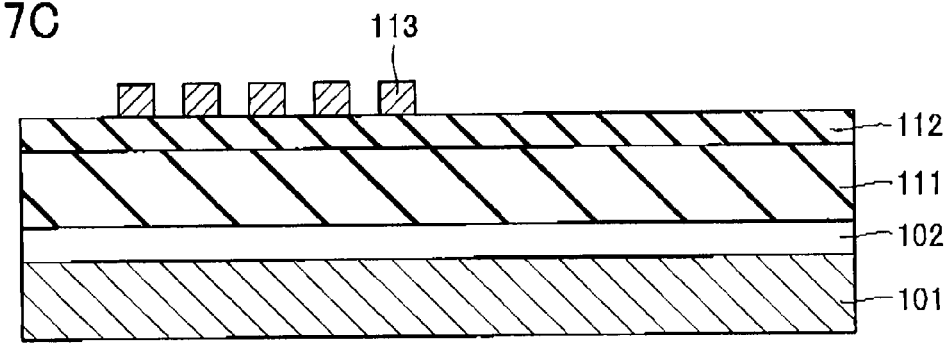
FIG. 7C is a cross-sectional view showing the step of forming the same semiconductor memory device in order of process.

Subsequently, as shown in FIG. 7C, an imprint lithography technology is used to form a resist pattern at pitches of 40 nm and then, with a mask of the resultant resist pattern, a reactive ion etching using $CHF_3$ and $SF_6$ gases is applied to pattern the composite film 113. The patterned composite film 113 finally serves as the read word lines. After completion of patterning, the resist is peeled off.

Figure 7D:
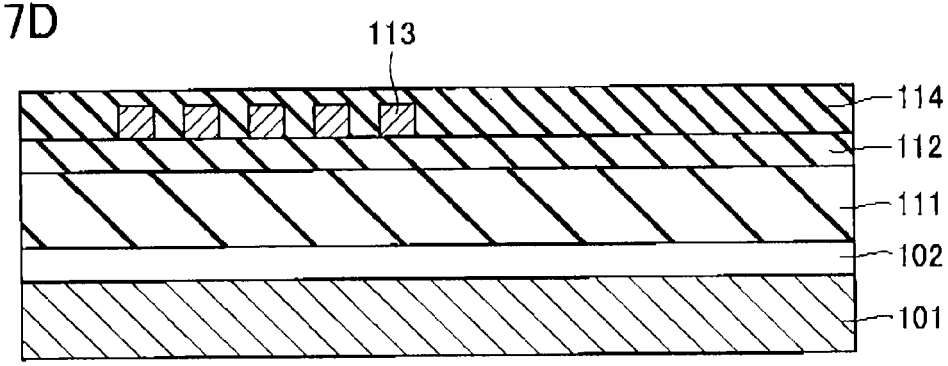
FIG. 7D is a cross-sectional view showing the step of forming the same semiconductor memory device in order of process.

Subsequently, as shown in FIG. 7D, a CVD method using TEOS as a main material is applied again to form an insulator film 114 composed of $SiO_2$ with a thickness of 30 nm as buried in between patterns.

Figure 7E:
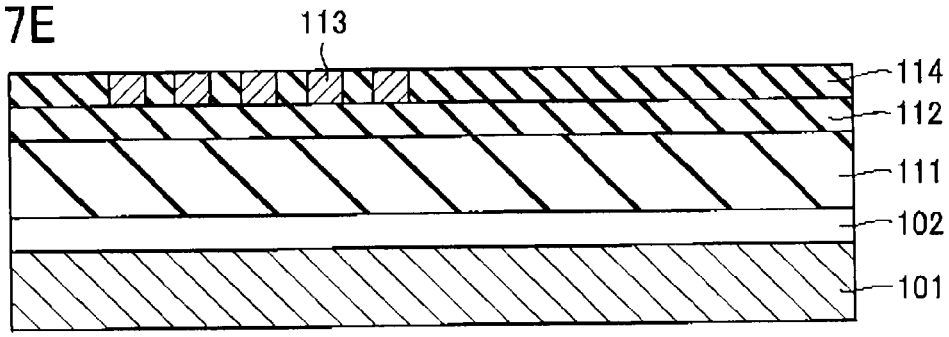
FIG. 7E is a cross-sectional view showing the step of forming the same semiconductor memory device in order of process.

Subsequently, as shown in FIG. 7E, a CMP method is used to planarize the $SiO_2$ film 114 and expose the upper surface of the composite film 113.

Figure 7F:
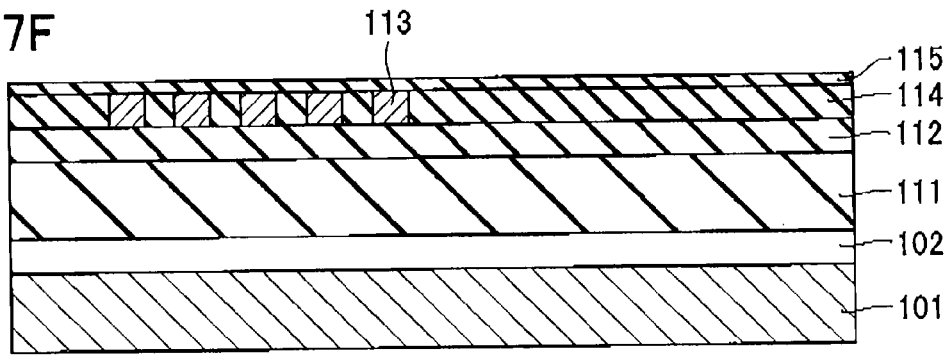
FIG. 7F is a cross-sectional view showing the step of forming the same semiconductor memory device in order of process.

Subsequently, as shown in FIG. 7F, a CVD method using TEOS as a main material is applied to form an insulator film 115 composed of $SiO_2$ with a thickness of 10 nm as an interlayer insulator film. Although not shown in figure, the connecting portion between the CMOS circuit 102 and the bit line is processed to open a contact-hole therethrough at this stage.

Figure 7G:
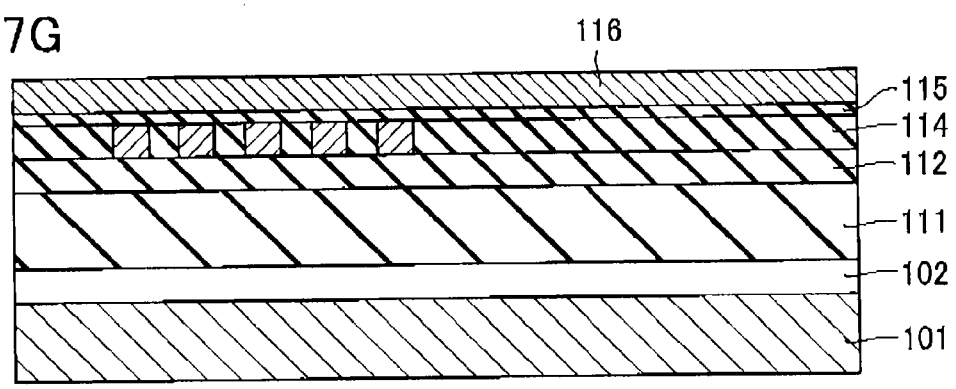
FIG. 7G is a cross-sectional view showing the step of forming the same semiconductor memory device in order of process.

Subsequently, as shown in FIG. 7G, a LPCVD method using silane as a main material with an additive of $B_2H_6$ is applied to form a boron-doped amorphous silicon film 116 with a thickness of 20 nm.

Figure 7H:
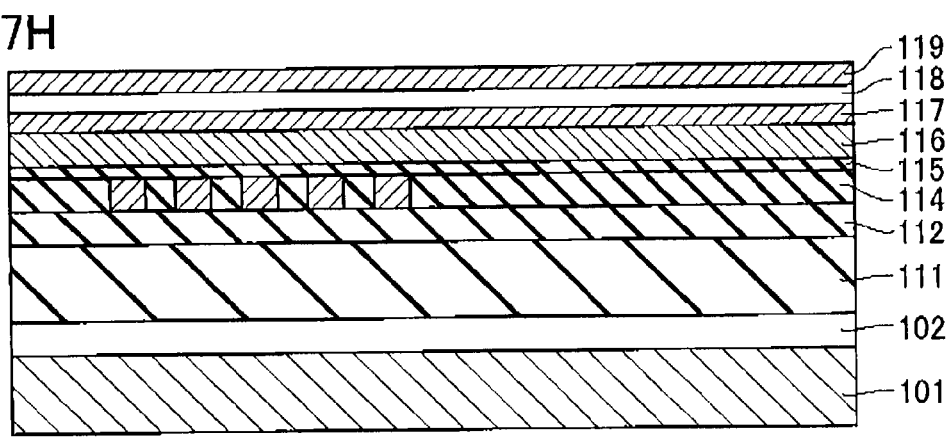
FIG. 7H is a cross-sectional view showing the step of forming the same semiconductor memory device in order of process.

Subsequently, as shown in FIG. 7H, a continuous spattering method is applied to form a TiN film 117 with a thickness of 5 nm, a $ZnMn_2O_4$ film 118 with a thickness of 15 nm, and a TaN film 119 with a thickness of 5 nm in turn. The $ZnMn_2O_4$ film 118 serves as the variable resistive element later.

Figure 7I:
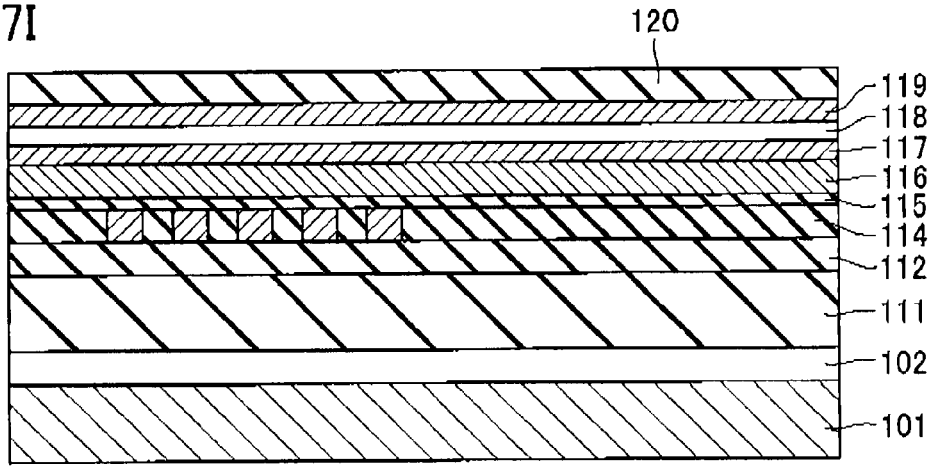
FIG. 7I is a cross-sectional view showing the step of forming the same semiconductor memory device in order of process.

Subsequently, as shown in FIG. 7I, a CVD method using TEOS as a main material is applied to form an insulator film 120 composed of $SiO_2$ with a thickness of 50 nm.

Subsequently, an imprint lithography technology is used to form a resist pattern at pitches of 40 nm aligned in the direction normal to the page and then, with a mask of the resultant resist pattern, a reactive ion etching using $CHF_3$ and CO gases is applied to pattern the $SiO_2$ film 120. After completion of patterning, the resist is peeled off and then, with an etching mask of the resultant $SiO_2$ pattern, a reactive ion etching using HBr and $O_2$ gases is applied to continuously etch the TaN film 119, the $ZnMn_2O_4$ film 118, the TiN film 117 and the amorphous silicon film 116. After etching, heating is executed within oxygen ambient under extremely low pressure for crystallizing the amorphous silicon film 116 to polysilicon, activating impurity boron, and inactivating the matters adhered on the polysilicon sidewall.

Subsequently, a low-viscosity, spin-coatable silicon oxide (SOG) film 121 is used as buried in the etched trenches previously formed. Then, with a stopper of the TaN film 119, a reactive ion etching using $CHF_3$ and CO gases is applied to expose the upper surface of the TaN film 119.

Figure 7J:
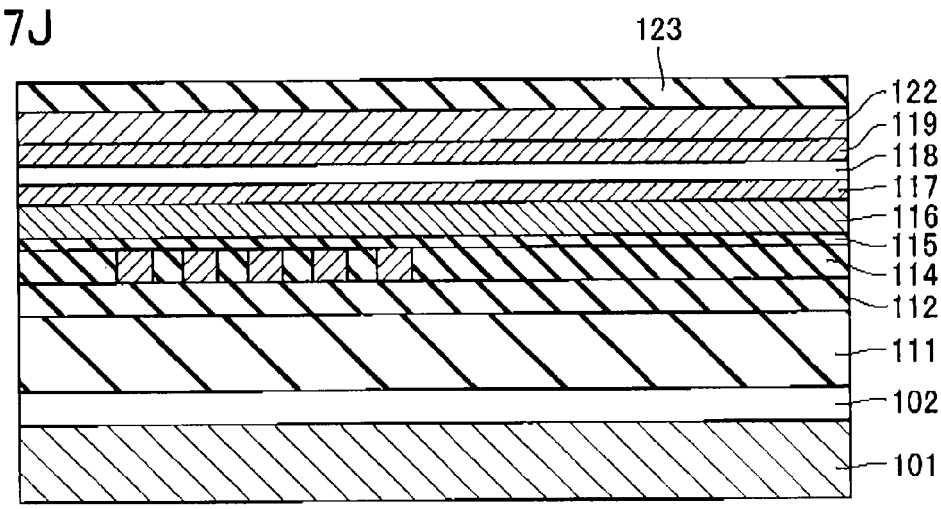
FIG. 7J is a cross-sectional view showing the step of forming the same semiconductor memory device in order of process.

Subsequently, as shown in FIG. 7J, a spattering method is applied to form a W film 122 with a thickness of 20 nm, and then a CVD method using TEOS as a main material is applied to form an insulator film 123 composed of $SiO_2$ with a thickness of 100 nm. Thereafter, an imprint lithography technology is used to form a resist pattern at pitches of 40 nm.

Figure 7K:
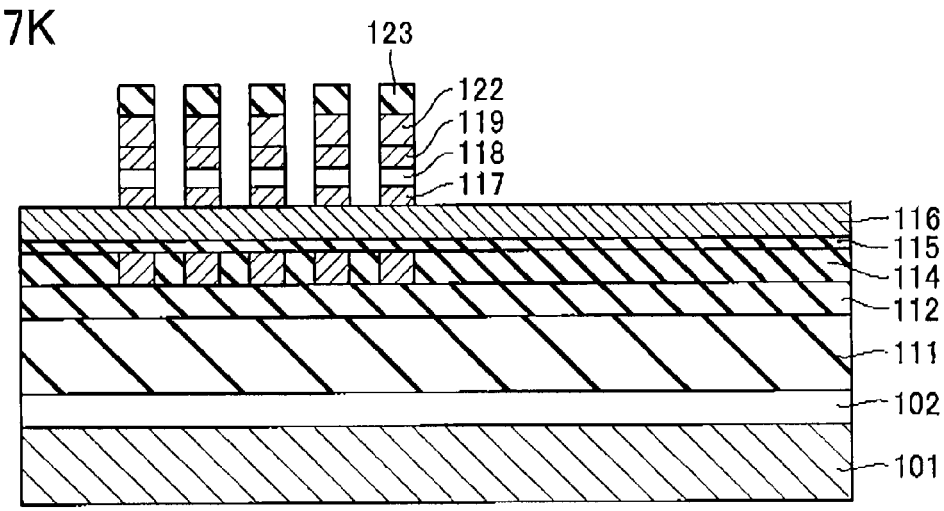
FIG. 7K is a cross-sectional view showing the step of forming the same semiconductor memory device in order of process.

Subsequently, as shown in FIG. 7K, with a mask of the resultant resist pattern, a reactive ion etching using $CHF_3$ and CO gases is applied to pattern the $SiO_2$ film 123. After completion of patterning, the resist is peeled off. Then, with an etching mask of the resultant $SiO_2$ pattern, a reactive ion etching using $CHF_3$, $CF_4$ and $O_2$ gases is applied to etch the W film 122, the TaN film 119, the $ZnMn_2O_4$ film 118, and the TiN film 117 in turn. The W film 122 finally serves as the word lines and the $ZnMn_2O_4$ film 118 as the variable resistive element.

Figure 7L:
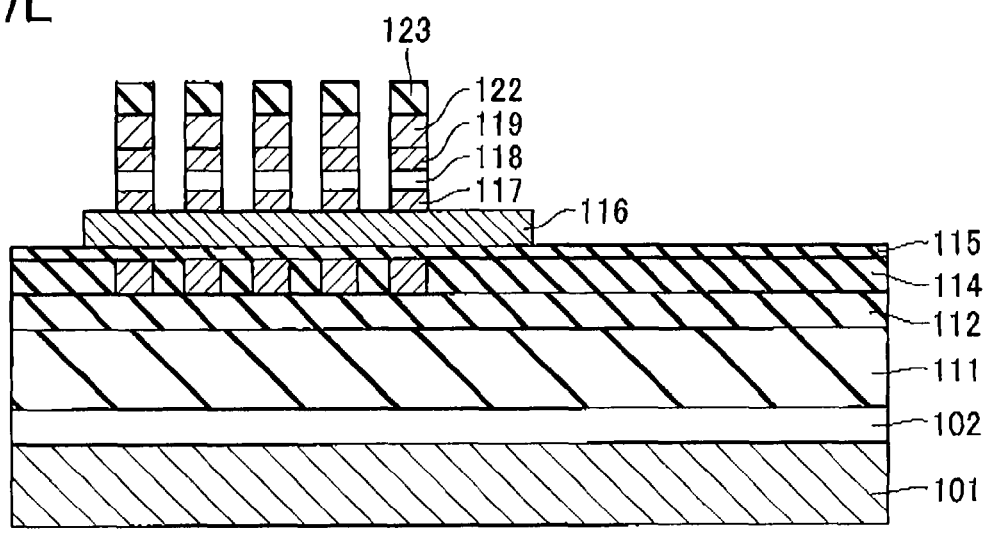
FIG. 7L is a cross-sectional view showing the step of forming the same semiconductor memory device in order of process.

Subsequently, as shown in FIG. 7L, a normal lithography step is used to form a resist pattern to remove extra parts from the polysilicon film 116. This polysilicon film 116 forms the bit lines.

Figure 7M:
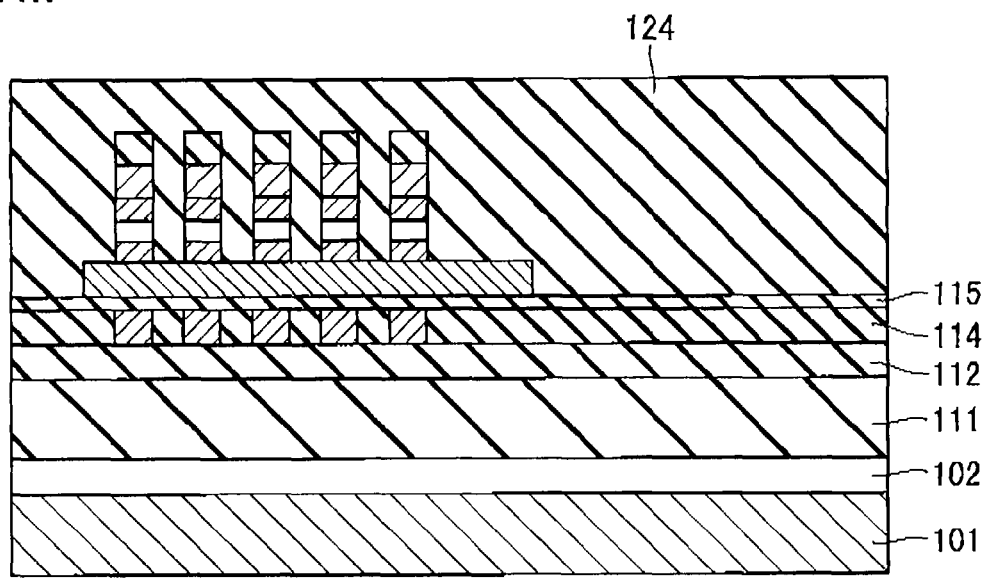
FIG. 7M is a cross-sectional view showing the step of forming the same semiconductor memory device in order of process.

Subsequently, as shown in FIG. 7M, a low-viscosity, spin-coatable silicon oxide (SOG) film 124 is used to form an interlayer insulator. Although not shown in figure, the connecting portion between the W film 122 and the CMOS circuit 102 is processed to open a contact-hole therethrough. After line formation, an interlayer insulator is formed again.

If the memory cell portion is formed in a multilayered structure, a desired structure can be obtained by repeating the above steps.

Finally, the so-called passivation film is formed, followed by forming the I/O portions or the line connecting portions, and then executing the so-called post process such as checking and dicing to complete the semiconductor memory device.

In the present embodiment, $ZnMn_2O_4$ is used as the variable resistive element for use in memory operation though other materials such as NiO, $TiO_2$, $SrZrO_3$ and $Pr_{0.7}Ca_{0.3}MnO_3$ may be used as well. Further, TiN and TaN are used as the electrode for making contact with the variable resistive element though other materials such as Pt, W, WN and Nb-doped $TiO_2$ may be used as well.

Second Embodiment

Configuration of Present Embodiment

A semiconductor memory device according to a second embodiment of the present invention is configured same as the first embodiment except the below-described structure of the memory cell portion.

Figure 8A:
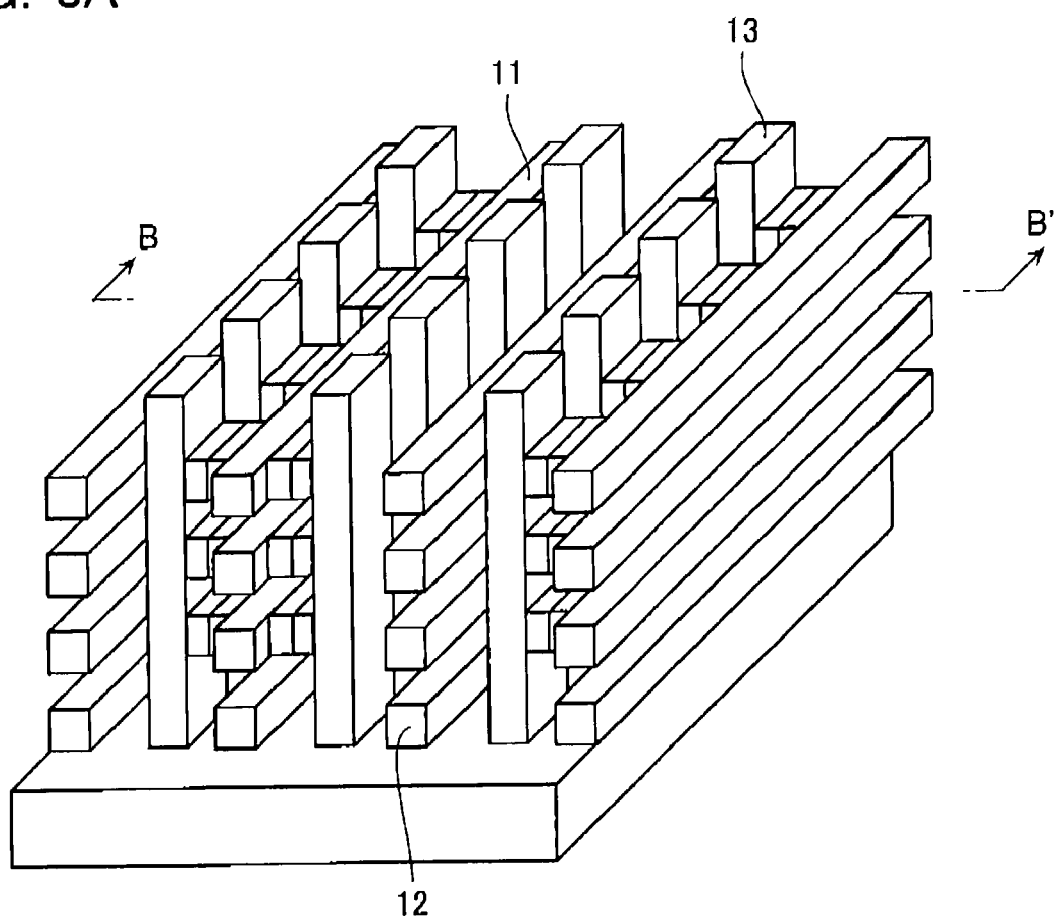
FIG. 8A is a perspective view showing part of a semiconductor memory device according to a second embodiment of the present invention.
Figure 8B:
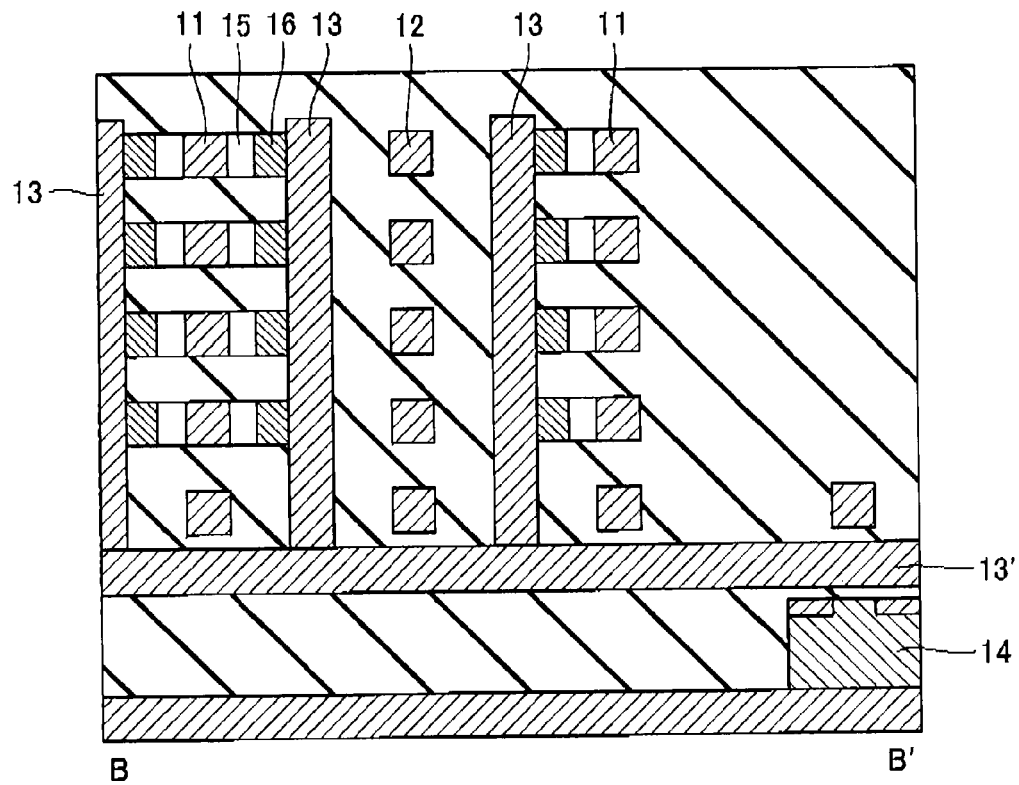
FIG. 8B is a cross-sectional view showing part of the same semiconductor memory device.

FIGS. 8A and 8B are a perspective view and a cross-sectional view showing the memory cell portion.

The memory cell portion has the same structure as that in the first embodiment, which includes word lines 11, read word lines 12, bit lines 13, and memory cells composed of storage elements 15 and electrodes 16 connected in series.

In the preceding embodiment, the word lines 11, 12 and bit lines 13 are provided in parallel with the Si substrate. On the contrary, in the present embodiment, the word lines 11, 12 and bit lines 13 are formed in planes normal to the Si substrate. The above structure is different in that the word line 11 and the read word line 12 are shared by two sets of memory cells and two bit lines 13 located on the both sides thereof. Therefore, it is possible to increase the number of memory cells storable per identical area more than the first embodiment.

Figure 8C:
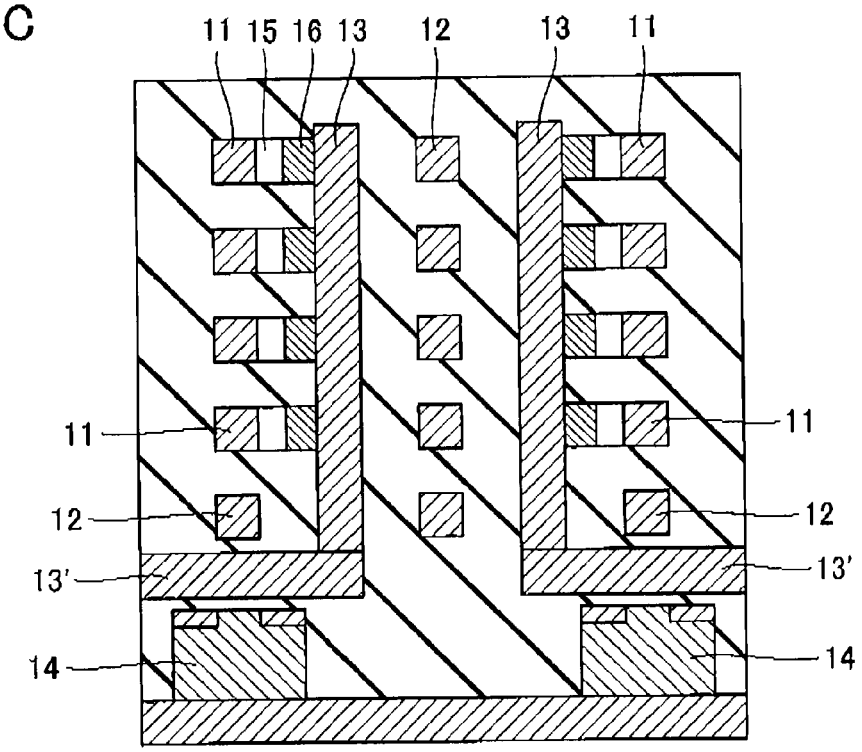
FIG. 8C is a cross-sectional view showing part of another semiconductor memory device according to the same embodiment.

Another example of the memory cell portion of the present embodiment is shown next in FIG. 8C.

This memory cell portion is similar to the cases shown in FIGS. 8A-B in that the read word line 12 is shared by two bit lines 13.

Plural bit lines 13, however, are individually connected to bit lines 13' having respective ends with read FETs 14 arranged in the vicinity thereof, different from the first embodiment.

In this case, it is possible to execute parallel data read and accordingly reduce the reading time shorter than that in the embodiment in FIGS. 8A-B.

Operational Principle of Present Embodiment

The operational principle of the present embodiment is basically same as the first embodiment other than the following point.

In the case of the embodiment in FIGS. 8A-B, the read word line 12 and the read FET 14 are shared and accordingly a problem arises in reading, different from the case of the first embodiment. Specifically, electrons stored on a certain bit line 13 and electrons stored on another bit line 13 that shares the read word line 12 with the certain bit line 13 are mixed together on the common bit line 13' while they are transferred to the read FET 14.

This point can be resolved by fixing the voltage on the word line 11 corresponding to one bit line 13 to the ground voltage (0V) and transferring only the electrons stored on the other bit line 13 to the read FET 14.

On the other hand, the word line 11 is shared by memory cells connected to different bit lines 13. Accordingly, it is possible to store electrons on these bit lines 13 at the same time. The electrons once stored can be transferred to the read FET 14 using the read word line 12 corresponding to one bit line 13 and then transferred to the read FET 14 using the read word line 12 corresponding to the other bit line 13, thereby sequentially reading data from the memory cells connected to both the bit lines 13.

The application of this method can make it possible to concurrently execute operations of detecting extremely small currents flowing in memory cells connected to a number of bit lines 13 arrayed two-dimensionally and further improve the efficiency when massive data is sequentially read out.

Method of Production in Present Embodiment

Figure 9A:
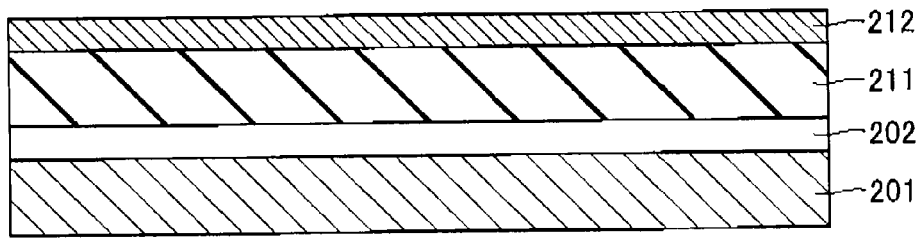
FIG. 9A is a cross-sectional view showing the step of forming the semiconductor memory device according to the second embodiment of the present invention in order of process.
Figure 9B:
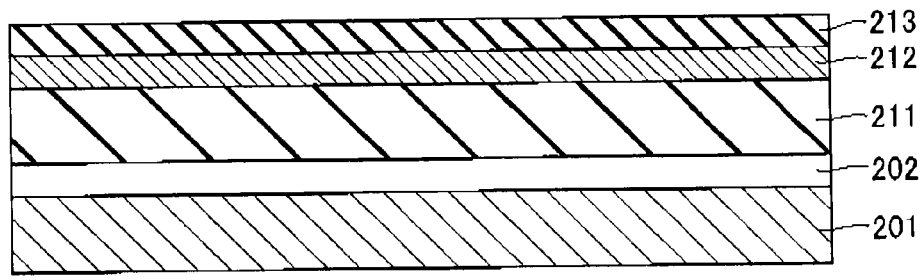
FIG. 9B is a cross-sectional view showing the step of forming the same semiconductor memory device in order of process.
Figure 9C:
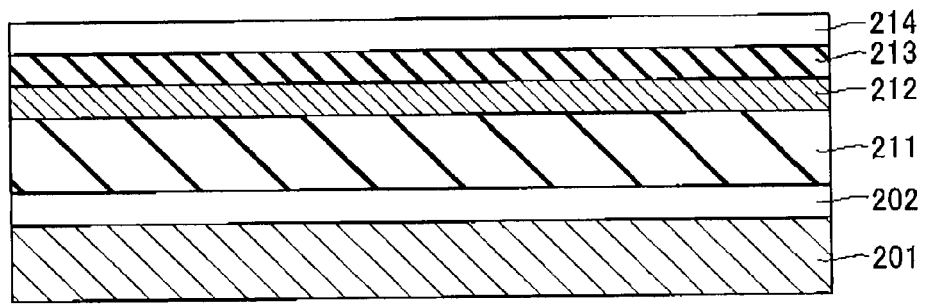
FIG. 9C is a cross-sectional view showing the step of forming the same semiconductor memory device in order of process.
Figure 9D:
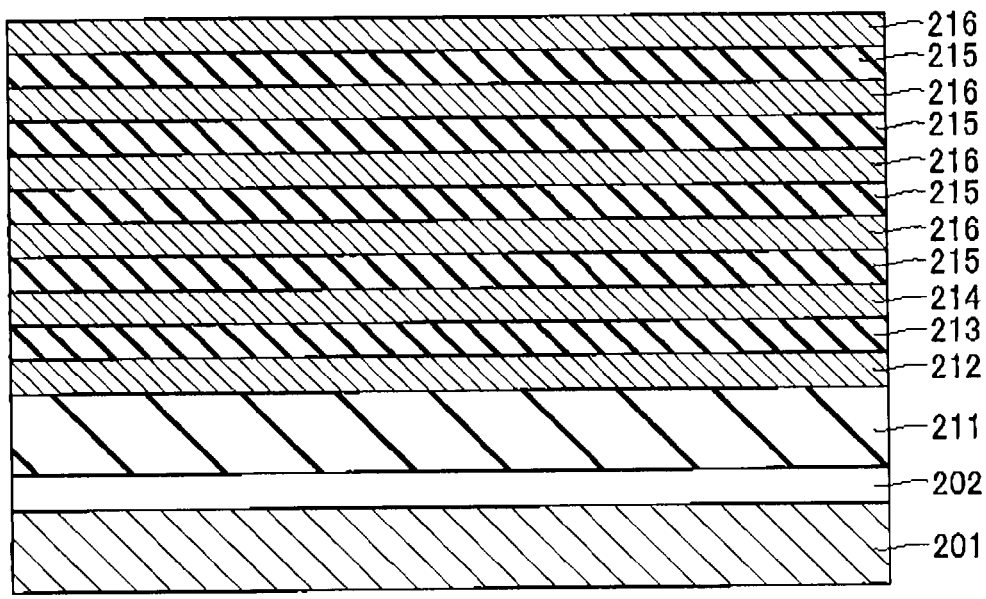
FIG. 9D is a cross-sectional view showing the step of forming the same semiconductor memory device in order of process.
Figure 9E:
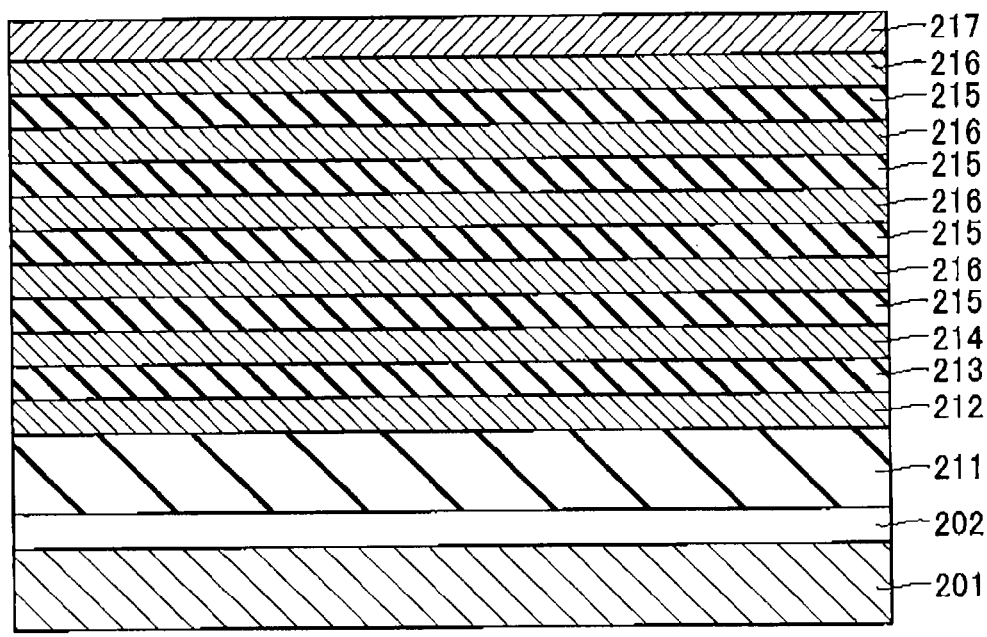
FIG. 9E is a cross-sectional view showing the step of forming the same semiconductor memory device in order of process.
Figure 9F:
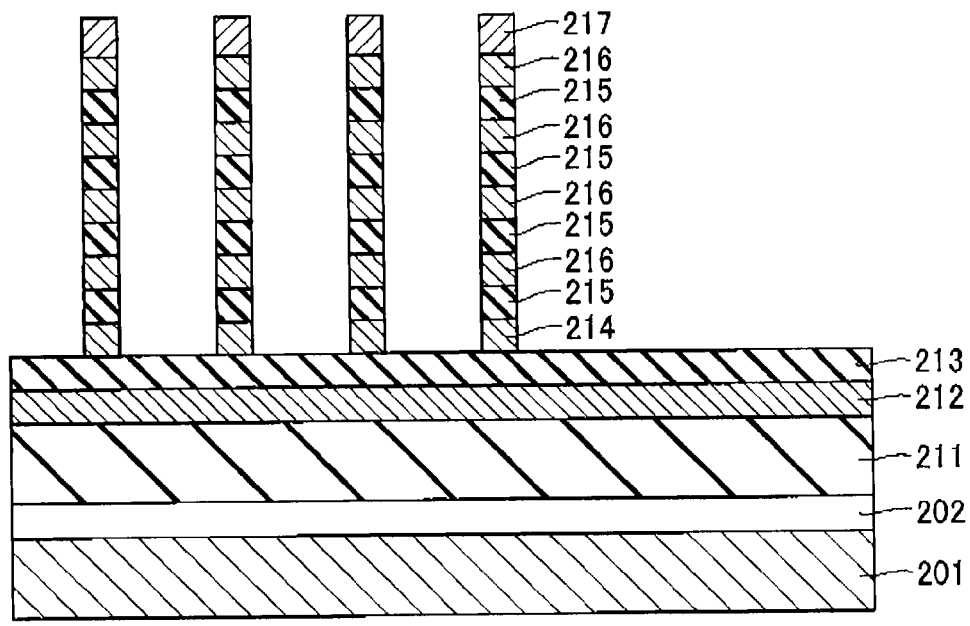
FIG. 9F is a cross-sectional view showing the step of forming the same semiconductor memory device in order of process.
Figure 9G:
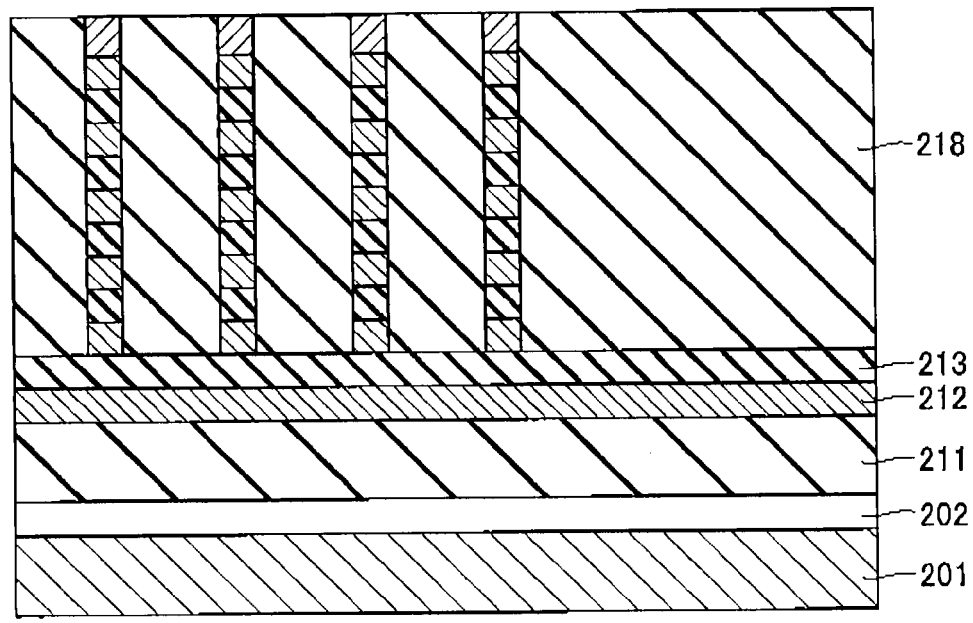
FIG. 9G is a cross-sectional view showing the step of forming the same semiconductor memory device in order of process.
Figure 9H:
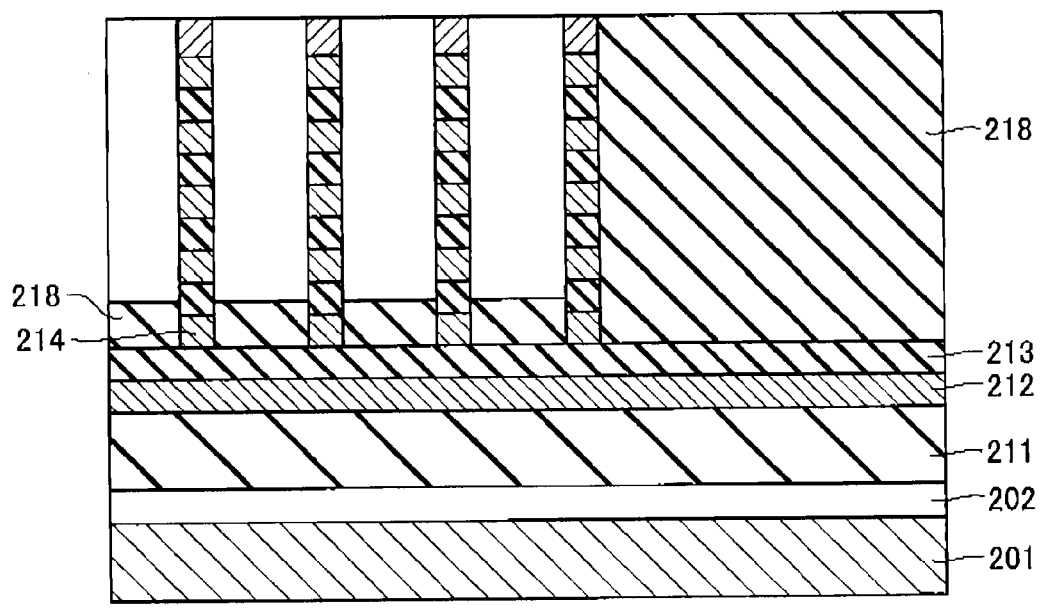
FIG. 9H is a cross-sectional view showing the step of forming the same semiconductor memory device in order of process.
Figure 9I:
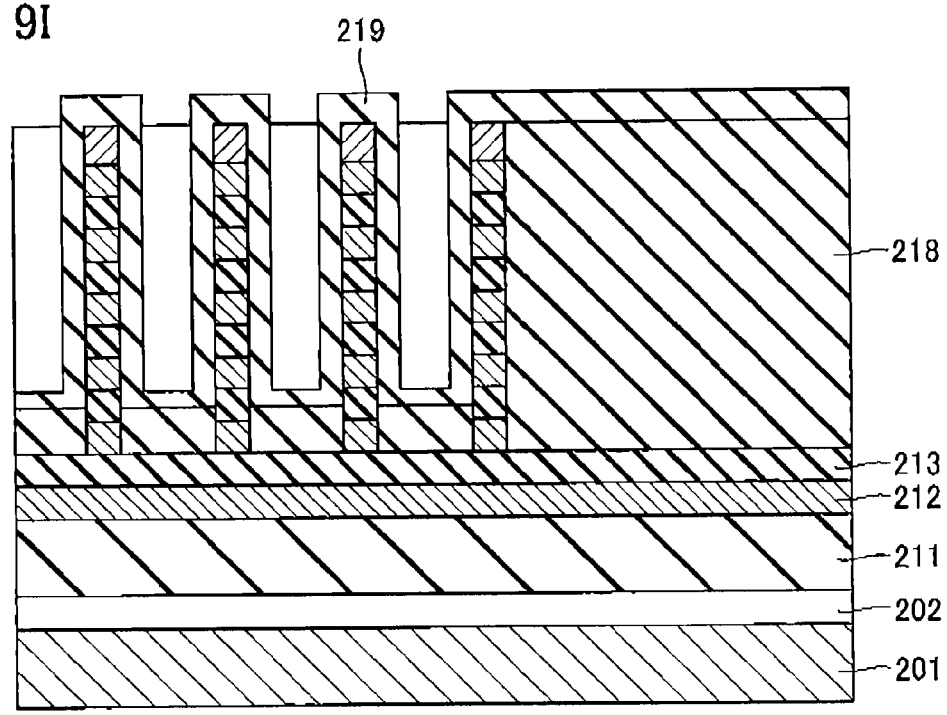
FIG. 9I is a cross-sectional view showing the step of forming the same semiconductor memory device in order of process.
Figure 9J:
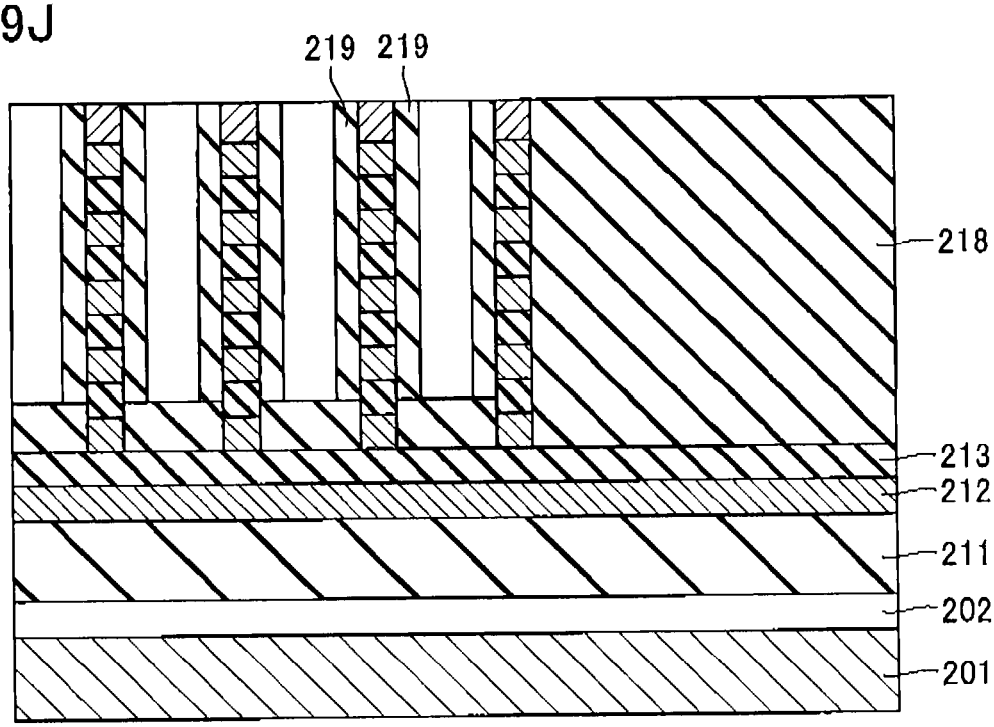
FIG. 9J is a cross-sectional view showing the step of forming the same semiconductor memory device in order of process.
Figure 9K:
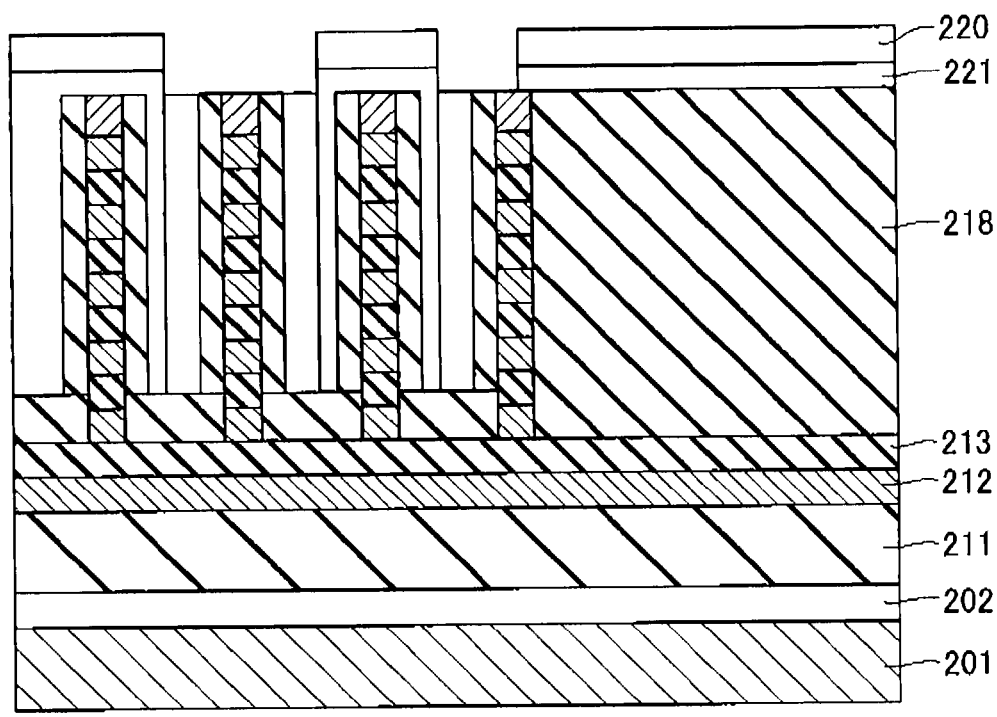
FIG. 9K is a cross-sectional view showing the step of forming the same semiconductor memory device in order of process.
Figure 9L:
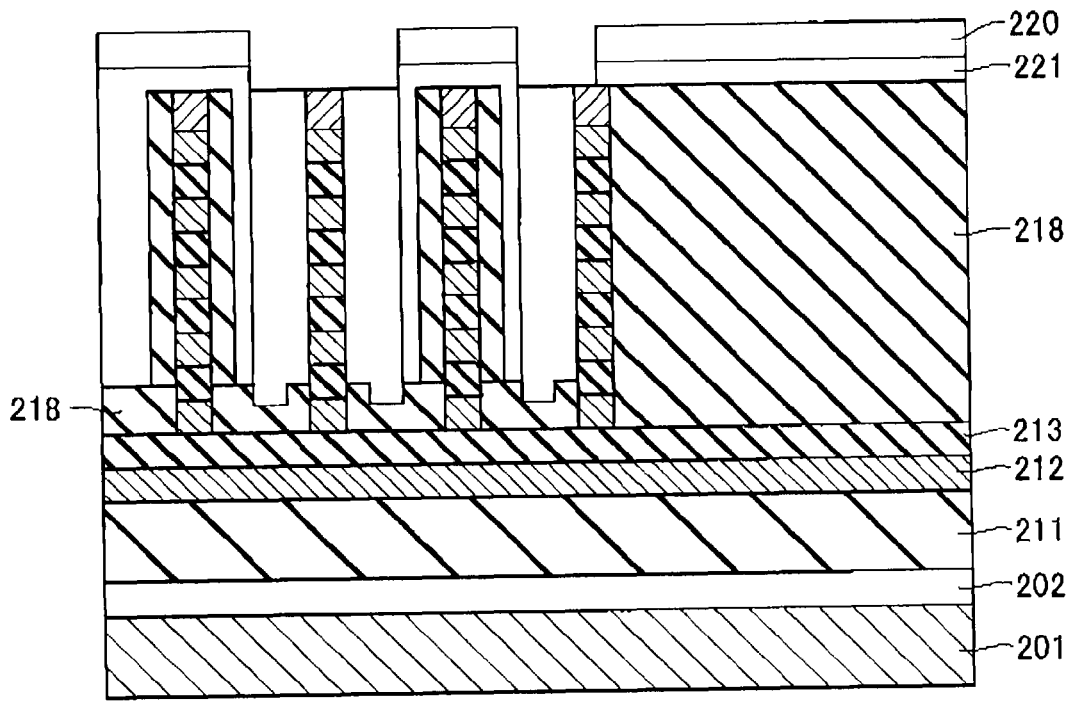
FIG. 9L is a cross-sectional view showing the step of forming the same semiconductor memory device in order of process.
Figure 9M:
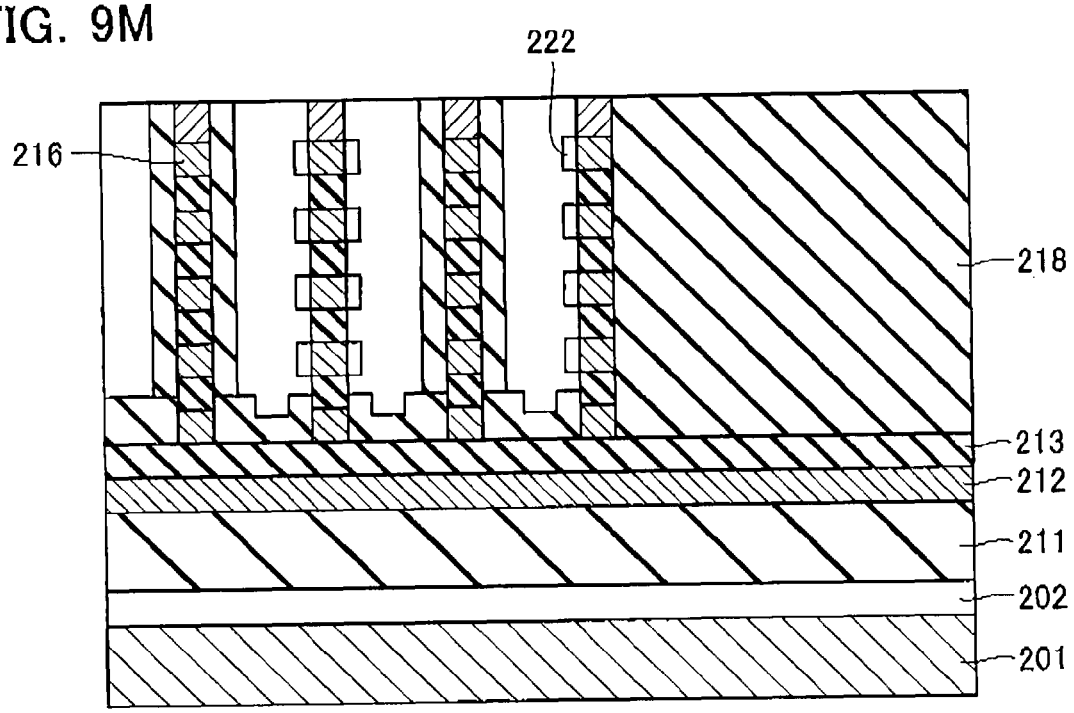
FIG. 9M is a cross-sectional view showing the step of forming the same semiconductor memory device in order of process.
Figure 9N:
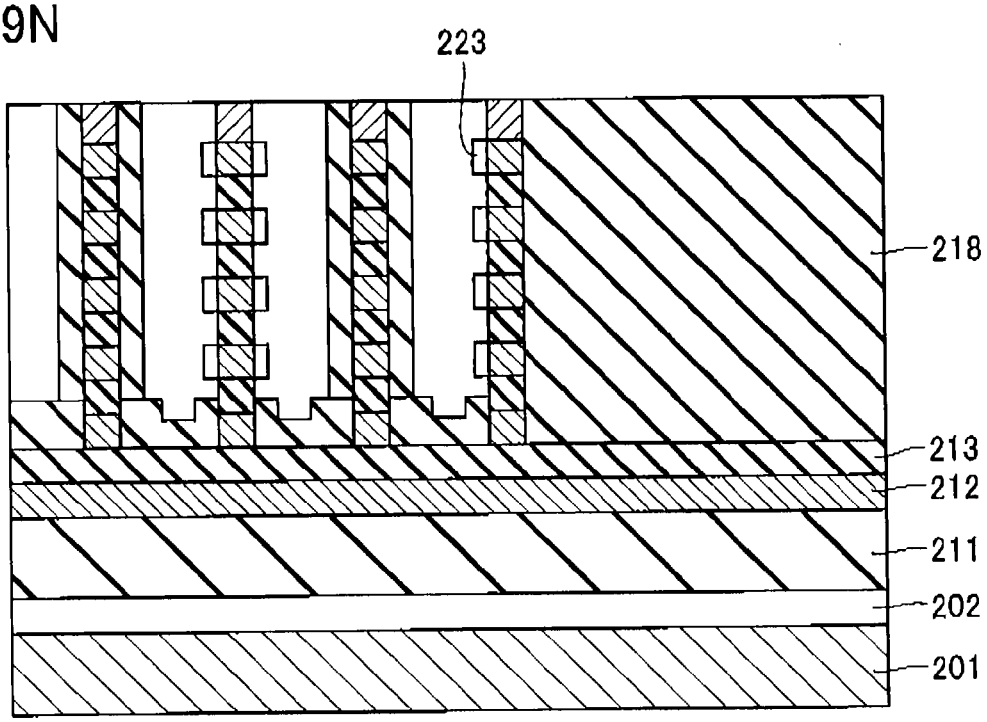
FIG. 9N is a cross-sectional view showing the step of forming the same semiconductor memory device in order of process.
Figure 9O:
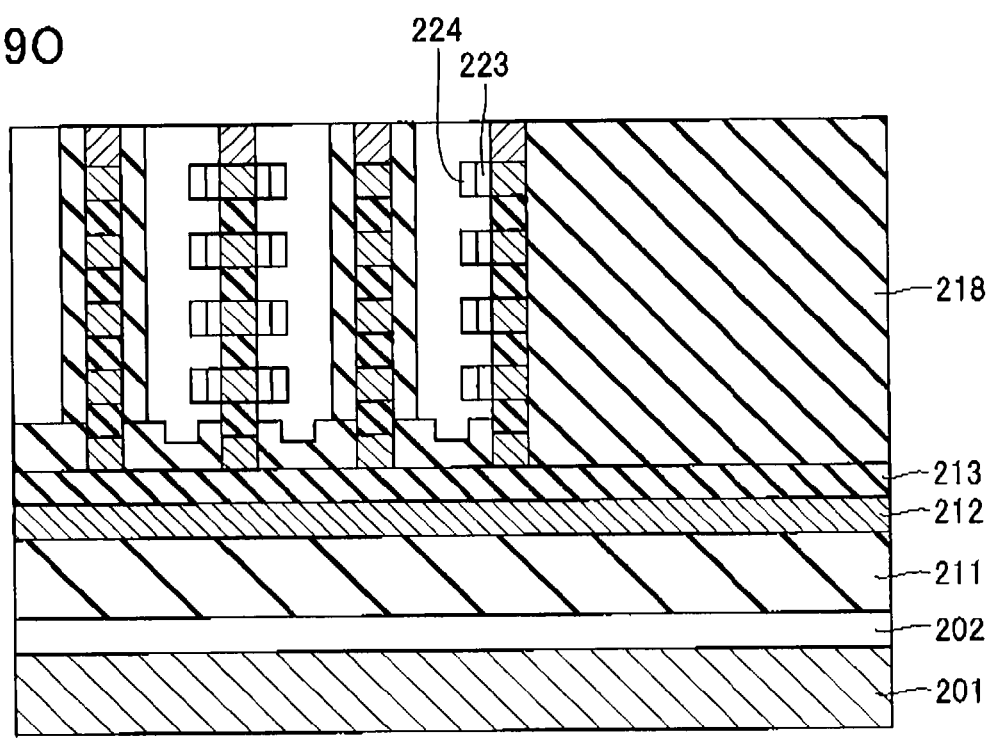
FIG. 9O is a cross-sectional view showing the step of forming the same semiconductor memory device in order of process.
Figure 9P:
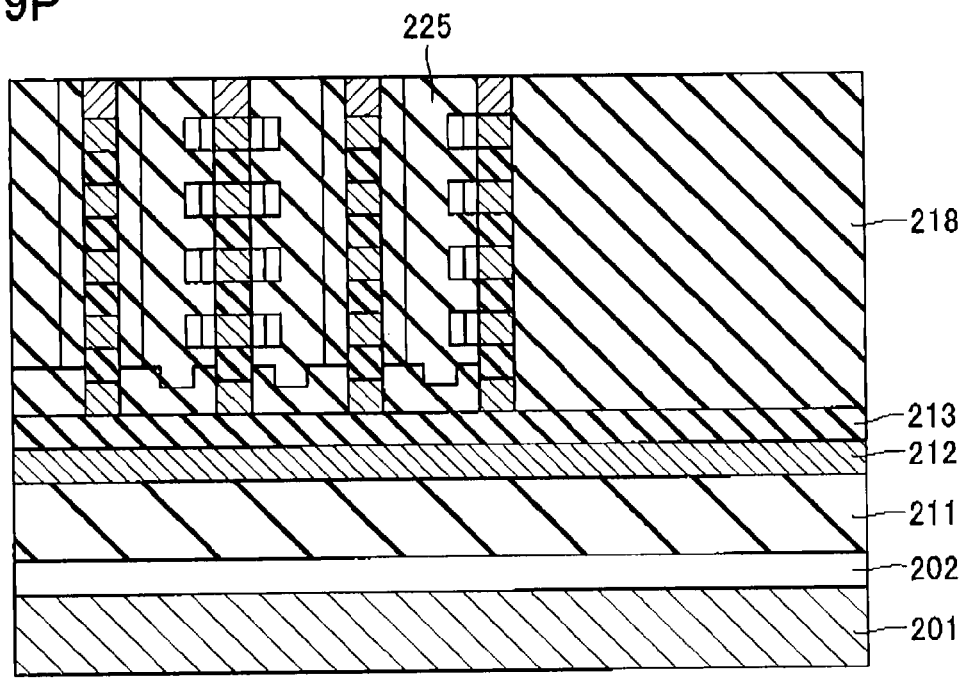
FIG. 9P is a cross-sectional view showing the step of forming the same semiconductor memory device in order of process.
Figure 9Q:
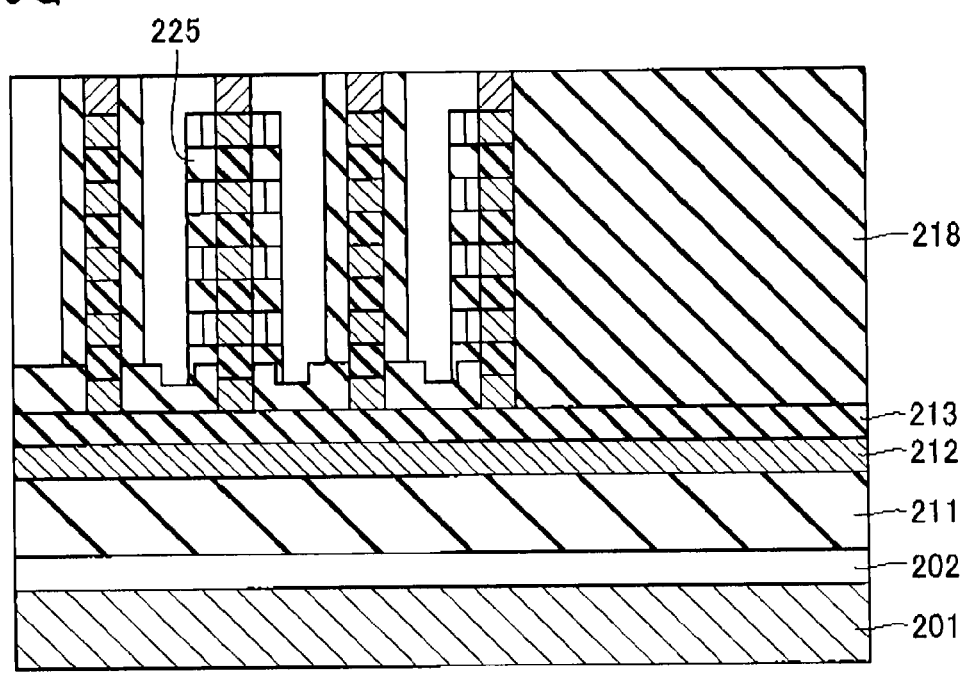
FIG. 9Q is a cross-sectional view showing the step of forming the same semiconductor memory device in order of process.
Figure 9R:
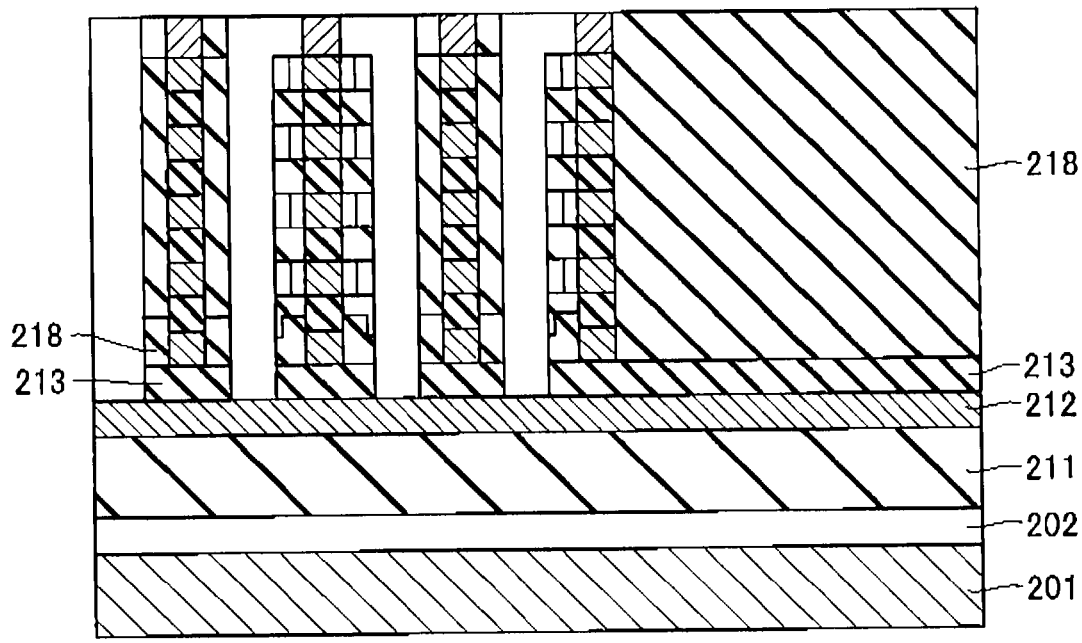
FIG. 9R is a cross-sectional view showing the step of forming the same semiconductor memory device in order of process.
Figure 9S:
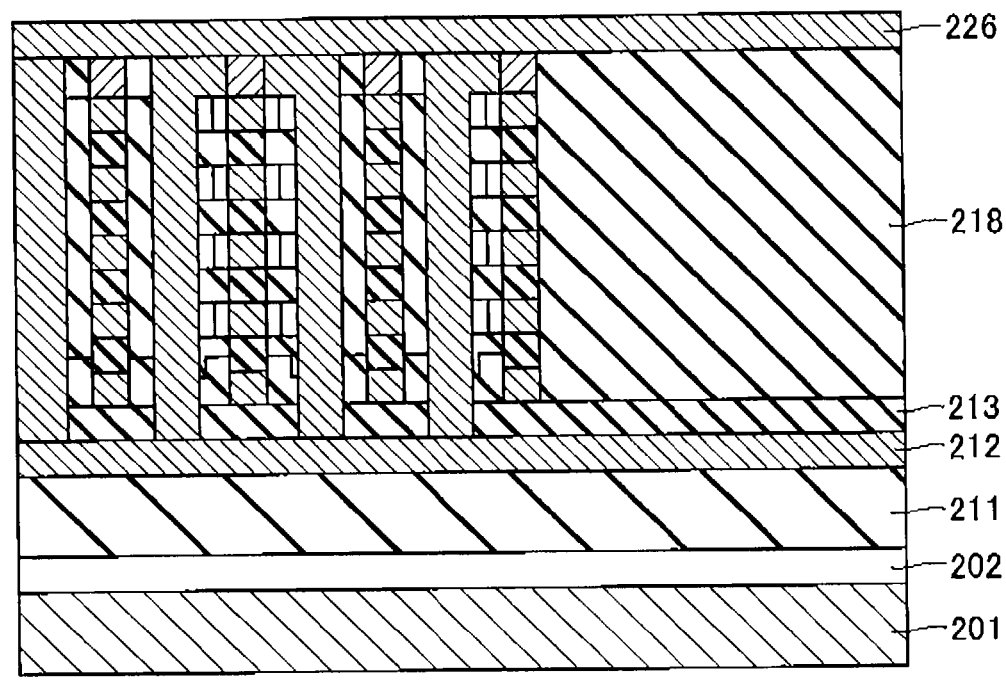
FIG. 9S is a cross-sectional view showing the step of forming the same semiconductor memory device in order of process.
Figure 9T:
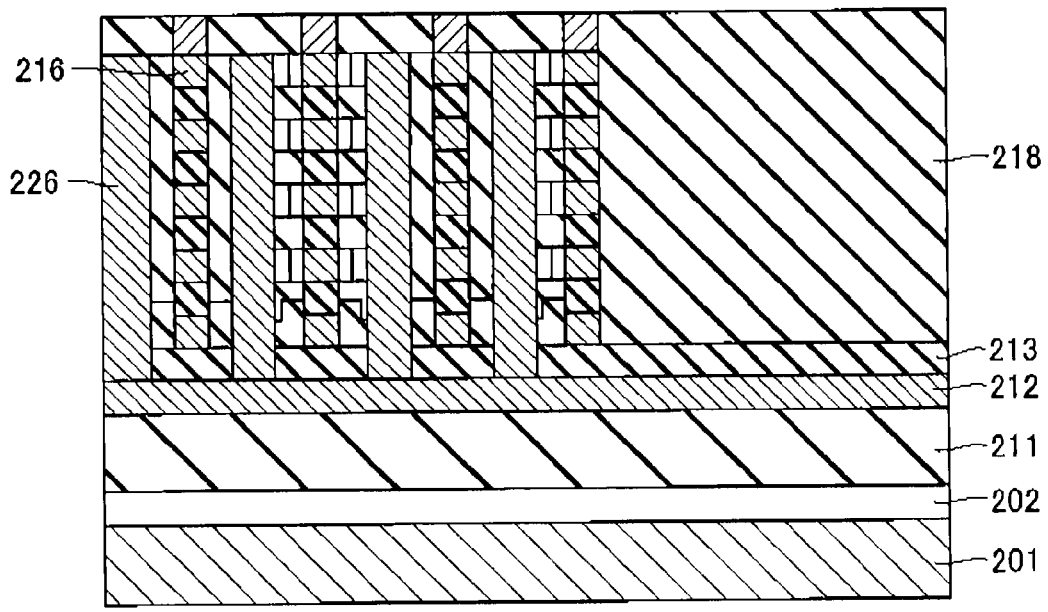
FIG. 9T is a cross-sectional view showing the step of forming the same semiconductor memory device in order of process.
Figure 9U:
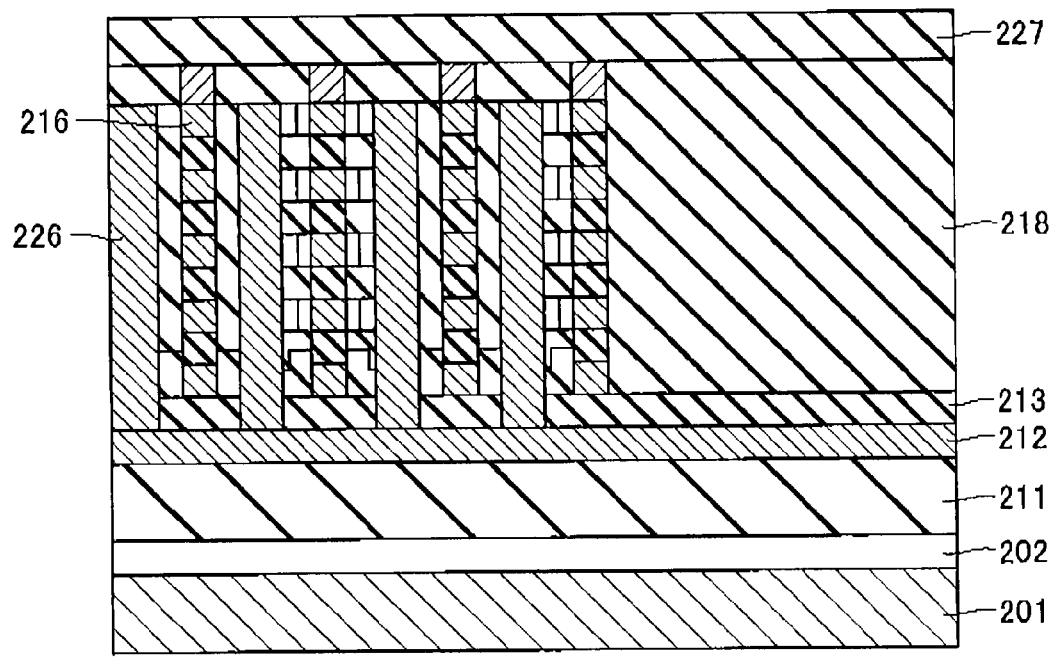
FIG. 9U is a cross-sectional view showing the step of forming the same semiconductor memory device in order of process.

FIGS. 9A-9U are cross-sectional views showing the steps of forming the semiconductor memory device according to the present embodiment in order of process.

A 720-μm thick Si substrate 201 is provided and, on one side thereof, a desired CMOS circuit 202 is formed as the groundwork using normal CMOS processes. The CMOS circuit 202 includes normal MOSFETs and multilayered lines as well as connection lines to the memory cell array. In the steps for the CMOS circuit 202, the processes for combining NOR-type flash memories are used to form the structure containing the read FET having gates in two layers and part of the read word line and part of the bit line.

First, as shown in FIG. 9A, a CVD method using TEOS as a main material is applied to form on the substrate an insulator film 211 composed of $SiO_2$ with a thickness of 300 nm. Although not shown in figure, the connecting portion between the CMOS circuit 202 and the bit line is processed at this stage. Subsequently, a LPCVD method using silane as a main material with an additive of $B_2H_6$ is applied to form a boron-doped amorphous silicon film 212 with a thickness of 20 nm. In addition, an imprint lithography technology is used to form a resist pattern with a line width of 20 nm at pitches of 60 nm aligned in the direction normal to the page, and then a reactive ion etching using HBr and $O_2$ gases is applied to pattern the amorphous silicon film 212.

Subsequently, as shown in FIG. 9B, a CVD method using TEOS as a main material is applied to form an insulator film 213 composed of $SiO_2$ with a thickness of 30 nm. The surface of the insulator film 213 is touch-up polished using a CMP method to planarize the surface.

Subsequently, as shown in FIG. 9C, a LPCVD method using silane as a main material with an additive of $PH_3$ is applied to form a phosphorous-doped amorphous silicon film 214 with a thickness of 20 nm.

Subsequently, as shown in FIG. 9D, the preceding steps are repeated to form insulator films 215 composed of $SiO_2$ with a thickness of 30 nm and phosphorous-doped amorphous silicon films 216 with a thickness of 20 nm alternately in a desired number of layers.

Subsequently, as shown in FIG. 9E, a LPCVD method using dichlorosilane and ammonia as main materials is applied to form a $Si_3N_4$ film 217 with a thickness of 50 nm.

Subsequently, an imprint lithography technology is used to form a resist pattern with a line width of 20 nm at pitches of 80 nm. Then, as shown in FIG. 9F, with a mask of the resultant resist pattern, a reactive ion etching using $CHF_3$, $CF_4$ and $O_2$ gases is applied to pattern the $Si_3N_4$ film 217, and then the resist is peeled off. Thereafter, a reactive ion etching using HBr and $O_2$ gases is applied to pattern the amorphous silicon films 214, 216, and a reactive ion etching using $CHF_3$ and CO gases is applied to pattern the $SiO_2$ film 215 in turn.

Subsequently, as shown in FIG. 9G, a low-viscosity, spin-coatable silicon oxide (SOG) film 218 is formed and calcined. The low-viscosity material can be used as buried in a high-aspect ratio pattern to the bottom.

Subsequently, as shown in FIG. 9H, an imprint lithography technology is used to form a resist pattern with a line width of 20 nm at pitches of 60 nm aligned in the direction normal to the page in the cell array portion. This pattern is formed to reside in other regions than the cell array portion. With a mask of the resist pattern, a reactive ion etching using $CHF_3$ and CO gases is applied to remove the silicon oxide (SOG) film 218 and, through etching time adjustment, finish it in the state with about 30 nm left on the bottom of the cell array portion. The amorphous silicon 214 covered with this residual film finally serves as the read word lines.

Subsequently, as shown in FIG. 9I, a LPCVD method using TEOS as a main material is applied to form an insulator film 219 composed of $SiO_2$ with a thickness of 15 nm. Then, a reactive ion etching using $CHF_3$ and CO gases is applied to etch back the entire surface of the $SiO_2$ film 219. The reactive ion etching is an etching excellent in directionality and accordingly proceeds in the direction normal to the top surface but hardly proceeds toward the side wall. Accordingly, as shown in FIG. 9J, the SiO₂ film 219 is shaped to reside only on the side wall.

Subsequently, as shown in FIG. 9K, a lithography step using 2-layered resists (an upper layer resist 220 and a lower layer resist 221) is applied to form a resist pattern with exposed portions for storage element formation. This lithography step can achieve the purpose if the portions not used in storage element formation are covered with the resist. Accordingly, dimensional accuracy and positional accuracy may be both relatively loose. Then, as shown in FIG. 9L, a HF vapor process is applied to remove the SiO₂ film 219 not covered with the resist. At this time, part of the silicon oxide (SOG) film 218 on the bottom is removed at the same time without causing any trouble.

Subsequently, as shown in FIG. 9M, a process of electroless plating is used to form a Ni film 222 with a thickness of 15 nm. The electroless plating solution may be adjusted to selectively plate the conductive portions such that the Ni film 222 can be formed only on the exposed portions of the amorphous silicon 216.

Subsequently, as shown in FIG. 9N, a heated oxygen plasma process is applied to oxidize the Ni film 222 to form a NiO film 223 that serves as the variable resistive element. Then, as shown in FIG. 9O, a process of electroless plating is used to form a Ti film with a thickness of 5 nm over the NiO film 223, and then a nitrogen plasma process is applied to form a TiN film 224.

Subsequently, as shown in FIG. 9P, a spin-coatable silicon oxide (SOG) film 225 is formed using a low-viscosity raw material and, while it is in the non-calcined state, extra parts are removed from the upper surface by a CMP method. Subsequently, as shown in FIG. 9Q, a reactive ion etching using O₂ with a slight additive of CHF₃ is applied to each back the entire surface to remove the silicon oxide (SOG) film 225 from the apertures. The non-calcined silicon oxide (SOG) film 225 has a higher etching rate and accordingly other parts can not be etched. After etching, the silicon oxide (SOG) film 225 is calcined.

Subsequently, as shown in FIG. 9R, a reactive ion etching using CHF₃ and CO gases is applied to etch the SiO₂ film 218 left on the aperture bottoms and the SiO₂ film 213 to form apertures down to the amorphous silicon film 212. Under this etching condition, the Si₃N₄ film, the TiN film, and the NiO film have smaller etching rates and accordingly they can not be etched greatly. Subsequently, as shown in FIG. 9S, a LPCVD method using silane as a main material with an additive of R₂H₆ is applied to form a boron-doped amorphous silicon film 226. The amorphous silicon has an excellent property of burial in trenches. Accordingly, it can be completely buried in the trenches such that the upper surface is formed in a flat film shape.

Subsequently, as shown in FIG. 9T, a reactive ion etching using HBr and O₂ gases is applied to etch back the entire surface of the amorphous silicon film 226 and, through terminal detection and etching time adjustment, remove the amorphous silicon film 226 to a slightly deeper point than the uppermost portion of the amorphous silicon film 216. Then, as shown in FIG. 9U, a CVD method using TEOS as a main material is applied to form an insulator film 227 composed of SiO₂ with a thickness of 100 nm. Further, heating is executed within oxygen ambient under extremely low pressure for crystallizing the amorphous silicon films 212, 214, 216, 226 to polysilicon and activating impurity boron and phosphorous. Although not shown in figure, the connecting portions between the films 214 and 216, now poly-crystallized to lines, and the CMOS circuit 202 are processed to open contact-holes therethrough to form lines connecting between desired contact-holes. After line formation, an interlayer insulator is formed again. At last, the films 212, 226 serve as the bit lines and the films 214, 216 as the word lines (read word lines).

Finally, the so-called passivation film is formed, followed by forming the I/O portions or the line connecting portions, and then executing the so-called post process such as checking and dicing to complete the semiconductor memory device.

In the present embodiment, NiO is used as the variable resistive element for use in memory operation though other materials such as TiO₂, SrZrO₃, ZnMn₂O₁ and Pr₀.₇Ca₀.₃MnO₃ may be used as well. Further, TiN is used as the electrode for making contact with the variable resistive member though other materials such as Pt, W, WN, Ta, TaN and Nb-doped TiO₂ may be used as well.

Third Embodiment

Configuration of Present Embodiment

Figure 10A:
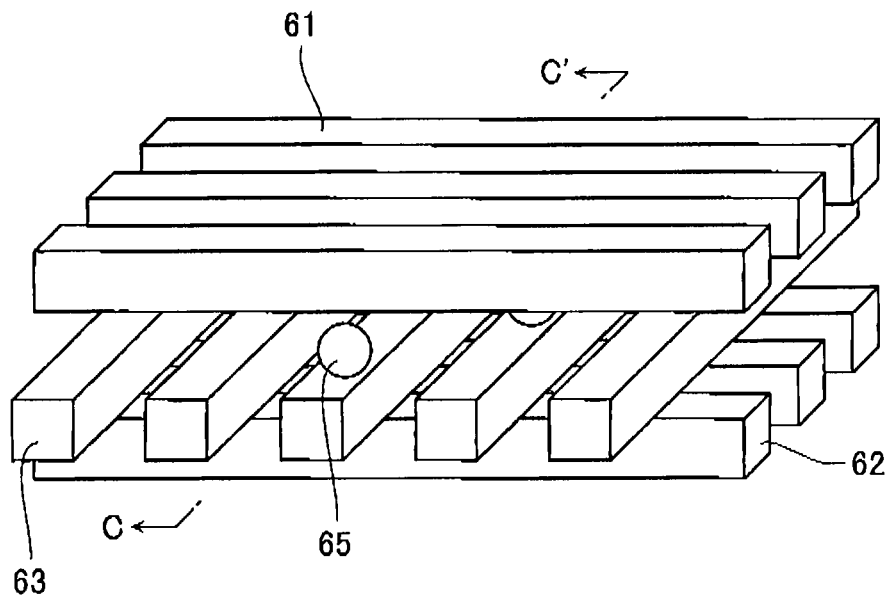
FIG. 10A is a perspective view showing part of a semiconductor memory device according to a third embodiment of the present invention.
Figure 10B:
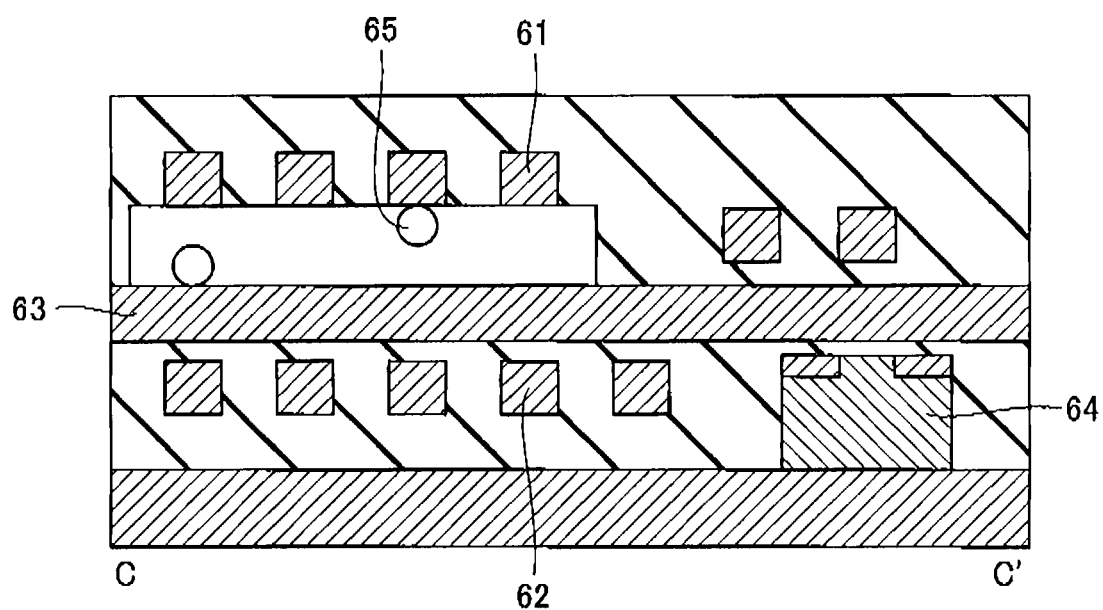
FIG. 10B is a cross-sectional view showing part of the same semiconductor memory device.

FIGS. 10A and 10B are a perspective view and a cross-sectional view showing part of a memory cell array in a semiconductor memory device according to a third embodiment of the present invention.

A memory cell portion includes a plurality of word lines 61, a plurality of bit lines 63 intersecting the word lines 61, and inter-electrode movable particulates 65 arranged in gaps at intersections of the word lines 61 and the bit lines 63. It also includes a plurality of read word lines 62 extending in parallel with the word lines 61 with the bit lines 63 sandwiched therebetween. It further includes a read FET 64 having gates in two upper and lower layers. A read word line 62, which is part of plural read word lines 62 and opposes the read FET 64 with the bit line 63 sandwiched therebetween, configures the upper layer gate of the read FET 64. A portion of each bit line 63, which is the portion locates in the vicinity of the read FET 64, configures the lower layer gate of the read FET 64.

Also in the case of this structure, like in the first embodiment, the word lines 61 and the bit lines 63 have simple line-and-space patterns. Thus, the word lines 61 and the bit lines 63 are sufficient if they have orthogonal positional relations therebetween. Accordingly, it is not required to consider misalignments along the word line 61 and along the bit line 63. Therefore, the later-described production steps can be executed with extremely loose alignment accuracy within the memory cell array, which makes productions easier.

Operational Principle of Present Embodiment

First, the operational principle of reading in the present embodiment is described.

A particle 65 having a radius a on electrodes (the word line 61 and the bit line 63) carries a charge q. When the particle 65 is placed within an electric field E caused by a voltage applied across the electrodes, the particle 65 experiences the force exerted from the electric field to the charge and additionally experiences the forces exerted from the image charge induced on the electrode and the image dipole. In addition, a resultant force F of these can be given by the following expression (1) if the electrode is approximated infinitely wide.

[Expression 1]

$$F = qE - \frac{q^2}{4\pi\varepsilon_0(2a)^2} - \frac{\pi\varepsilon_0}{24}\left(\frac{\varepsilon_r - 1}{\varepsilon_r + 2}\right)^2 (2a)^2 E^2 \quad (1)$$

In the above expression, $\varepsilon_0$ denotes the dielectric constant of vacuum (about $8.85\times10^{-12}$ F/m), and $\varepsilon_r$ a relative dielectric constant of the particle.

If the gap is in the atmosphere, strictly, a correction to the dielectric constant is required though the difference is extremely small and can be neglected. Thus, the expression (1) can be used as it is. The charge q is always an integer multiple of the elementary charge e (about $1.6\times10^{-19}$ C) and thus can be represented by q=ne. The electric field E can be approximated by E=V/d where V denotes the potential difference between opposite electrodes, and d denotes the gap.

On the other hand, the capacitance C of the particle 65 is given by $C=4\pi\varepsilon_0 a$, and the charging energy is given by $(\frac{1}{2})q^2/C = n^2e^2/8\pi\varepsilon_0 a$. Only an electron (or hole) having higher energy than this energy can migrate toward the particle 65. This is a phenomenon called the coulomb barrier. Therefore, only when the potential difference V satisfies $eV > n^2e^2/8\pi\varepsilon_0 a$, an n-th electron (or hole) can migrate toward the particle 65.

A particle disengaged from the electrode is accelerated and reaches the opposite electrode and releases the charge at that place. In addition, it newly receives the charge of the opposite sign. Then, it is disengaged again and reaches the original electrode. Such the processes are repeated. This series of the processes carry the charge, which can be detected as current between electrodes accordingly. As described above, when these processes always occur at n=1, a constant current flows and makes it possible to easily detect the presence/absence of a particle. Further, if there are two particles between the same electrodes, the carriers that carry the charge are doubled and additionally the distance of migration can be made shorter. Therefore, it is possible to detect double or more current and detect the presence of two particles definitely.

Specifically, if the radius a of the particle is 10 nm, and the gap d between electrodes is 60 nm, the disengagement and reciprocation of the particle at the above-described state of n=1 occur within a range from 0.22 V to 0.29 V of the inter-electrode voltage V. The inter-electrode voltage V is set at 0.28 V. The upper electrode for selecting from among the intersections is supplied with +0.14 V corresponding to V/2 while the lower electrode for selecting from among the intersections is supplied with −0.14 V corresponding to −V/2. Other electrodes are set at 0 V. In this case, the force exerted on the particle present at the selected intersection immediately after disengagement is about 0.2 pN, and the time required for one way motion is estimated about 40 ns. One electron is carried at every one way motion of one particle. Accordingly, a current of about 4 pA is detected as can be found. Therefore, measurement of this current allows detection of the presence/absence (number) of particles present at the intersection of the upper and lower electrodes.

The present embodiment differs from the prior art in detection of current flowing in a memory cell.

Initially, the bit line 63 is connected to the ground line (0 V) to bring the bit line 63 to the ground potential (0 V), thereby releasing the charge stored on the bit line 63. Subsequently, after the bit line 63 is opened to the floating state, the read word line 62 corresponding to the current detection target memory cell (hereinafter referred to as "selected memory cell") is supplied with a certain read voltage $V_{T1}$, thereby bringing the portion on the bit line 63 in the vicinity of the selected memory cell into the charge storable state. Then, the word line 61 corresponding to the current detection target selected memory cell is supplied with a certain voltage $-V_R$, which is held for a certain period of time $T_R$. At this time, if particulates 65 are present in the selected memory cell, current in proportion to the number of the particulates flows and accordingly electrons can be stored in the portion on the bit line 63 in the vicinity of the selected memory cell. Unless particulates 65 are present in the selected memory cell, no current flows and accordingly no electron can be stored. When $I_P$ denotes the magnitude of current flowing in accordance with the presence of particulates, and e denotes the elementary charge, the number of stored electrons can be given by $I_P \times T_R/e$. After certain charge is stored, the voltage on the word line 61 is restored to the ground voltage (0 V) and the voltage on the read word line 62 is kept at the voltage $V_{T1}$.

Thus, the stored electrons can be transferred to the read FET 64 and converted into an electric signal available in normal CMOS circuits, of which operational principle is similar to that in the first embodiment.

The present embodiment makes it possible to greatly improve the sensitivity on sensing data from the memory cell at the time of read. In a word, in the method of the prior art, electrons carried by the particulates 65 are stored spread over the entire bit line 63. Therefore, if there are N electrons, the variation in voltage on the bit line 63 can be given by (N×e)/$C_B$ where $C_B$ denotes the capacitance of the bit line 63. In accordance with the ITRS 2007 table, the capacitance on the line of the line width 20-22 nm generation is estimated at 1.5-1.8 pF per cm. Accordingly, when the bit line 63 has a length of 10 μm, $C_B$ is around $1.5$-$1.8\times10^{-15}$ F. Therefore, a variation of 0.02 V or more in potential on the bit line 63 requires about 200 or more electrons to be stored and additionally requires amplification and detection of such the slight variation in potential on the bit line 63.

In contrast, it is sufficient in the present embodiment if there are almost the same electrons in number as the number of electrons required for charging the gate of the read FET 64. Therefore, in the 20-22 nm generation, it is sufficient if there are around 50 electrons. In addition, the output signal from the read FET 64 can be used directly as the input signal to the CMOS circuit at the rear stage. In this case, if the current $I_P$ caused by the particulates 65 is 8 pA, an energizing time $T_R$ of 1 μs is sufficient to obtain 50 electrons in number. It does not depend on the capacitance on the bit line 63 and accordingly an elongated bit line 63 does not lower the read sensitivity. Thus, a larger scale memory cell array can be achieved easily.

In addition, the present embodiment makes it possible to exert the same effect as that in the first embodiment.

The following description is given to the operational principles of write/erase operations in the memory cell portion.

In the present embodiment, one intersection configures one memory cell and stores that the relevant bit is "0" or "1" based on information about whether the number of particles present at the relevant intersection is larger or smaller than a certain value. The relation between the large/small of the number of particles and the corresponding relation between the bit value "0" and "1" have arbitrariness and it is possible to select either. In this example, the bit value "0" corresponds to the case where the number of particles is smaller than a certain value and the bit value "1" to the case where it is larger. As described above, the number of particles present at the intersection definitely corresponds to the current flowing in the intersection. Accordingly, this information can be read by applying the above-described read mode voltage and comparing the current flowing in the intersection with a certain reference value.

Referring to the circuit shown in FIG. 1, writing is described below. Outside the last row in the memory cell array 41, a particle storage section is formed, from which, first, particles are taken in by applying a certain voltage to intersections corresponding to a data row scheduled to be written into the first row in the memory cells among the intersections on the last row (the n-th row) in the memory cells.

Specifically, while the row decoder 42 selects only the last row (the n-th row), the column decoder 44 selects only columns scheduled to write the bit value "1" to the first row to form the contents of the first row on the last row (the n-th row). Next, while keeping the state selected by the column decoder 44, the row decoder 42 operates to turn off the selection of the last row (the n-th row) and select the (n−1)th row.

As described above, all the particles may not migrate completely from the n-th row to the (n−1)th row in one operation depending on the case. Therefore, in this state, currents in the columns are detected to read out the contents of the (n−1)th row. If a desired state is reached, the selection of the (n−1)th row is still kept on and the n-th row is also turned on. Then, after 1 clock cycle or more elapsed, the selection of the n-th row is turned off and the contents of data on the (n−1)th row are confirmed again. Such the series of operations are repeated until the contents of the (n−1)th row reach a desired state. When the selection of the n-th row is turned on, the selection of the (n−1)th row may also be kept on unchanged, thereby preventing the particles from returning from the (n−1)th row to the n-th row and allowing the particles left on the n-th row to swing between upper and lower positions.

Then, while the state selected by the column decoder 44 is retained, the row decoder 42 similarly operates to shift the contents on the (n−1)th row to the (n−2)th row.

Such the operations can be repeated to set the contents on the 1st row to a desired state. Similarly, a data row scheduled to be written in the 2nd row is shifted from the n-th row in turn and transferred to the 3rd row. Before it is finally shifted to the 2nd row, operation is performed such that the selection of the 1st row is turned on first and, in this state, the selection of the 2nd row is turned on. As a result, it is made possible to prevent the particles present on the 1st row from returning to the 2nd row and shift the particles on the 3rd row to the 2nd row.

Thereafter, write to the 3rd row is executed similarly. In this case, during the last shift from the 4th row to the 3rd row, the selection of the 1st row and the 2nd row may be kept on unchanged. During the shift from the n-th row to the 4th row, the selection of the 1st row and the 2nd row may be turned off. In this case, protection of written data requires both to be turned off and on again concurrently. Thereafter, write to the 4th row, write to the 5th row, and write to the n-th row are executed similarly to set all data in the memory cells to a desired state. In the present memory cells, erasing is also executed by shifting particulates 65 and accordingly the operational principle is same as that in writing.

Method of Production in Present Embodiment

Figure 11A:
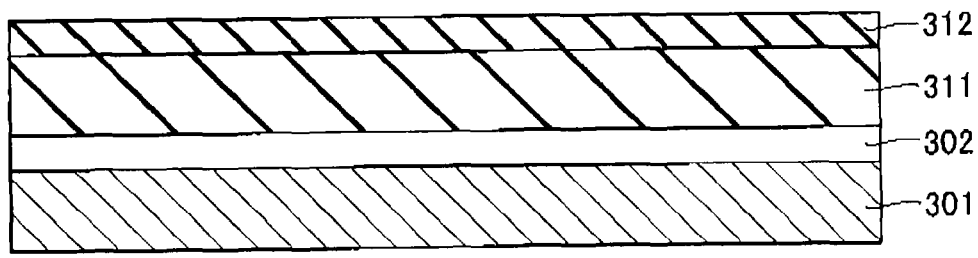
FIG. 11A is a cross-sectional view showing the step of forming the semiconductor memory device according to the third embodiment of the present invention in order of process.
Figure 11B:
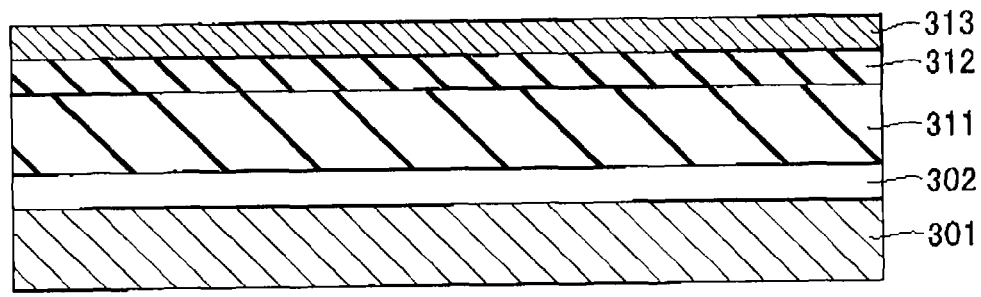
FIG. 11B is a cross-sectional view showing the step of forming the same semiconductor memory device in order of process.
Figure 11C:
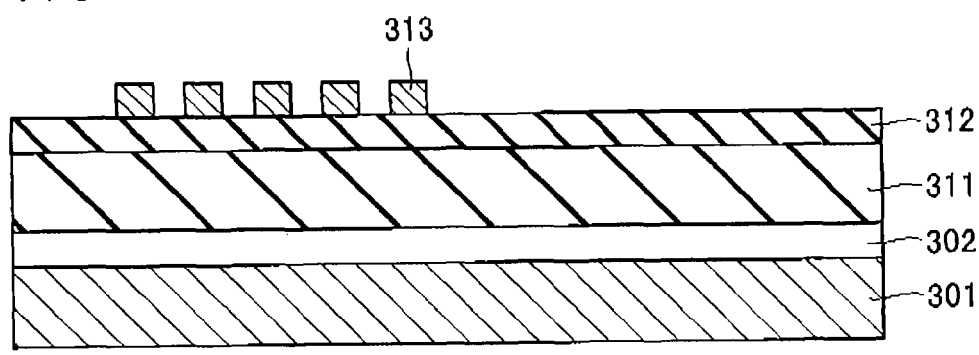
FIG. 11C is a cross-sectional view showing the step of forming the same semiconductor memory device in order of process.
Figure 11D:
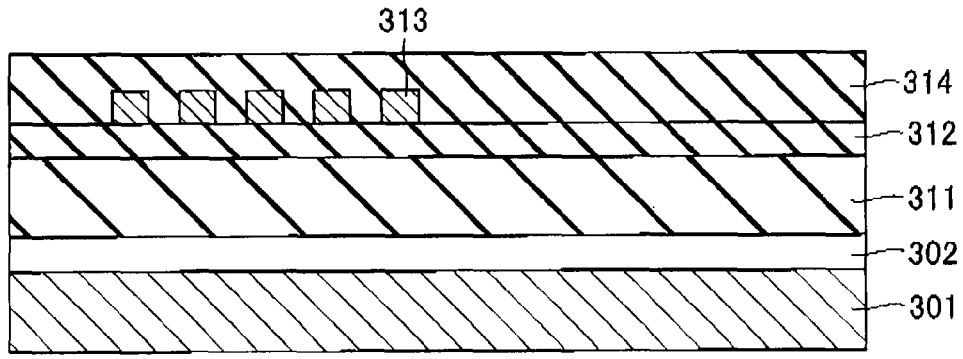
FIG. 11D is a cross-sectional view showing the step of forming the same semiconductor memory device in order of process.
Figure 11E:
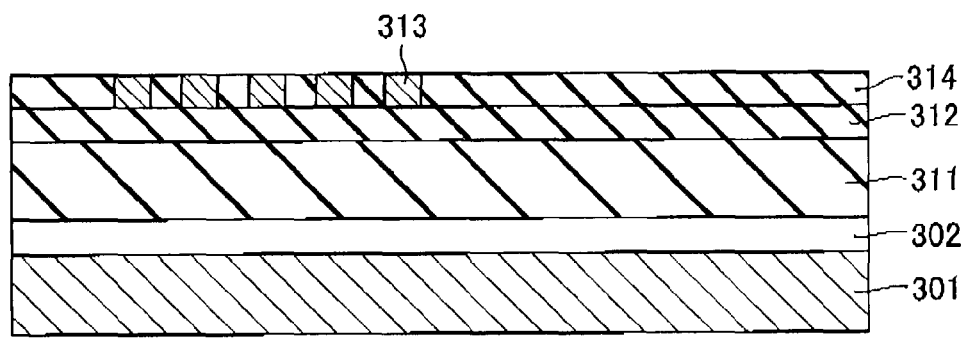
FIG. 11E is a cross-sectional view showing the step of forming the same semiconductor memory device in order of process.
Figure 11F:
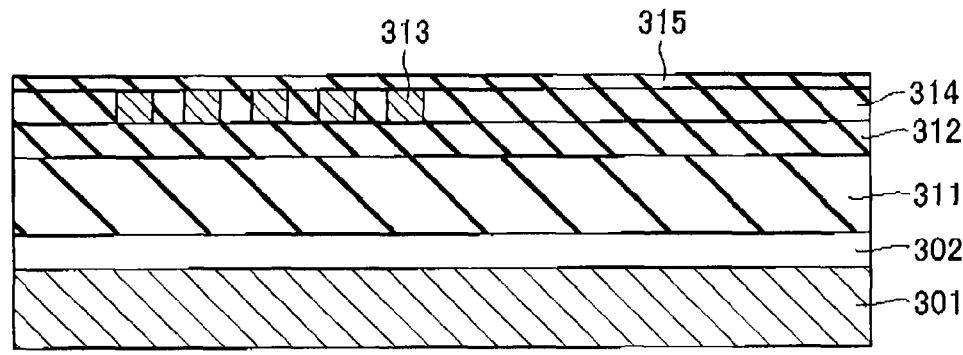
FIG. 11F is a cross-sectional view showing the step of forming the same semiconductor memory device in order of process.
Figure 11G:
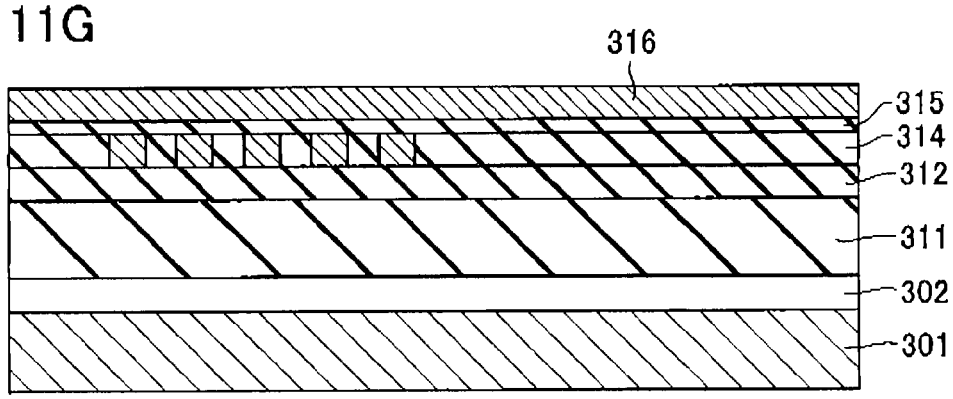
FIG. 11G is a cross-sectional view showing the step of forming the same semiconductor memory device in order of process.
Figure 11H:
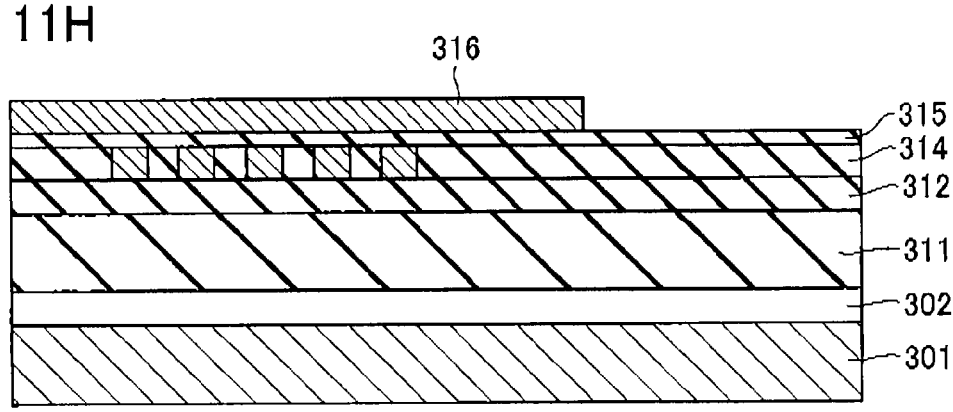
FIG. 11H is a cross-sectional view showing the step of forming the same semiconductor memory device in order of process.
Figure 11I:
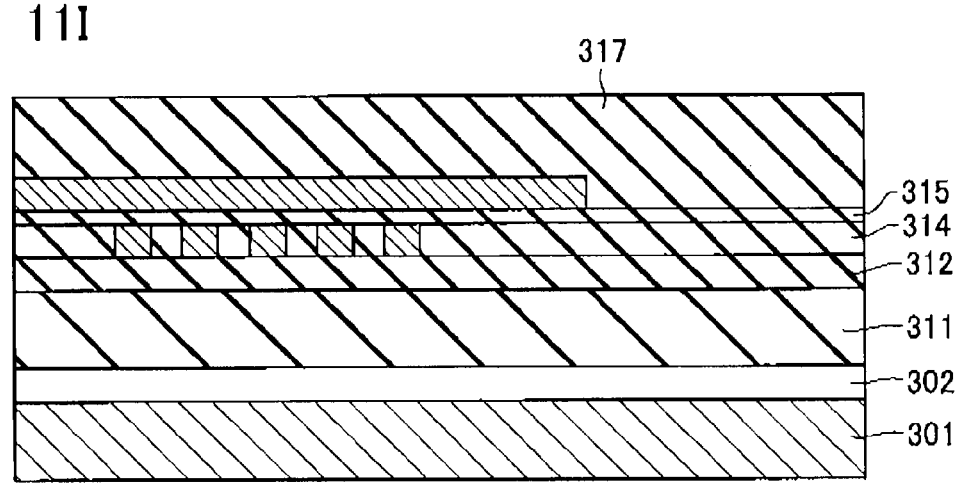
FIG. 11I is a cross-sectional view showing the step of forming the same semiconductor memory device in order of process.
Figure 11J:
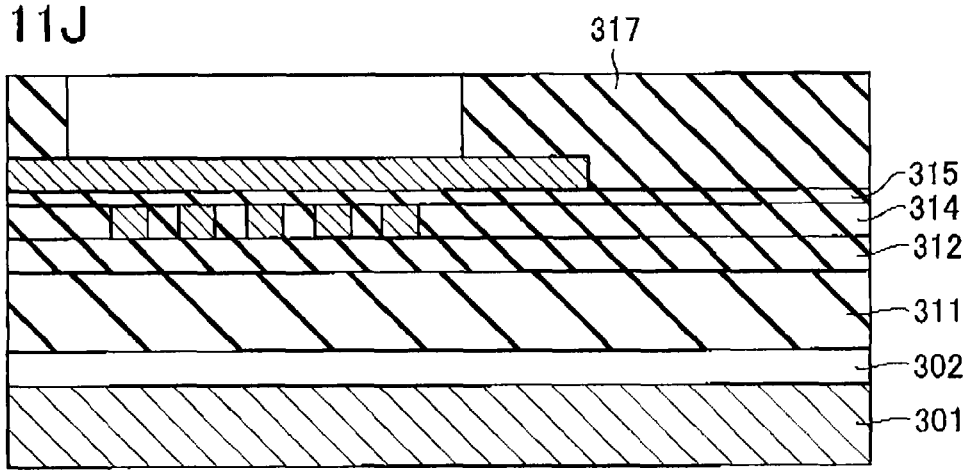
FIG. 11J is a cross-sectional view showing the step of forming the same semiconductor memory device in order of process.
Figure 11K:
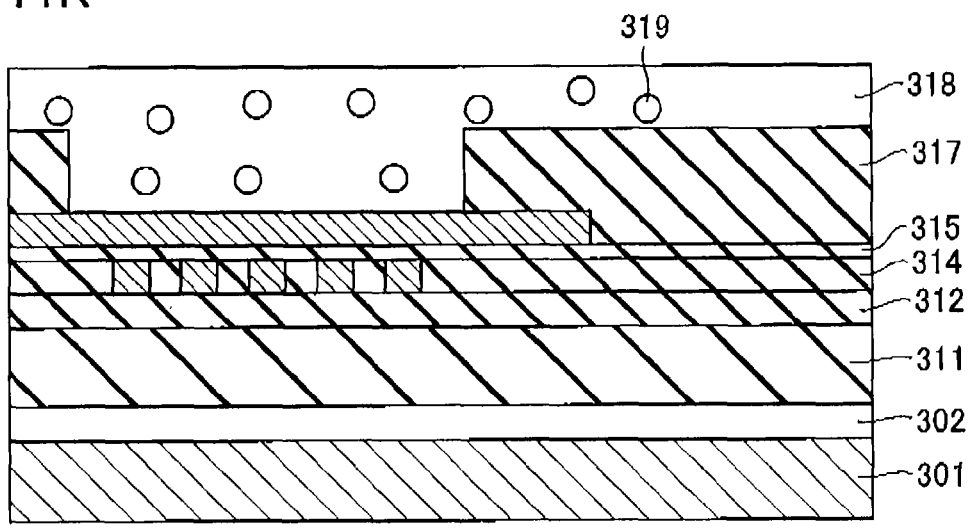
FIG. 11K is a cross-sectional view showing the step of forming the same semiconductor memory device in order of process.
Figure 11L:
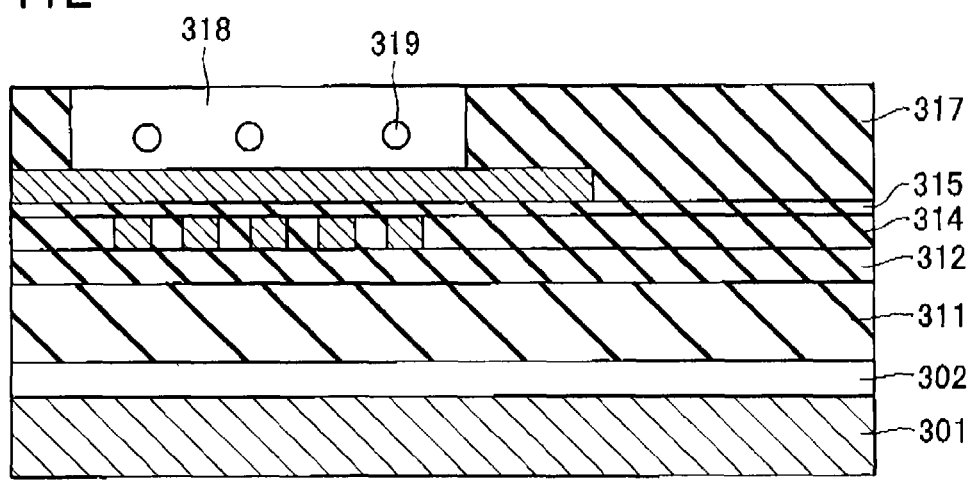
FIG. 11L is a cross-sectional view showing the step of forming the same semiconductor memory device in order of process.
Figure 11M:
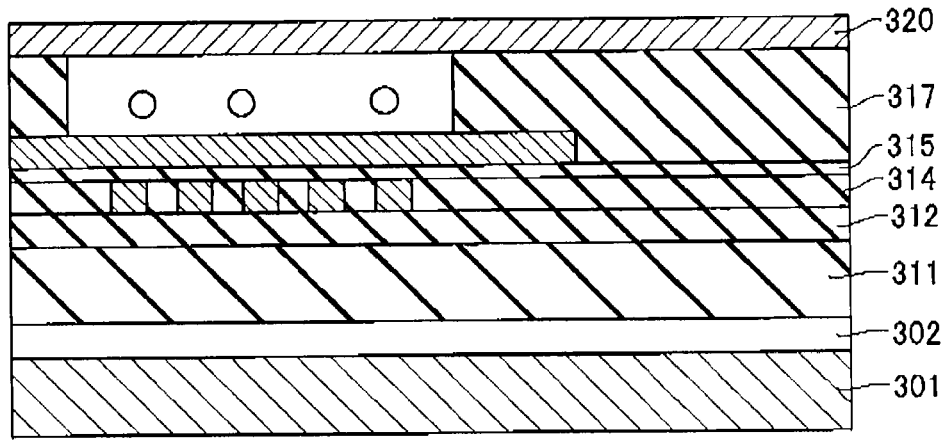
FIG. 11M is a cross-sectional view showing the step of forming the same semiconductor memory device in order of process.
Figure 11N:
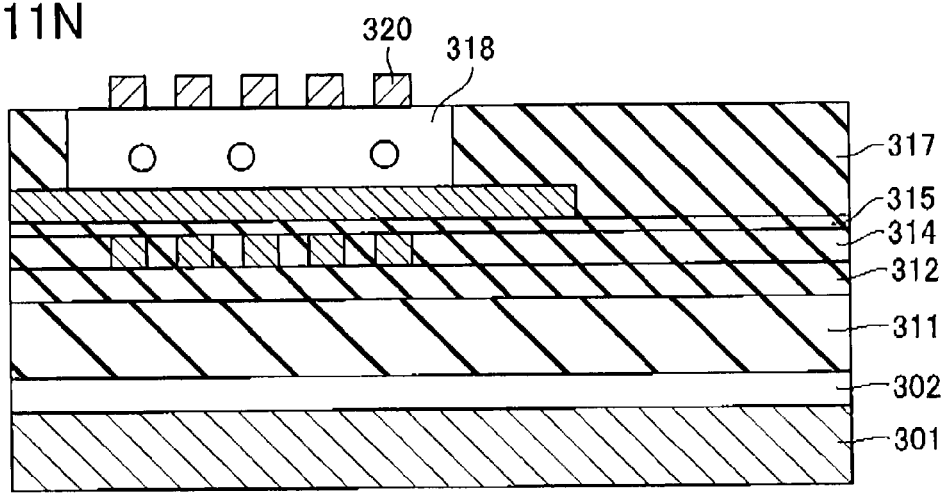
FIG. 11N is a cross-sectional view showing the step of forming the same semiconductor memory device in order of process.
Figure 11O:
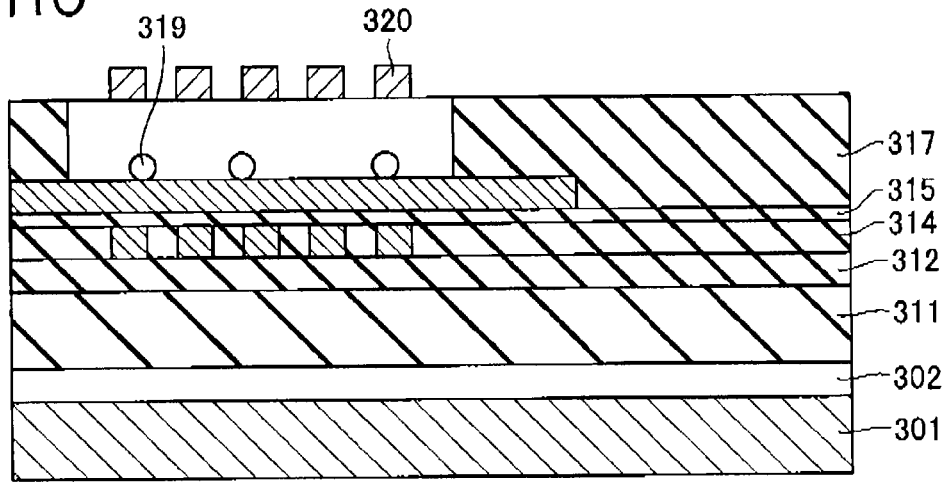
FIG. 11O is a cross-sectional view showing the step of forming the same semiconductor memory device in order of process.
Figure 11P:
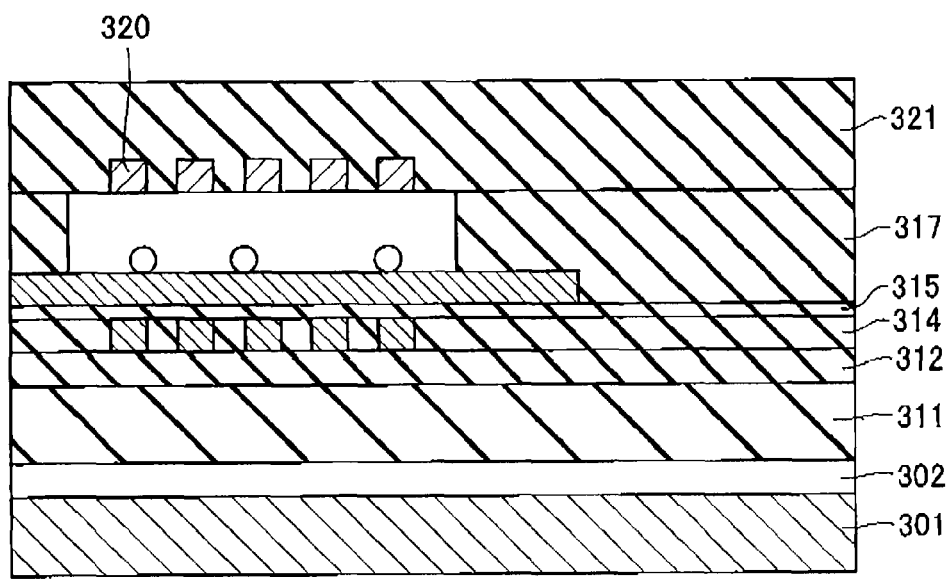
FIG. 11P is a cross-sectional view showing the step of forming the same semiconductor memory device in order of process.

FIGS. 11A-11P are cross-sectional views showing the steps of forming the semiconductor memory device according to the third embodiment in order of process.

A 720-µm thick Si substrate 301 is provided and, on one side thereof, a desired CMOS circuit 302 is formed as the groundwork using normal CMOS processes. The CMOS circuit 302 includes normal MOSFETs and multilayered lines as well as connection lines to the memory cell array. In the steps for the CMOS circuit 302, the processes for combining NOR-type flash memories are used to form the structure containing the read FET having gates in two layers and part of the read word line and part of the bit line.

First, as shown in FIG. 11A, a CVD method using TEOS as a main material is applied to form on the substrate an insulator film 311 composed of $SiO_2$ with a thickness of 300 nm. Subsequently, a LPCVD method using dichlorosilane and ammonia as main materials is applied to form a $Si_3N_4$ film 312 with a thickness of 15 nm. Although not shown in figure, the connecting portion between the CMOS circuit 302 and the read word line is processed at this stage.

Subsequently, as shown in FIG. 11B, a spattering method is applied to continuously form a composite film 313 including Ti with a film thickness of 5 nm and W with a film thickness of 15 nm. Then, as shown in FIG. 11C, an imprint lithography technology is used to form a resist pattern at pitches of 40 nm and then, with a mask of the resultant resist pattern, a reactive ion etching using $CHF_3$ and $SF_6$ gases is applied to pattern the composite film 313. The patterned composite film 313 finally serves as the read word lines. After completion of patterning, the resist is peeled off.

Subsequently, as shown in FIG. 11D, a CVD method using TEOS as a main material is applied again to form an insulator film 314 composed of $SiO_2$ with a thickness of 30 nm as buried in between patterns. Then, as shown in FIG. 11E, a CMP method is used to planarize the $SiO_2$ film 314 and expose the upper surface of the composite film 313.

Subsequently, as shown in FIG. 11F, a CVD method using TEOS as a main material is applied to form an insulator film 315 composed of $SiO_2$ with a thickness of 10 nm as an interlayer insulator film. Although not shown in figure, the connecting portion between the CMOS circuit 302 and the bit line is processed to open a contact-hole therethrough at this stage. Then, as shown in FIG. 11G, a LPCVD method using silane as a main material with an additive of $B_2H_6$ is applied to form a boron-doped amorphous silicon film 316 with a thickness of 20 nm.

Subsequently, an imprint lithography technology is used to form a resist pattern at pitches of 40 nm aligned in the direction normal to the page in the cell array portion. Also in undesired pattern portions in other regions than the cell array portion, pattern formation is executed so as not to leave the resist. With a mask of the resultant resist pattern, as shown in FIG. 11H, a reactive ion etching using HBr and $O_2$ gases is applied to pattern the amorphous silicon film 316. After etching, the resist is peeled off and then, as shown in FIG. 11I, a CVD method using TEOS as a main material is applied to form an insulator film 317 composed of $SiO_2$ with a thickness of 40 nm.

Subsequently, a normal photolithography technology is used to form a resist pattern having apertures in the cell array portion and then, with a mask of the resultant resist pattern, as shown in FIG. 11J, a reactive ion etching using $CHF_3$ and CO gases is applied to pattern the $SiO_2$ film 317. After completion of patterning, the resist is peeled off, and then heating is executed within oxygen ambient for crystallizing the amorphous silicon film 316 to polysilicon, activating impurity boron, and inactivating the matters adhered on the polysilicon surface.

Subsequently, as shown in FIG. 11K, a spin coating method is used to form a resin containing silica particulates 319 having a diameter of about 10 nm buried in a polyethylene oxide 318, which is filled in the cell array portion. Then, as shown in FIG. 11L, a CMP method is used to remove the polyethylene oxide 318 and the silica particulates 319 outside the cell array portion.

Subsequently, as shown in FIG. 11M, a spattering method is applied to continuously form a composite film 320 including Ti with a film thickness of 5 nm and W with a film thickness of 15 nm. Then, an imprint lithography technology is used to form a resist pattern at pitches of 40 nm. Next, as shown in FIG. 11N, with a mask of the resultant resist pattern, a reactive ion etching using $CHF_3$ and $SF_6$ gases is applied to pattern the composite film 320. The patterned composite film 320 finally serves as the word lines. After completion of patterning, the resist is peeled off. The polyethylene oxide 318 is partly etched at the same time, though causing no problem.

Subsequently, as shown in FIG. 11O, a process of heating at 180° C. is applied to thermally decompose the residual polyethylene oxide 318, vaporize/evaporate the decomposed product, and discharge it through the apertures formed by etching, thereby allowing the particulates 319 movable. Subsequently, as shown in FIG. 11P, by forming a spin coatable silicon oxide (SOG) film using a high-viscosity medium and utilizing the meniscus caused by the surface tension, a $SiO_2$ film 321 is formed over the composite film 320, leaving the lower space as a cavity that contains the particulates 319. Although not shown in figure, the connecting portions between the composite film 320 and the CMOS circuit 302 are processed to form contact-holes therethrough and form lines connecting between desired contact-holes. After line formation, an interlayer insulator film is formed again.

If the memory cell portion is formed in a multilayered structure, a desired structure can be obtained by repeating the above steps.

Finally, the so-called passivation film is formed, followed by forming the I/O portions or the line connecting portions, and then executing the so-called post process such as checking and dicing to complete the semiconductor memory device.

In the embodiment, an insulator composed of silicon oxide, that is, colloidal silica is used as the particle for use in memory operation though other inorganic oxides such as aluminum oxide and titanium oxide are also available, and organic matters such as polystyrene are also available. Theoretically, the particle is not required to be an insulator. Accordingly, it may be, for example, a metal particle of a conductor such as chrome, nickel, copper, gold, silver, titanium and aluminum; a particle composed of an alloy thereof; a carbon particle, typically fullerene; and a particle of a semiconductor such as silicon. The shape of the particle is not required to be spherical but may be polyhedral, elliptical and cylindrical.

The word lines and read word lines are not always required to be arranged orthogonal to the bit lines but may be related to each other in an intersecting arrangement. Further, the conditions such as the gap length between the first and second electrodes and the size of the particle may be changed appropriately in accordance with specs.

Fourth Embodiment

Configuration of Present Embodiment

A semiconductor memory device according to a fourth embodiment of the present invention is similar in configuration to the third embodiment except the structure of a memory cell portion as described below.

Figure 12A:
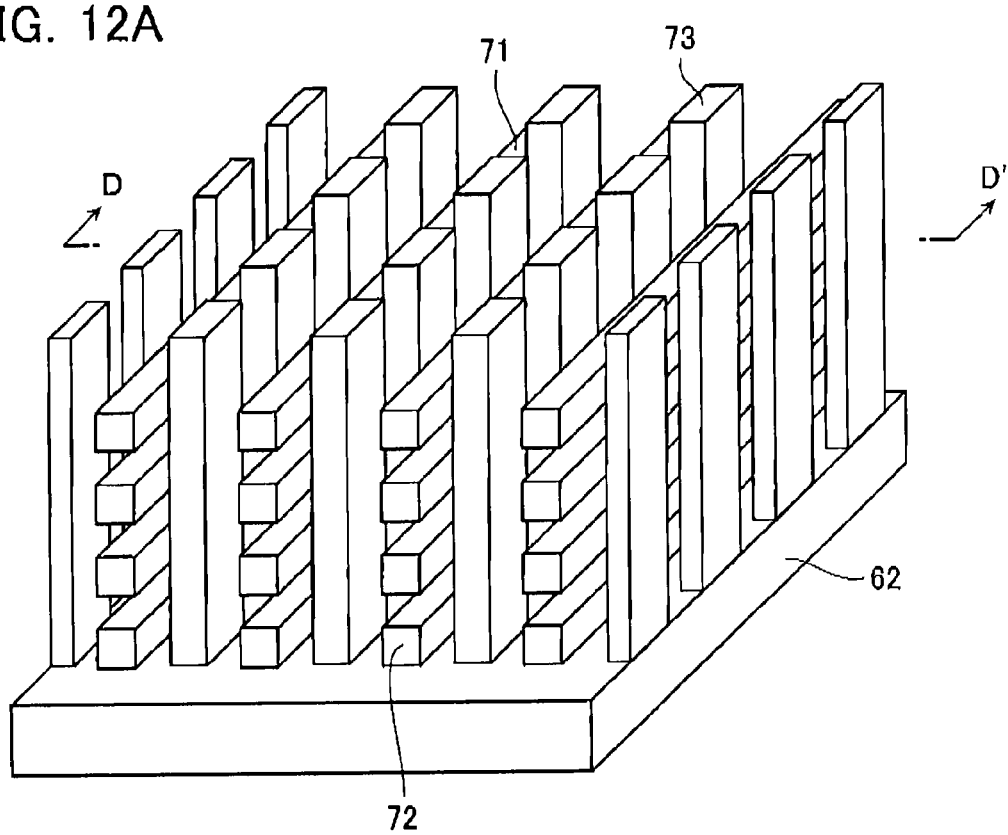
FIG. 12A is a perspective view showing part of a semiconductor memory device according to a fourth embodiment of the present invention.
Figure 12B:
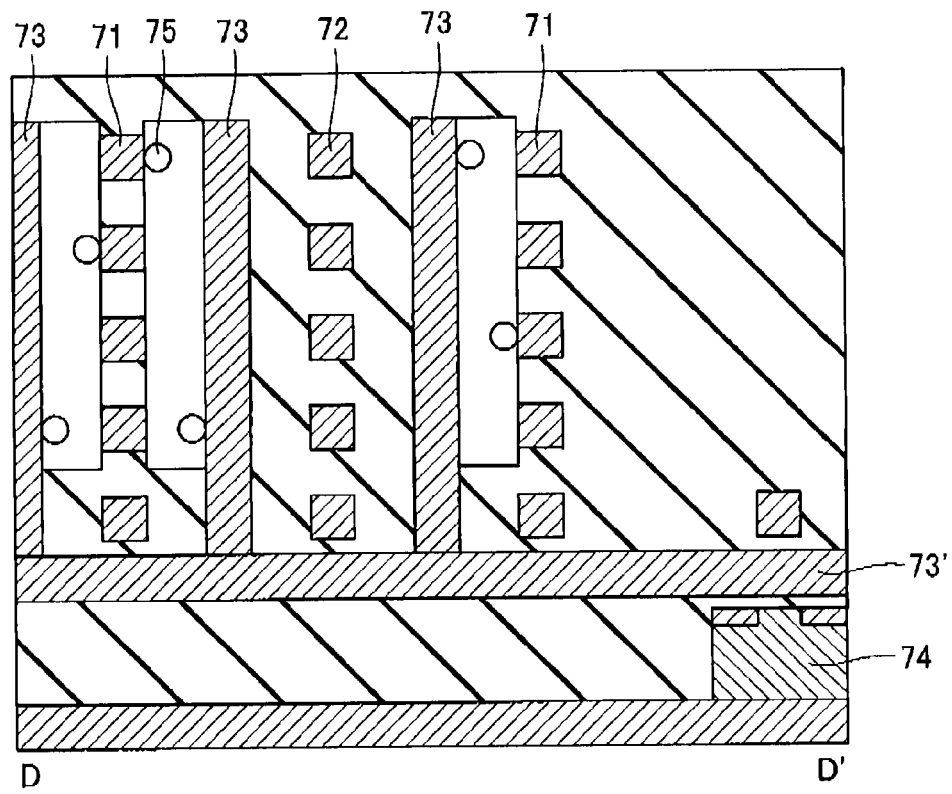
FIG. 12B is a cross-sectional view showing part of the same semiconductor memory device.

FIGS. 12A and 12B are a perspective view and a cross-sectional view showing part of the memory cell portion.

The memory cell portion has the same structure as that in the third embodiment, which includes word lines 71, read word lines 72, bit lines 73, and memory cells containing particulates 75.

In the preceding embodiment, the word lines 71, 72 and bit lines 73 are provided in parallel with the Si substrate. On the contrary, in the present embodiment, the word lines 71, 72 and bit lines 73 are formed in planes normal to the Si substrate. The above structure is different in that the word line 71 and the read word line 72 are shared by two sets of memory cells and two bit lines 73 located on the both sides thereof. Therefore, it is possible to increase the number of memory cells storable per identical area more than the third embodiment.

Figure 12C:
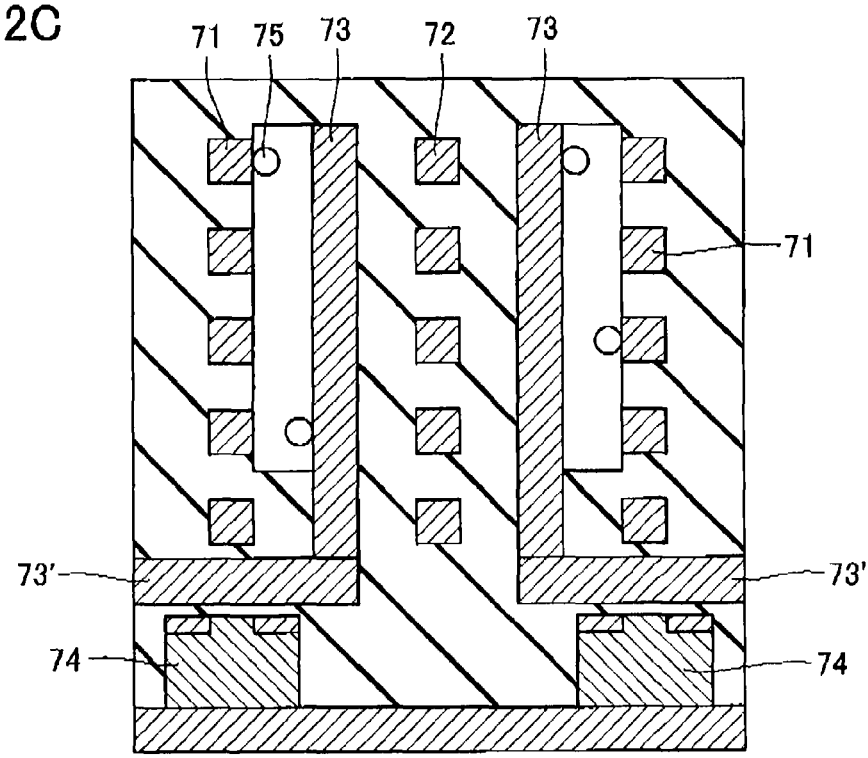
FIG. 12C is a cross-sectional view showing part of another semiconductor memory device according to the same embodiment.

Another example of the memory cell portion of the present embodiment is shown next in FIG. 12C.

This memory cell portion is similar to the case shown in FIGS. 12A-B in that the read word line 72 is shared by two bit lines 73.

Plural bit lines 73, however, are individually connected to bit lines 73' having respective ends with read FETs 74 arranged in the vicinity thereof, different from the third embodiment.

In this case, it is possible to execute parallel data read and accordingly reduce the reading time shorter than the embodiment in FIGS. 12A-B.

Operational Principle of Present Embodiment

The operational principle of the semiconductor memory device according to the present embodiment is described next.

The operational principle of the present embodiment is basically same as the third embodiment other than the following point.

In the case of the embodiment in FIGS. 12A-B, the read word line 72 and the read FET 74 are shared and accordingly a problem arises in reading, different from the case of the third embodiment. Specifically, electrons stored on a certain bit line 73 and electrons stored on another bit line 73 that shares the read word line 72 with the certain bit line 73 are mixed together on the common bit line 73' while they are transferred to the read FET 79.

This point can be resolved by fixing the voltage on the word line 71 corresponding to one bit line 73 to the ground voltage (0 V) and transferring only the electrons stored on the other bit line 73 to the read FET 74.

On the other hand, the word line 71 is shared by memory cells connected to different bit lines 73. Accordingly, it is possible to store electrons on these bit lines 73 at the same time. The electrons once stored can be transferred to the read FET 74 using the read word line 12 corresponding to one bit line 73 and then transferred to the read FET 14 using the read word line 72 corresponding to the other bit line 73, thereby sequentially reading data from the memory cells connected to both the bit lines 73.

The application of this method can make it possible to concurrently execute operations of detecting extremely small currents flowing in memory cells connected to a number of bit lines 73 arrayed two-dimensionally and further improve the efficiency when massive data is sequentially read out.

Method of Production in Present Embodiment

Figure 13A:
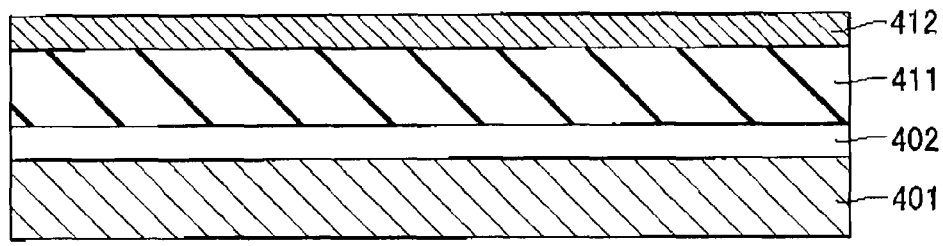
FIG. 13A is a cross-sectional view showing the step of forming the semiconductor memory device according to the fourth embodiment of the present invention in order of process.
Figure 13B:
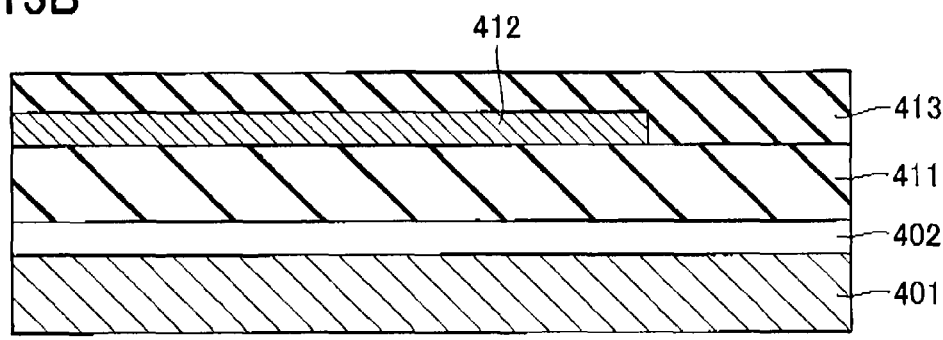
FIG. 13B is a cross-sectional view showing the step of forming the same semiconductor memory device in order of process.
Figure 13C:
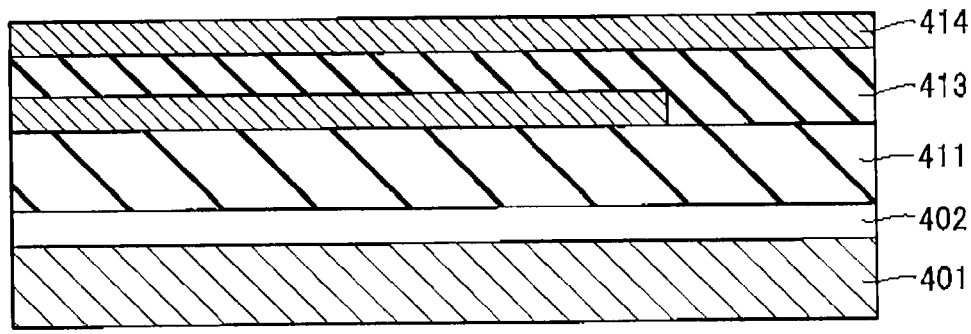
FIG. 13C is a cross-sectional view showing the step of forming the same semiconductor memory device in order of process.
Figure 13D:
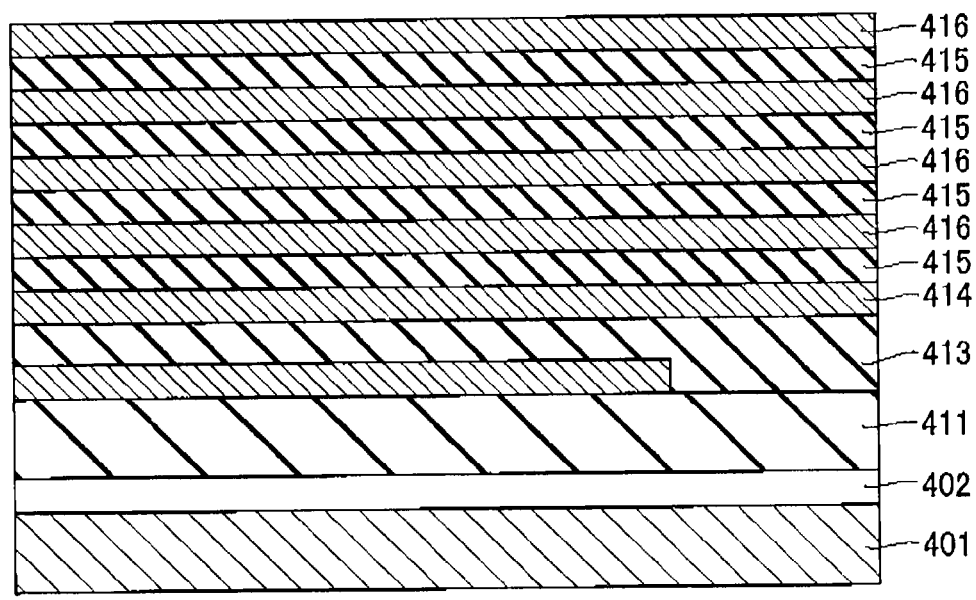
FIG. 13D is a cross-sectional view showing the step of forming the same semiconductor memory device in order of process.
Figure 13E:
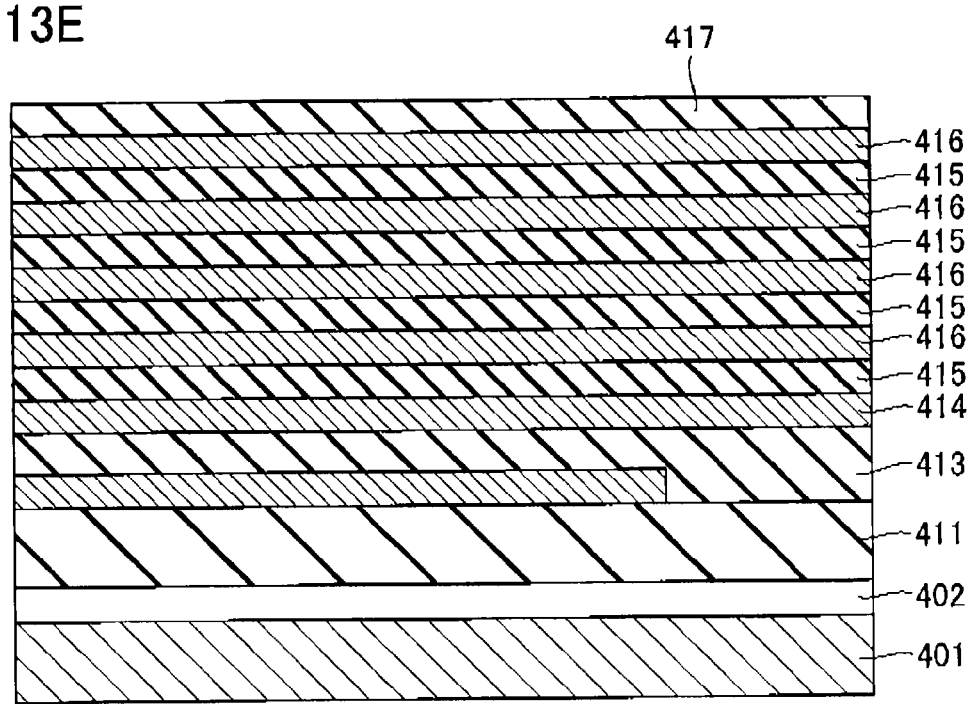
FIG. 13E is a cross-sectional view showing the step of forming the same semiconductor memory device in order of process.
Figure 13F:
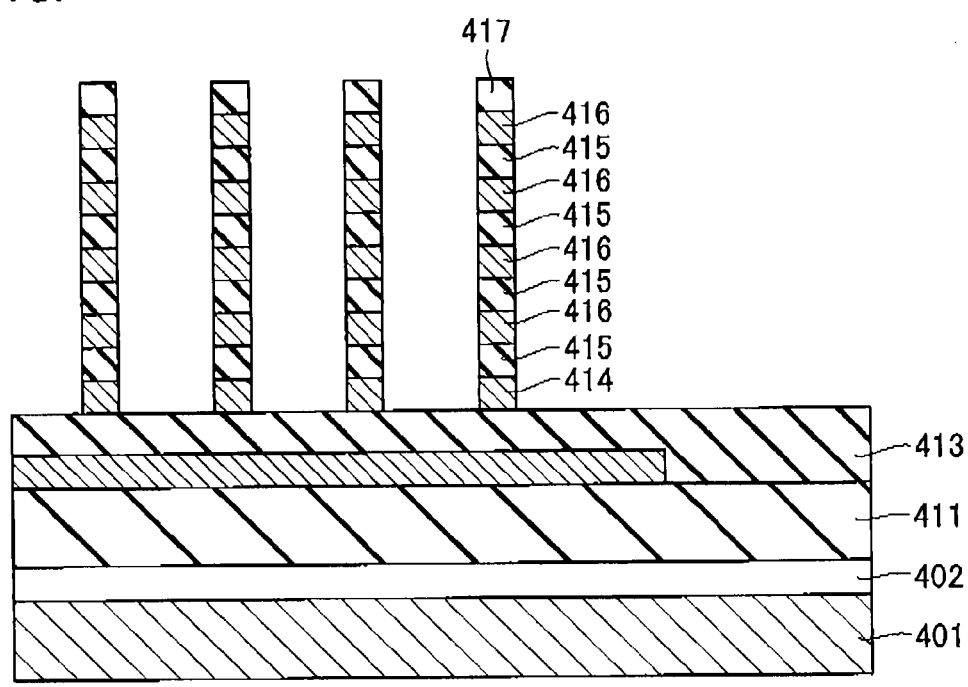
FIG. 13F is a cross-sectional view showing the step of forming the same semiconductor memory device in order of process.
Figure 13G:
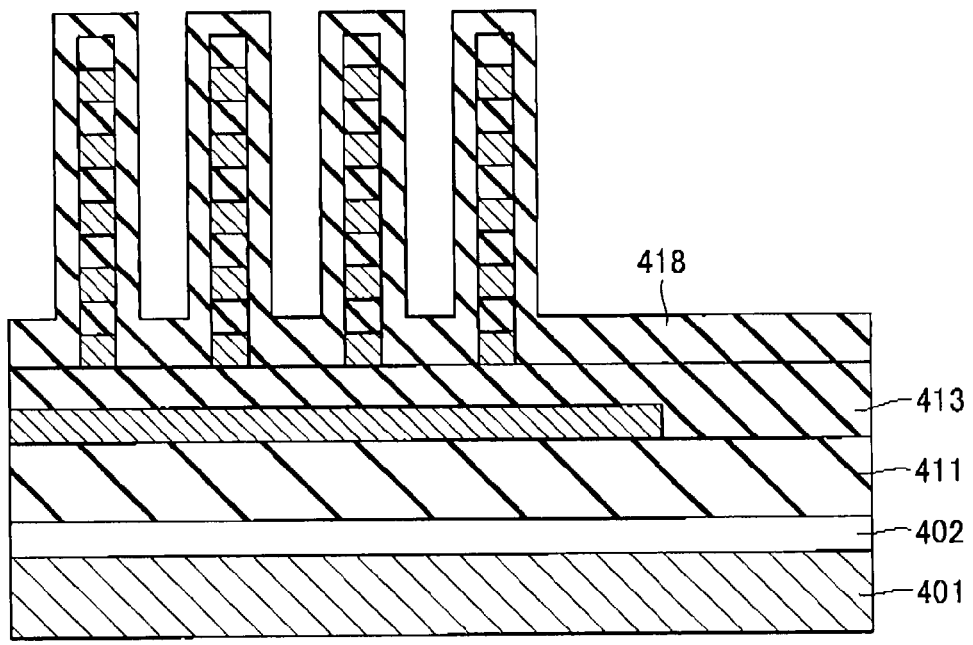
FIG. 13G is a cross-sectional view showing the step of forming the same semiconductor memory device in order of process.
Figure 13H:
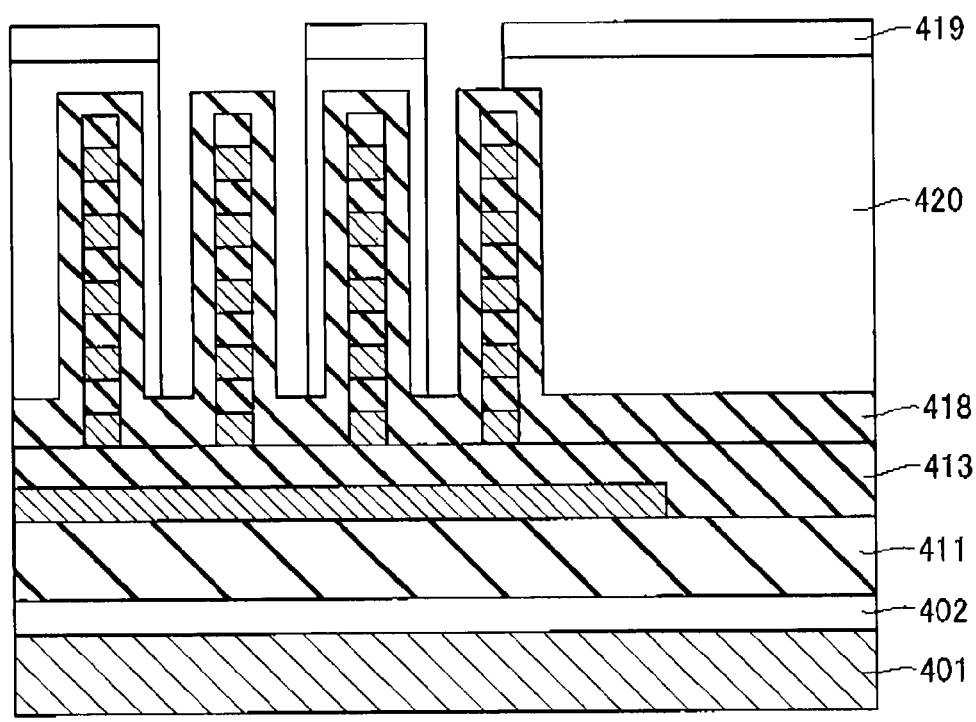
FIG. 13H is a cross-sectional view showing the step of forming the same semiconductor memory device in order of process.
Figure 13I:
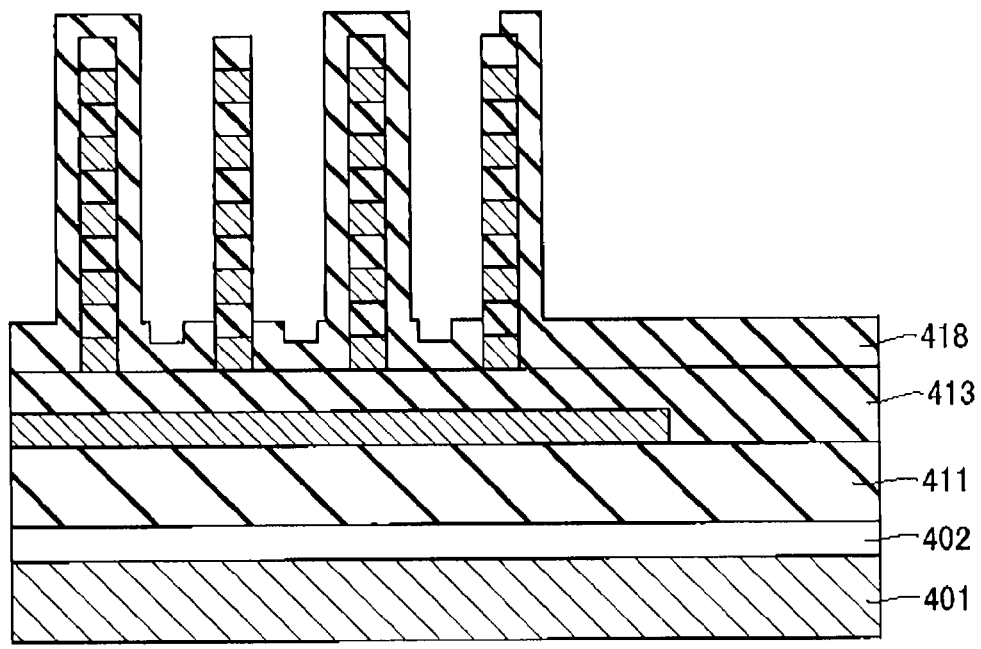
FIG. 13I is a cross-sectional view showing the step of forming the same semiconductor memory device in order of process.
Figure 13J:
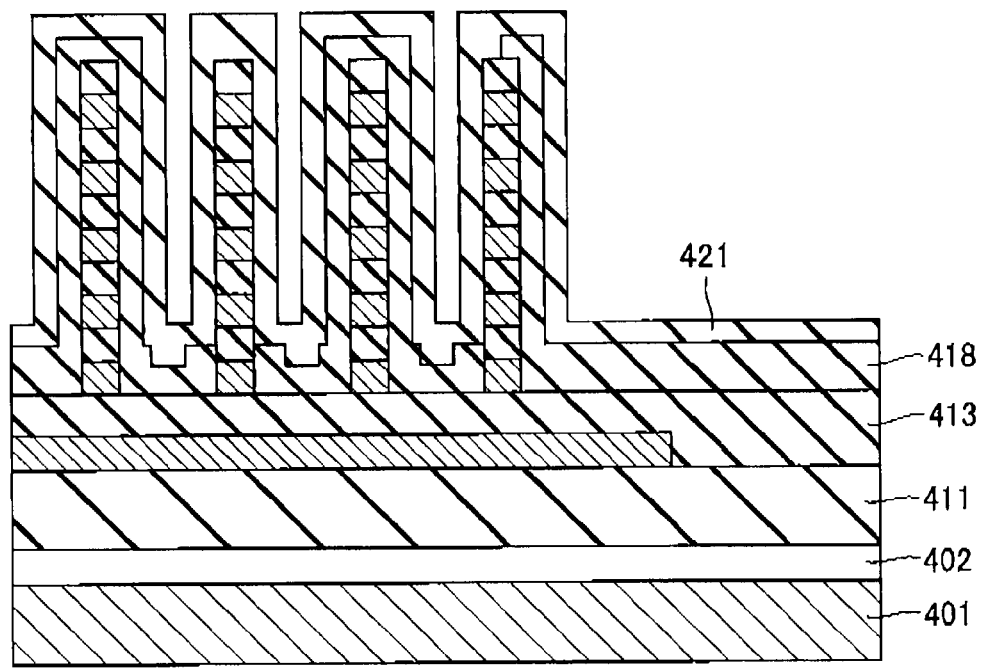
FIG. 13J is a cross-sectional view showing the step of forming the same semiconductor memory device in order of process.
Figure 13K:
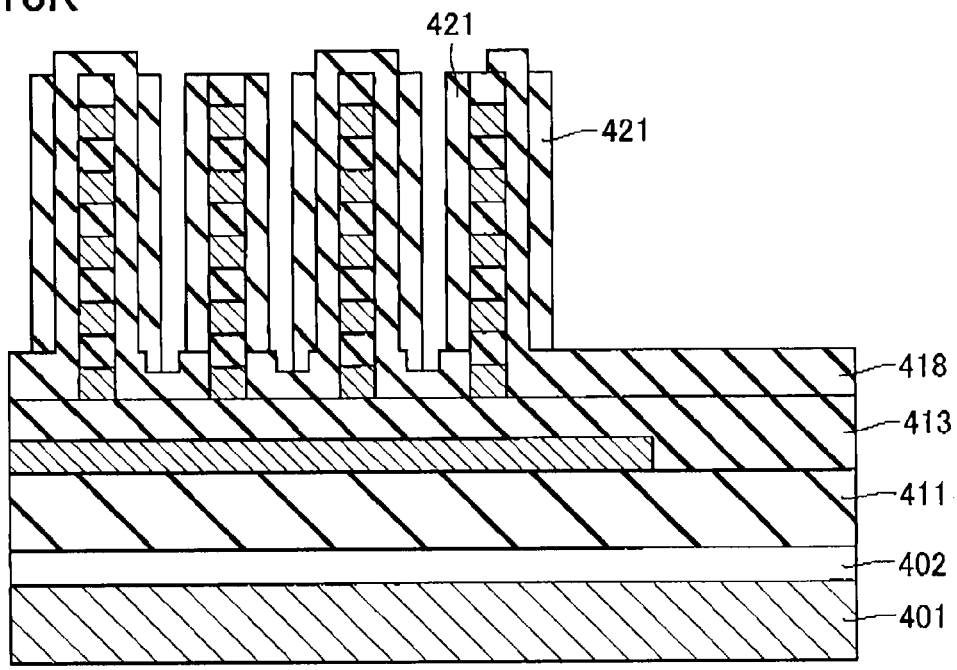
FIG. 13K is a cross-sectional view showing the step of forming the same semiconductor memory device in order of process.
Figure 13L:
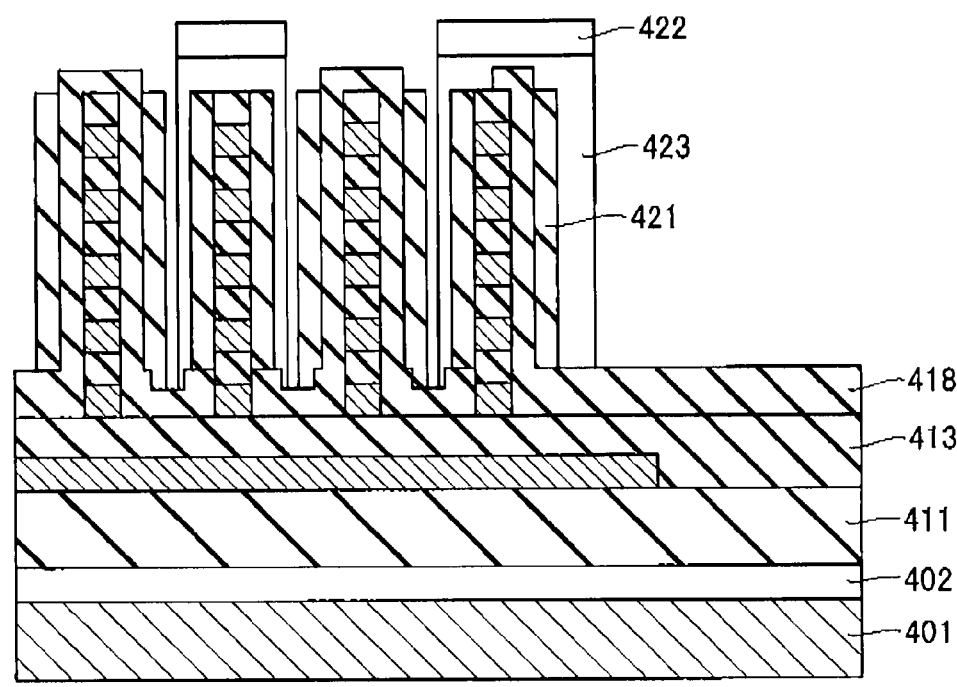
FIG. 13L is a cross-sectional view showing the step of forming the same semiconductor memory device in order of process.
Figure 13M:
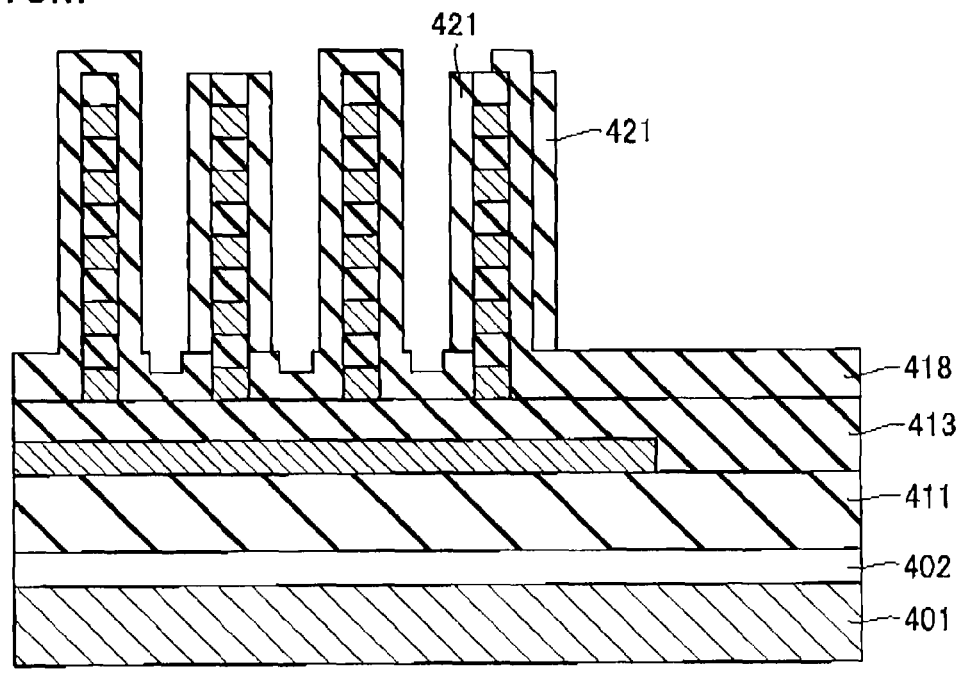
FIG. 13M is a cross-sectional view showing the step of forming the same semiconductor memory device in order of process.
Figure 13N:
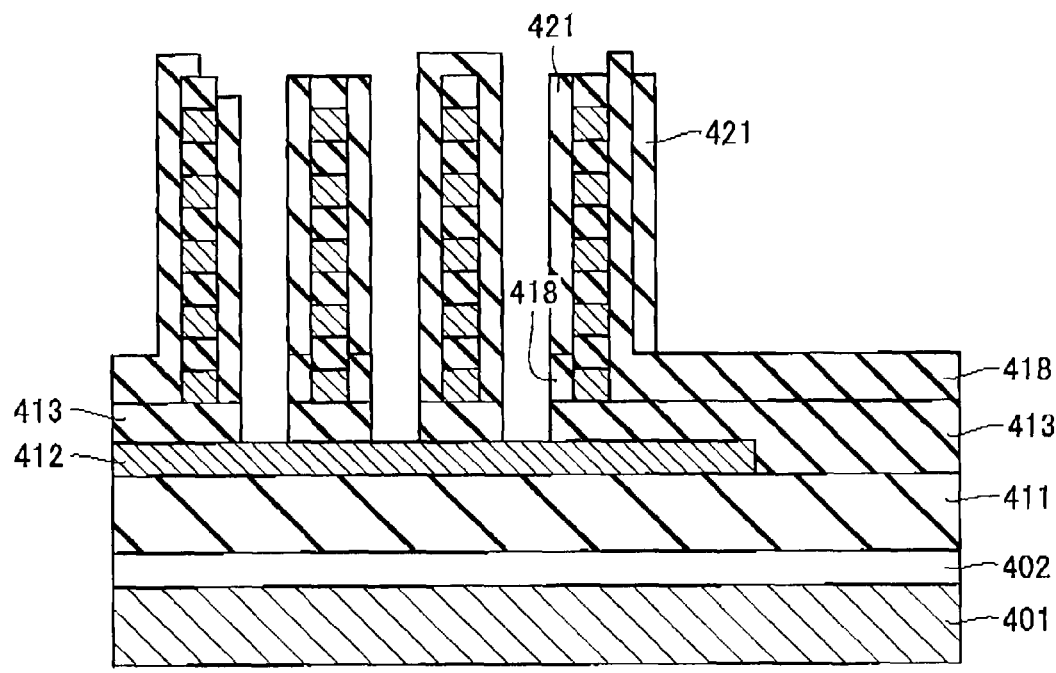
FIG. 13N is a cross-sectional view showing the step of forming the same semiconductor memory device in order of process.
Figure 13O:
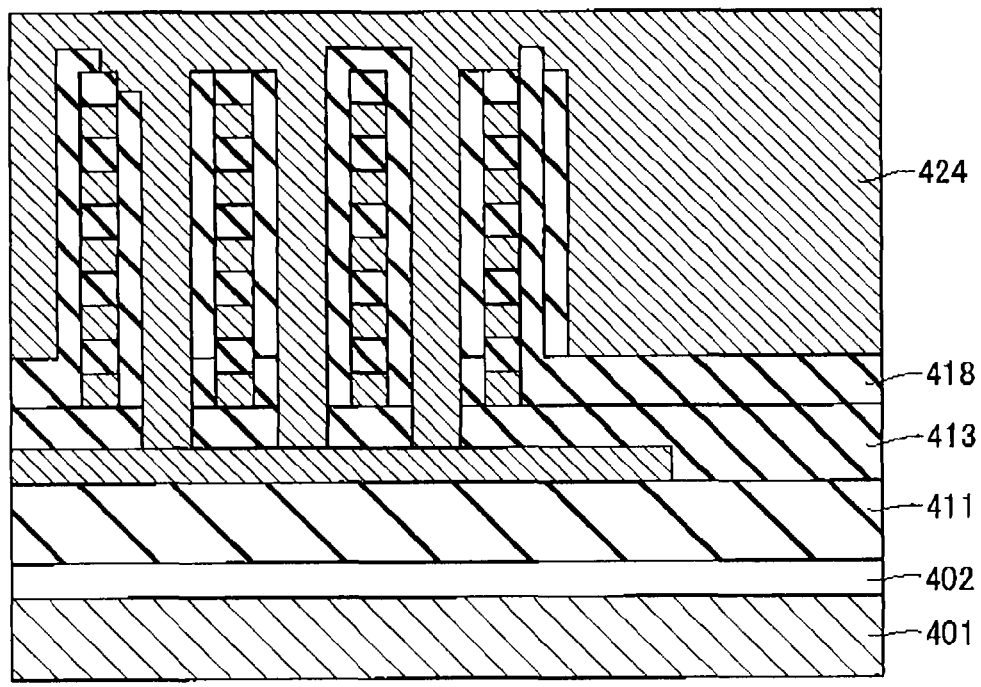
FIG. 13O is a cross-sectional view showing the step of forming the same semiconductor memory device in order of process.
Figure 13P:
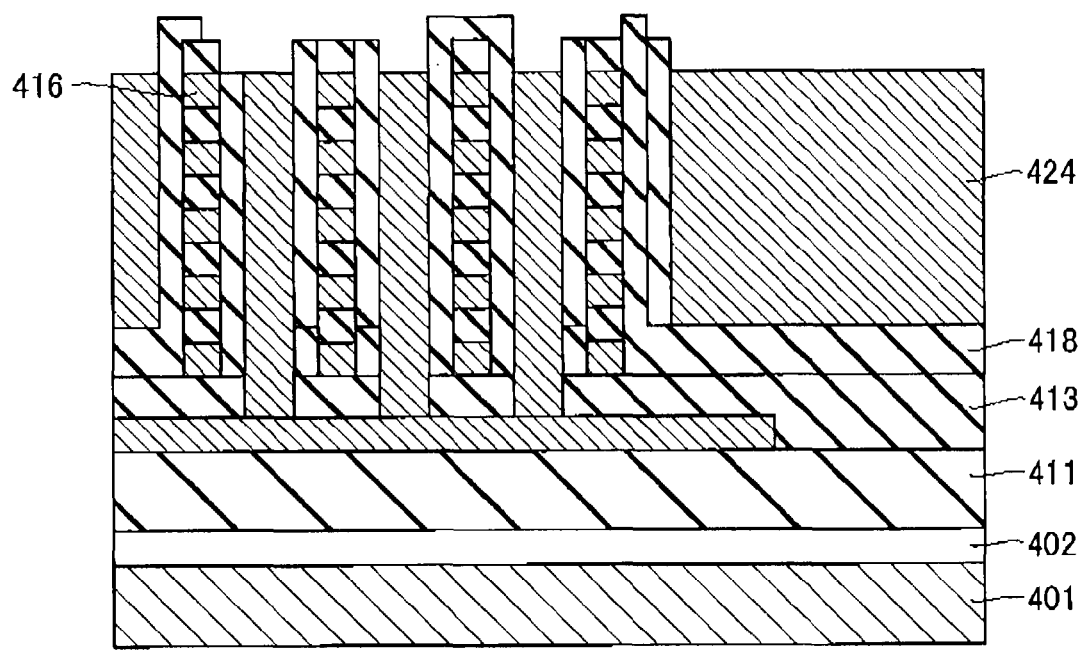
FIG. 13P is a cross-sectional view showing the step of forming the same semiconductor memory device in order of process.
Figure 13Q:
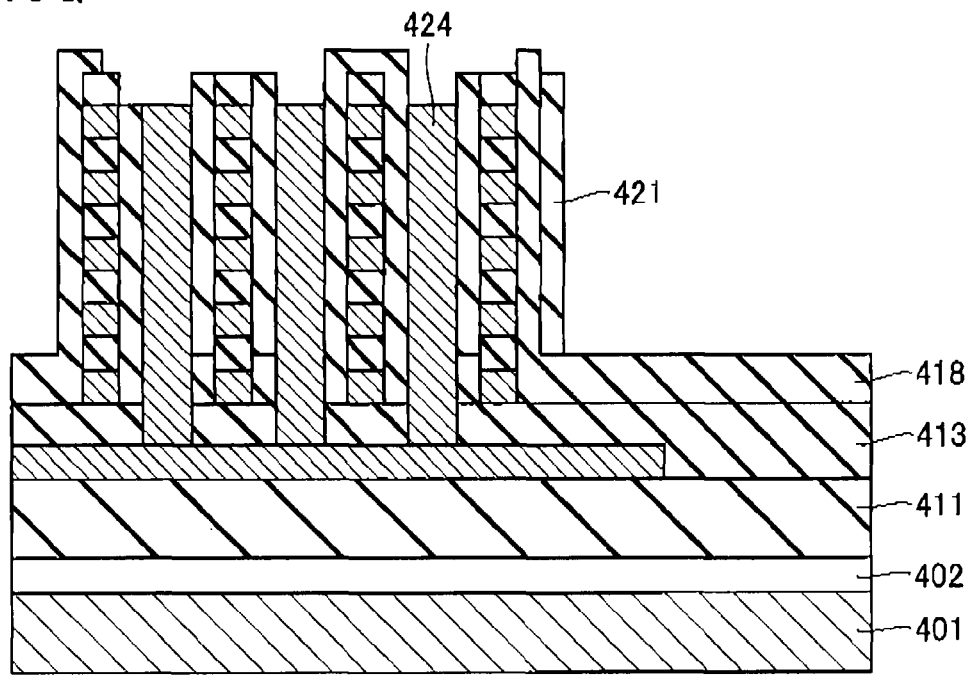
FIG. 13Q is a cross-sectional view showing the step of forming the same semiconductor memory device in order of process.
Figure 13R:
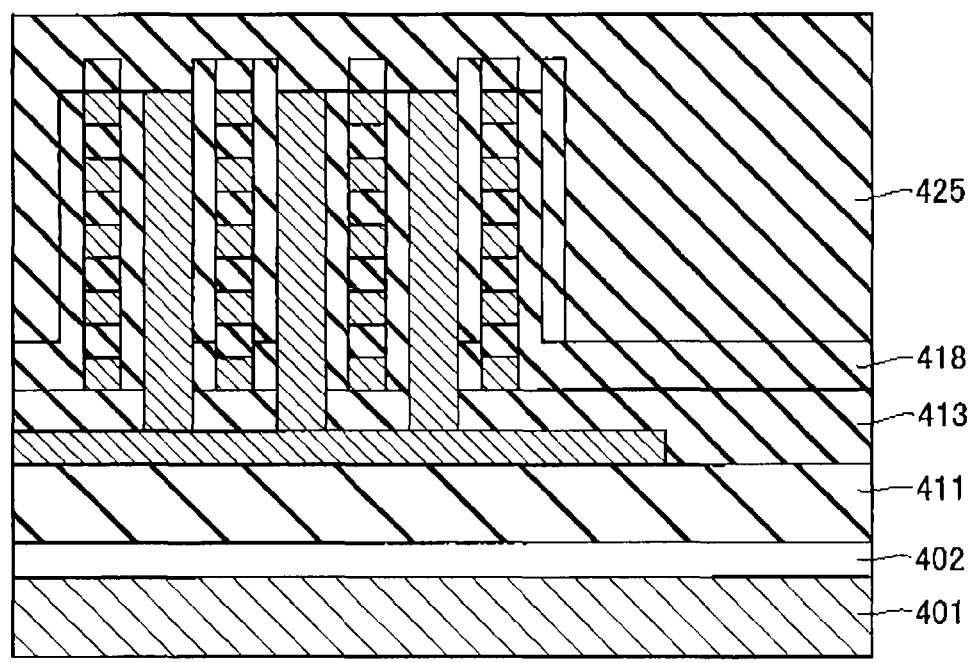
FIG. 13R is a cross-sectional view showing the step of forming the same semiconductor memory device in order of process.
Figure 13S:
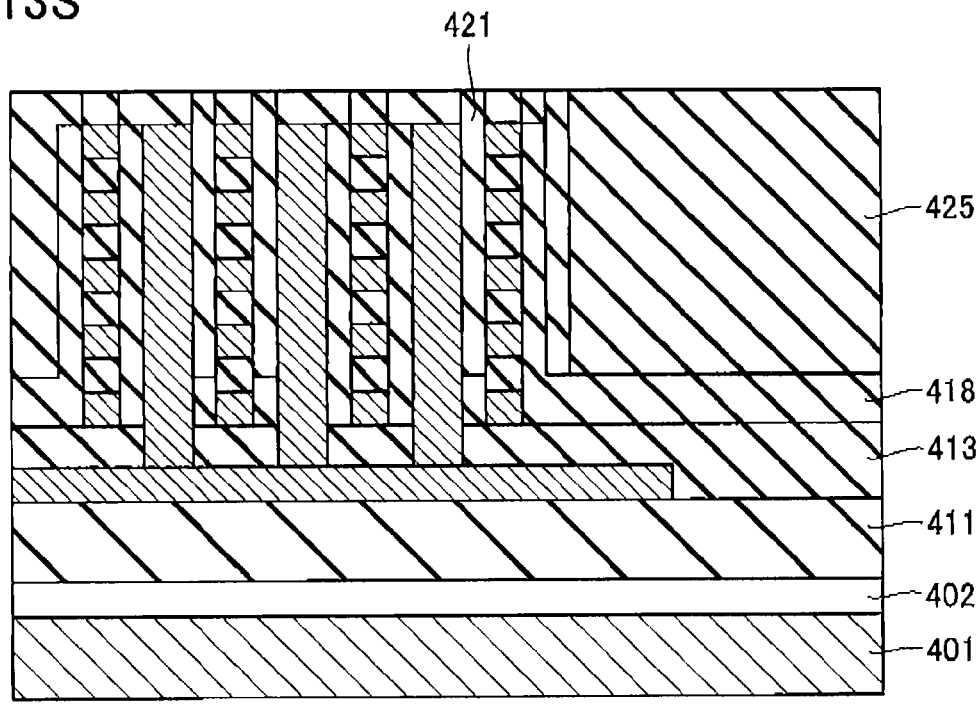
FIG. 13S is a cross-sectional view showing the step of forming the same semiconductor memory device in order of process.
Figure 13T:
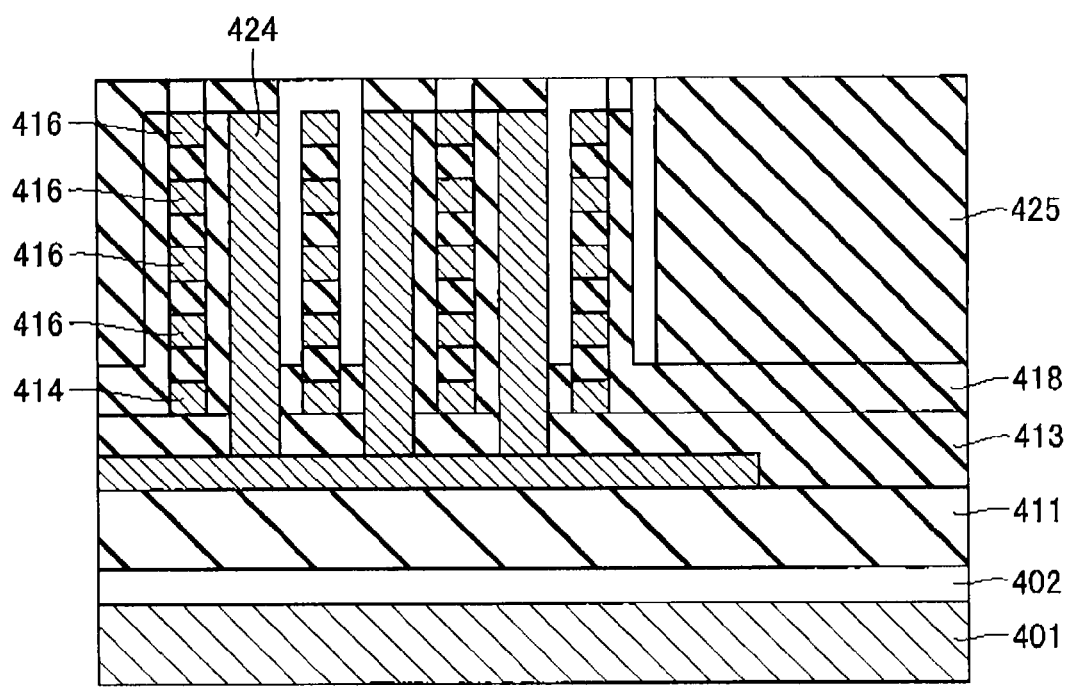
FIG. 13T is a cross-sectional view showing the step of forming the same semiconductor memory device in order of process.
Figure 13U:
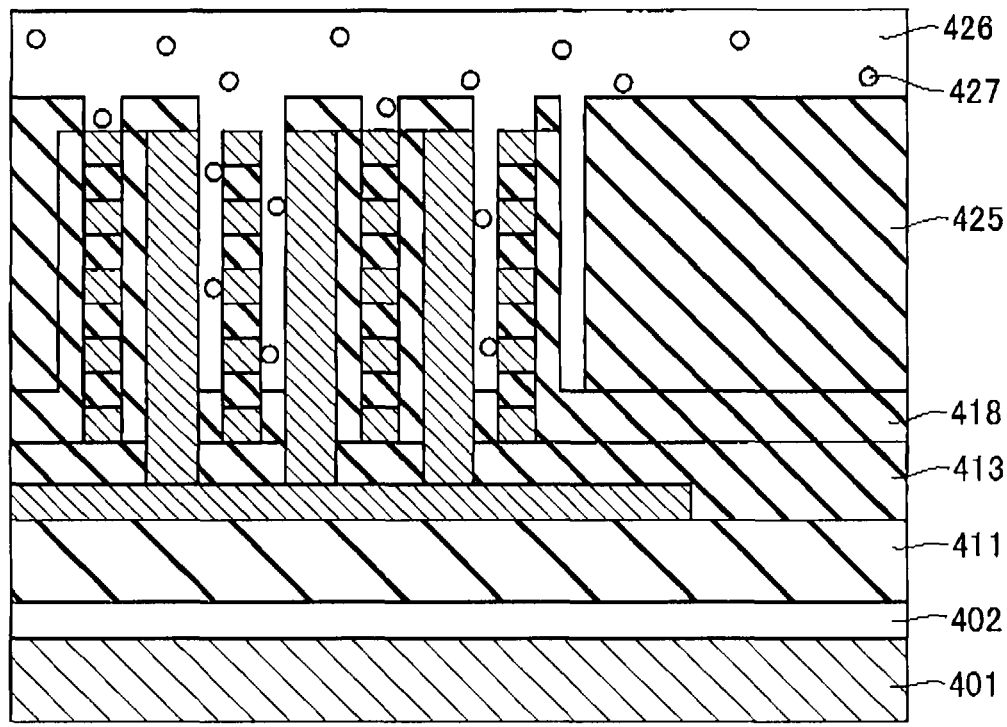
FIG. 13U is a cross-sectional view showing the step of forming the same semiconductor memory device in order of process.
Figure 13V:
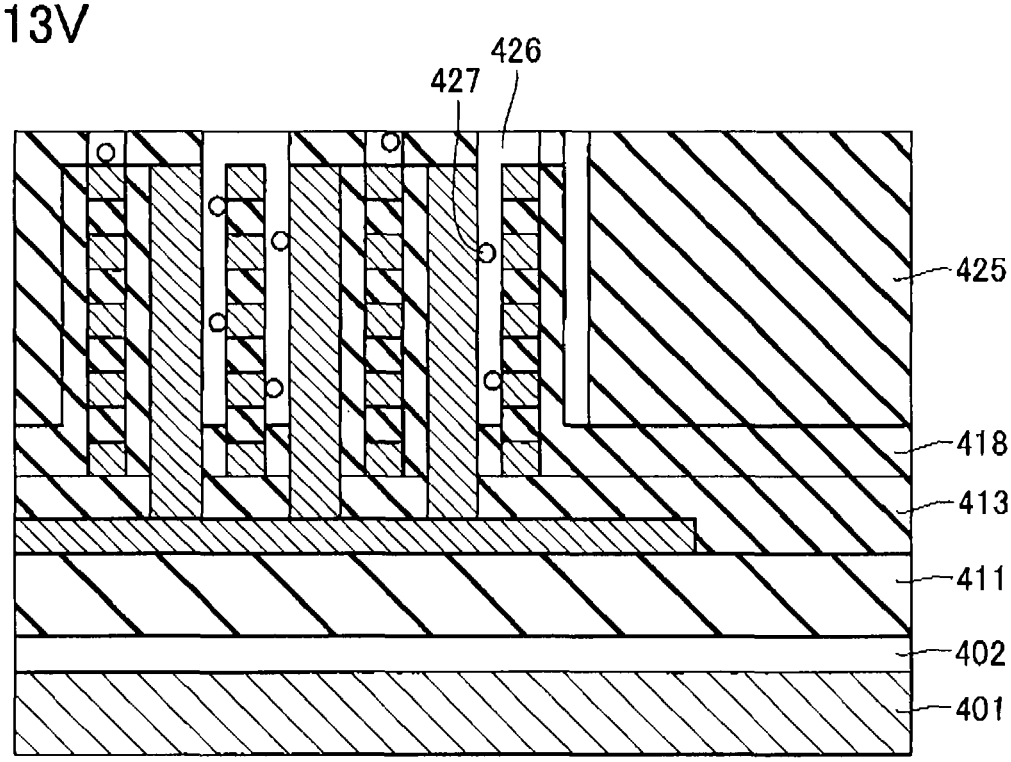
FIG. 13V is a cross-sectional view showing the step of forming the same semiconductor memory device in order of process.
Figure 13W:
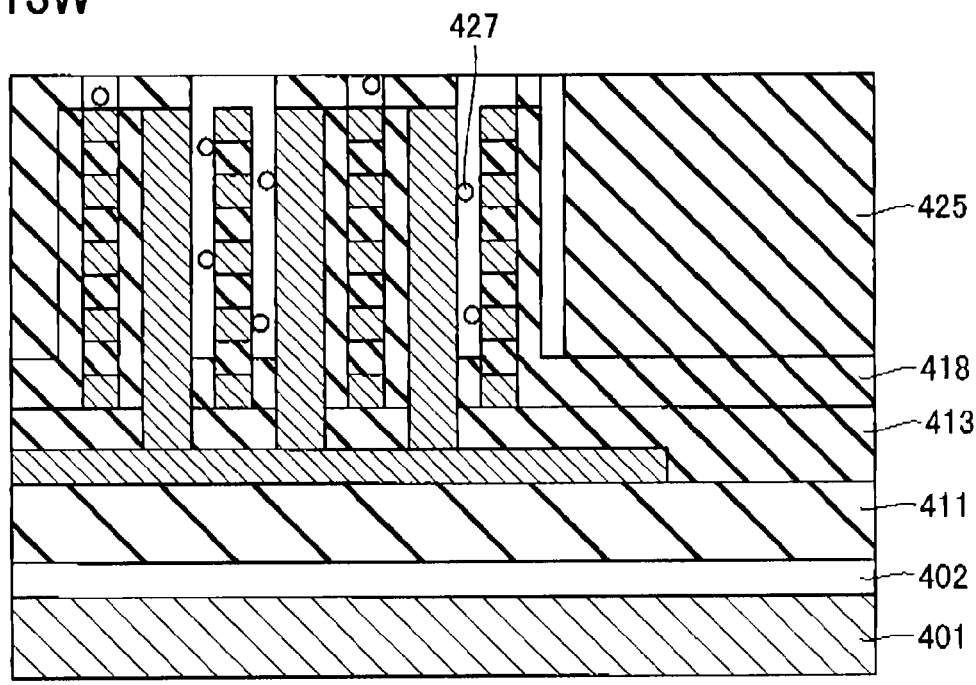
FIG. 13W is a cross-sectional view showing the step of forming the same semiconductor memory device in order of process.
Figure 13X:
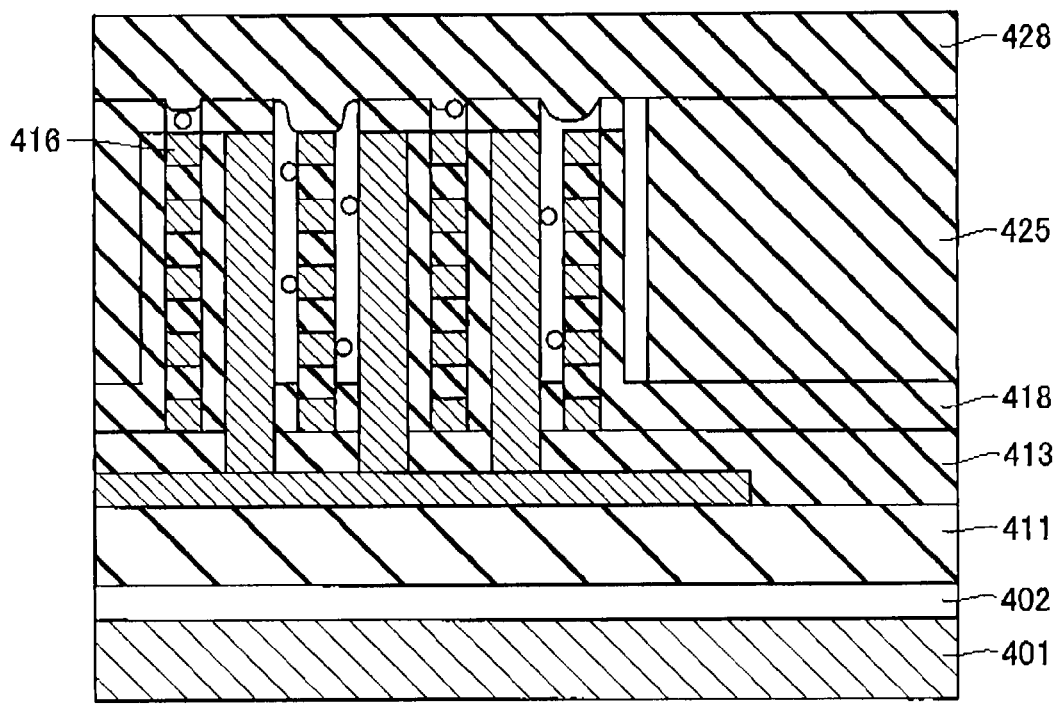
FIG. 13X is a cross-sectional view showing the step of forming the same semiconductor memory device in order of process.

FIGS. 13A-13X are cross-sectional views showing the steps of forming the semiconductor memory device according to the fourth embodiment of the present invention in order of process.

A 720-μm thick Si substrate 401 is provided and, on one side thereof, a desired CMOS circuit 402 is formed as the groundwork using normal CMOS processes. The CMOS circuit 402 includes normal MOSFETs and multilayered lines as well as connection lines to the memory cell array. In the steps for the CMOS circuit 402, the processes for combining NOR-type flash memories are used to form the structure containing the read FET having gates in two layers and part of the read word line and part of the bit line.

First, as shown in FIG. 13A, a CVD method using TEOS as a main material is applied to form on the substrate an insulator film 411 composed of $SiO_2$ with a thickness of 300 nm. Although not shown in figure, the connecting portion between the CMOS circuit 402 and the bit line is processed at this stage. Subsequently, a LPCVD method using silane as a main material with an additive of $B_2H_6$ is applied to form a boron-doped amorphous silicon film 412 with a thickness of 20 nm.

Subsequently, an imprint lithography technology is used to form a resist pattern with a line width of 20 nm at pitches of 40 nm aligned in the direction normal to the page in the cell array portion. Also in undesired pattern portions in other regions than the cell array portion, pattern formation is executed so as not to leave the resist. As shown in FIG. 13B, with a mask of the resultant resist pattern, a reactive ion etching using HBr and $O_2$ gases is applied to pattern the amorphous silicon film 412. Subsequently, a CVD method using TEOS as a main material is applied to form an insulator film 913 composed of $SiO_2$ with a thickness of 30 nm. The surface of the insulator film 413 is touch-up polished using a CMP method to planarize the surface.

Subsequently, as shown in FIG. 13C, a LPCVD method using silane as a main material with an additive of $PH_3$ is applied to form a phosphorous-doped amorphous silicon film 414 with a thickness of 20 nm. Then, as shown in FIG. 13D, formation of an insulator film 415 composed of $SiO_2$ with a thickness of 20 nm through a CVD method using TEOS as a main material and formation of a phosphorous-doped amorphous silicon film 416 with a thickness of 20 nm through a LPCVD method using silane as a main material with an additive of $PH_3$ are executed alternately in a desired number of layers.

Subsequently, as shown in FIG. 13E, a LPCVD method using dichlorosilane and ammonia as main materials is applied to form a $Si_3N_4$ film 417 with a thickness of 50 nm. Then, an imprint lithography technology is used to form a resist pattern with a line width of 20 nm at pitches of 95 nm.

Subsequently, as shown in FIG. 13F, with a mask of the resultant resist pattern, a reactive ion etching using $CHF_3$, $CF_4$ and $O_2$ gases is applied to pattern the $Si_3N_4$ film 917, and then the resist is peeled off. Thereafter, a reactive ion etching using HBr and $O_2$ gases is applied to pattern the amorphous silicon films 419, 416, and a reactive ion etching using $CHF_3$ and CO gases is applied to pattern the $SiO_2$ film 415 in turn. Then, as shown in FIG. 13G, a CVD method using TEOS as a main material is applied to form an insulator film 418 composed of $SiO_2$ with a thickness of 15 nm.

Subsequently, as shown in FIG. 13H, a lithography step using 2-layered resists (an upper layer resist 419 and a lower layer resist 420) is applied to form a resist pattern with exposed portions for storage element formation. This lithography step can achieve the purpose if the portions not used in storage element formation are covered with the resist. Accordingly, dimensional accuracy and positional accuracy may be both relatively loose. Then, as shown in FIG. 13I, a HF vapor process is applied to remove the $SiO_2$ film 918 not covered with the resist. After etching, the resist is peeled off.

Subsequently, as shown in FIG. 13J, a LPCVD method using dichlorosilane and ammonia as main materials is applied to form a $Si_3N_4$ film 421 with a thickness of 40 nm. Then, as shown in FIG. 13K, a reactive ion etching using $CHF_3$, $CF_4$ and $O_2$ gases is applied to etch back the entire surface of the $Si_3N_4$ film 421. The reactive ion etching is an etching excellent in directionality and accordingly proceeds in the direction normal to the top surface but hardly proceeds toward the side wall. Accordingly, as shown in FIG. 13K, the $Si_3N_4$ film 421 is shaped to reside only on the side wall.

Subsequently, as shown in FIG. 13L, a lithography step using 2-layered resists (an upper layer resist 422 and a lower layer resist 423) is applied to form a resist pattern with exposed portions for storage element formation. This lithography step can achieve the purpose if the portions not used in storage element formation are covered with the resist. Accordingly, dimensional accuracy and positional accuracy may be both relatively loose. Then, as shown in FIG. 13M, an etching process using a phosphoric acid is applied to etch off the portion of the $Si_3N_4$ film 421 not covered with the resist from 423. After etching, the resist is peeled off.

Subsequently, a normal photolithography technology is used to form a resist pattern having apertures in the cell array portion. Then, as shown in FIG. 13N, with a mask of the resultant resist pattern, a reactive ion etching using $CHF_3$ and CO gases is applied to etch the $SiO_2$ film 418 left on the aperture bottom and the $SiO_2$ film 413 to form apertures down to the amorphous silicon film 412. Under this etching condition, the $Si_3N_4$ film has a smaller etching rate and can not be etched greatly.

Subsequently, as shown in FIG. 13O, a LPCVD method using silane as a main material with an additive of $B_2H_6$ is applied to form a boron-doped amorphous silicon film 424. The amorphous silicon has an excellent property of burial in trenches. Accordingly, it can be completely buried in the trenches such that the upper surface is formed in a flat film shape. Subsequently, as shown in FIG. 13P, a reactive ion etching using HBr and $O_2$ gases is applied to etch back the entire surface of the amorphous silicon film 424 and, through terminal detection and etching time adjustment, remove the amorphous silicon film 424 to almost the same height as the uppermost portion of the amorphous silicon film 416.

Subsequently, an imprint lithography technology is used to form a resist pattern with a line width of 20 nm at pitches of 40 nm aligned in the direction normal to the page in the cell array portion. Also in undesired pattern portions in other regions than the cell array portion, pattern formation is executed so as not to leave the resist. Subsequently, as shown in FIG. 13Q, with a mask of the resultant resist pattern, a reactive ion etching using HBr and $O_2$ gases is applied to pattern the amorphous silicon film 424 and remove undesired portions from the amorphous silicon film 424 outside the cell array portion at the same time.

Subsequently, as shown in FIG. 13R, a spin-coatable silicon oxide (SOG) film 425 is formed using a low-viscosity raw material and then calcined. The low-viscosity material can be used as buried in a high-aspect ratio pattern to the bottom. Subsequently, as shown in FIG. 13S, a CMP method is used to remove extra parts from the upper surface of the silicon oxide (SOG) 425 and expose the upper surface of the $Si_3N_4$ film 421.

Subsequently, as shown in FIG. 13T, an etching process using a phosphoric acid is applied to etch off the $Si_3N_4$ films 417, 421. Then, heating is executed within oxygen ambient for crystallizing the amorphous silicon films 412, 414, 416, 424 to polysilicon, activating impurity boron and phosphorous, and inactivating the matters adhered on the polysilicon surface. Then, as shown in FIG. 13U, a spin coating method is used to form a resin that contains silica particulates 427 having a diameter of about 10 nm and buried in a polyethylene oxide 426, thereby filling the cell array portion therewith.

Subsequently, as shown in FIG. 13V, a CMP method is used to remove the polyethylene oxide 426 and the silica particulates 427 outside the cell array portion. Then, as shown in FIG. 13W, a process of heating at 180° C. is applied to thermally decompose the residual polyethylene oxide 426, vaporize/evaporate the decomposed product, and discharge it through the apertures at the upper end, thereby allowing the particulates 427 movable.

Subsequently, as shown in FIG. 13X, by forming a spin coatable silicon oxide (SOG) film using a high-viscosity medium and utilizing the meniscus caused by the surface tension, a $SiO_2$ film 428 is formed over the silicon oxide (SOG) film 425, leaving the lower space than the uppermost potion of the side wall of the polysilicon 416 composed of crystallized amorphous silicon serving as the memory cell portion, as a cavity.

Although not shown in figure, the connecting portions between the films 414 and 416, now poly-crystallized to lines, and the CMOS circuit 402 are processed to form contact-holes therethrough to form lines connecting between desired contact-holes. After line formation, an interlayer insulator is formed again. At last, the films 412, 424 serve as the bit lines and the films 414, 416 as the word lines (read word lines).

Finally, the so-called passivation film is formed, followed by forming the I/O portions or the line connecting portions, and then executing the so-called post process such as checking and dicing to complete the semiconductor memory device.

In the embodiment, an insulator composed of silicon oxide, that is, colloidal silica is used as the particle for use in memory operation though other inorganic oxides such as aluminum oxide and titanium oxide are also available, and organic matters such as polystyrene are also available. Theoretically, the particle is not required to be an insulator. Accordingly, it may be, for example, a metal particle of a conductor such as chrome, nickel, copper, gold, silver, titanium and aluminum; a particle composed of an alloy thereof; a carbon particle, typically fullerene; and a particle of a semiconductor such as silicon. The shape of the particle is not required to be spherical but may be polyhedral, elliptical and cylindrical.

The word lines and read word lines are not always required to be arranged orthogonal to the bit lines but may be related to each other in an intersecting arrangement. Further, the conditions such as the gap length between the first and second electrodes and the size of the particle may be changed appropriately in accordance with specs.

OTHERS

Various modifications can be implemented additionally without departing from the scope and spirit of the present invention.

The invention claimed is:

1. A semiconductor memory device, comprising:
   a plurality of first row lines arranged in parallel;
   a plurality of column lines intersecting said first row lines;
   a plurality of storage elements arranged at intersections of said first row lines and said column lines;
   a plurality of second row lines arranged in parallel with said first row lines, from positions opposite to said first row lines via said column lines to a certain portion of said column line, and capacitively coupled with said column lines; and
   a sense amplifier including a field effect transistor having a lower layer control electrode composed of said certain portion of said column line, and an upper layer control electrode composed of said second row line capacitively coupled in the upper layer with said certain portion of said column line.

2. The semiconductor memory device according to claim 1, further comprising:
   a first row selection means operative to select a first row line from among said first row lines;
   a second row selection means operative to select a second row line from among said second row lines;
   a column selection means operative to select a column line from among said column lines; and
   a read control means operative to apply a certain read voltage between the first row line selected by said first row selection means and the second row line selected by said second row selection means to form local charge storage portions on said column line corresponding to the capacitive coupling positions with said second row lines while floating said column lines, and operative to detect the charge in said charge storage portions at said sense amplifier to read out data along said column line sequentially.

3. The semiconductor memory device according to claim 2, wherein said read control means applies a transfer voltage sequentially to said second row lines to transfer the charge stored in said charge storage portions on said column line along said column line to said sense amplifier.

4. The semiconductor memory device according to claim 2, wherein said read control means forms charge storage portions at intervals of two capacitive coupling portions between said column line and said second row lines and transfers the charge.

5. The semiconductor memory device according to claim 2, further comprising a data write means operative to apply a certain write voltage to a first row line selected by said first row selection means and a column line selected by said column selection means to change the storage state of said storage element.

6. The semiconductor memory device according to claim 2, wherein said first and second row selection means select said first and second row lines at the same time and form a plurality of said charge storage portions on said column line.

7. The semiconductor memory device according to claim 1, wherein said storage element includes a variable resistive element.

8. The semiconductor memory device according to claim 1, wherein said field effect transistor in said sense amplifier, seen from the direction normal to said first and second row lines and said column lines, has
   a source region and a drain region shaped in respective rectangles surrounded by two adjacent ones of said column lines and two adjacent ones of said second row lines, and spaced from each other by one of said column lines and one of said second row lines, and
   a channel region shaped in a parallelogram having opposite sides including a side in the second row line direction in said source region and a side in the second row line direction in said drain region.

9. The semiconductor memory device according to claim 1, wherein said field effect transistor in said sense amplifier, seen from the direction normal to said first and second row lines and said column lines, has
   a source region and a drain region shaped in respective rectangles surrounded by two adjacent ones of said column lines and two adjacent ones of said second row lines, and spaced from each other by one of said column lines and one of said second row lines, and a channel region shaped in a parallelogram having opposite sides including a side in the column line direction in said source region and a side in the column line direction in said drain region.

10. The semiconductor memory device according to claim 1, wherein said column lines are formed normal to the upper surface of a semiconductor substrate serving as a base of the semiconductor memory device, said first row line is shared by said column lines sandwiching said first row line therebetween, said second row line is shared by said column lines sandwiching said second row line therebetween.

11. The semiconductor memory device according to claim 10, wherein said column lines sharing a certain one of said second row lines have respective ends connected together to share said sense amplifier.

12. The semiconductor memory device according to claim 11, wherein during the period of transferring charge to said sense amplifier circuit via one column line of said two column lines sharing said second row line, said first word lines corresponding to the other column line are fixed to the ground voltage.

13. The semiconductor memory device according to claim 10, wherein said sense amplifier is provided at each of said column lines.

14. The semiconductor memory device according to claim 1, wherein said intersection of said first row line and said column line is a gap, said storage element is arranged in said gap to store data in accordance with the number of particulates mediating charge migration between said first row line and said column line.

* * * * *